United States Patent
Naohara et al.

(10) Patent No.: US 12,322,600 B2
(45) Date of Patent: Jun. 3, 2025

(54) SUBSTRATE TREATMENT APPARATUS, SUBSTRATE TREATMENT METHOD, SUBSTRATE TREATMENT SYSTEM, AND LEARNING DATA GENERATION METHOD

(71) Applicant: SCREEN Holdings Co., Ltd., Kyoto (JP)

(72) Inventors: Hideji Naohara, Kyoto (JP); Takashi Ota, Kyoto (JP); Takashi Ikeuchi, Kyoto (JP); Yasunori Nakamura, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 860 days.

(21) Appl. No.: 17/133,674

(22) Filed: Dec. 24, 2020

(65) Prior Publication Data

US 2021/0202258 A1 Jul. 1, 2021

(30) Foreign Application Priority Data

Dec. 27, 2019 (JP) .................................. 2019-238989
Nov. 24, 2020 (JP) .................................. 2020-194253

(51) Int. Cl.
| | |
|---|---|
| H01L 21/306 | (2006.01) |
| G05B 13/04 | (2006.01) |
| G05B 23/02 | (2006.01) |
| H01L 21/3213 | (2006.01) |

(52) U.S. Cl.
CPC ........ *H01L 21/30604* (2013.01); *G05B 13/04* (2013.01); *G05B 23/0243* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 10,589,305 | B2 | 3/2020 | Takahashi |
| 10,705,514 | B2 | 7/2020 | Banna |
| 10,955,832 | B2 | 3/2021 | Banna |
| 11,237,544 | B2 | 2/2022 | Moki et al. |

(Continued)

FOREIGN PATENT DOCUMENTS

| | | |
|---|---|---|
| JP | 2006151779 | 6/2006 |
| JP | 2016122681 | 7/2016 |

(Continued)

*Primary Examiner* — Jennifer L Norton
(74) *Attorney, Agent, or Firm* — JCIPRNET

(57) ABSTRACT

A substrate treatment apparatus includes a nozzle, a moving mechanism, a storage portion, and a control portion. The learned model is generated by learning, as learning data, learning target speed information indicating a moving speed of the nozzle and the amount of treatment acquired by executing a treatment on a substrate that is a learning target while causing the nozzle to move at a speed based on the learning target speed information. The control portion causes speed information at the time of treatment to be outputted from the learned model by inputting a target amount of an amount of treatment to the learned model. The control portion controls a moving mechanism such that the nozzle moves at a speed based on the speed information at the time of treatment when the treatment is executed on a substrate that is a treatment target.

22 Claims, 30 Drawing Sheets

(56) References Cited

U.S. PATENT DOCUMENTS

| | | | |
|---|---|---|---|
| 11,289,313 B2 | 3/2022 | Umeda et al. | |
| 11,393,084 B2 | 7/2022 | Ishikawa et al. | |
| 11,619,926 B2 | 4/2023 | Moki et al. | |
| 11,657,059 B2 | 5/2023 | Okuyama et al. | |
| 11,907,235 B2 | 2/2024 | Okuyama et al. | |
| 2003/0185560 A1* | 10/2003 | Sanada | G03D 5/00 396/611 |
| 2005/0087298 A1* | 4/2005 | Tanaka | G05B 13/048 156/345.24 |
| 2012/0247505 A1 | 10/2012 | Brown et al. | |
| 2013/0204416 A1* | 8/2013 | Takahashi | H01L 21/67115 700/95 |
| 2014/0240486 A1 | 8/2014 | Okada et al. | |
| 2016/0089688 A1* | 3/2016 | Uemae | B05D 1/02 118/712 |
| 2016/0155647 A1 | 6/2016 | Brown et al. | |
| 2017/0372232 A1* | 12/2017 | Maughan | G06F 3/0482 |
| 2018/0306442 A1* | 10/2018 | Vitt | G06N 20/00 |
| 2019/0181025 A1 | 6/2019 | Ota et al. | |
| 2019/0240799 A1 | 8/2019 | Takeda et al. | |
| 2019/0315066 A1* | 10/2019 | Maeda | B29C 64/393 |
| 2020/0006100 A1 | 1/2020 | Clark et al. | |
| 2020/0043764 A1 | 2/2020 | Clark et al. | |
| 2020/0166909 A1* | 5/2020 | Noone | G06N 20/00 |
| 2020/0411346 A1 | 12/2020 | Oh et al. | |
| 2021/0004723 A1* | 1/2021 | Kanno | G06N 20/00 |
| 2021/0042570 A1* | 2/2021 | Iskandar | G06F 11/3495 |
| 2021/0125104 A1* | 4/2021 | Christiansen | G06N 20/10 |
| 2021/0157237 A1 | 5/2021 | Hayashi et al. | |
| 2021/0166120 A1* | 6/2021 | Tsutsui | H01L 21/67253 |
| 2021/0240741 A1* | 8/2021 | Naohara | G06F 16/285 |
| 2021/0312610 A1* | 10/2021 | Tanaka | G06N 20/00 |
| 2023/0161301 A1* | 5/2023 | Ano | H01L 21/67253 700/266 |
| 2023/0162484 A1* | 5/2023 | Ryu | G06V 20/52 382/159 |
| 2023/0177393 A1* | 6/2023 | Tsuchida | G06N 3/045 706/12 |
| 2023/0222131 A1 | 7/2023 | Okuyama et al. | |
| 2023/0288921 A1* | 9/2023 | Kuroda | G05B 23/024 |
| 2023/0306281 A1* | 9/2023 | Han | H01L 21/67063 |
| 2023/0333482 A1* | 10/2023 | Hubaux | G03F 7/70508 |
| 2024/0203765 A1* | 6/2024 | Ota | H01L 21/67259 |

FOREIGN PATENT DOCUMENTS

| | | | |
|---|---|---|---|
| JP | 2018138308 | 9/2018 | |
| JP | 2019009416 | 1/2019 | |
| JP | 2019054104 | 4/2019 | |
| JP | 6525044 | 6/2019 | |
| JP | 2019106476 | 6/2019 | |
| JP | 2019159864 | 9/2019 | |
| JP | 2020038888 | 3/2020 | |
| JP | 2020093468 | 6/2020 | |
| JP | 2020104216 | 7/2020 | |
| JP | 2020150198 | 9/2020 | |
| KR | 20190087940 | 7/2019 | |
| KR | 20200118030 | 10/2020 | |
| KR | 20210001493 | 1/2021 | |
| KR | 20210030447 | 3/2021 | |
| KR | 20210055105 | 5/2021 | |
| KR | 20210066897 | 6/2021 | |
| KR | 20210092238 | 7/2021 | |
| TW | 201246354 | 11/2012 | |
| TW | 201703111 | 1/2017 | |
| TW | 201832872 | 9/2018 | |
| TW | 201946177 | 12/2019 | |
| WO | WO-2018033890 A1 * | 2/2018 | G06F 18/214 |
| WO | 2019198143 | 10/2019 | |
| WO | 2019202962 | 10/2019 | |
| WO | 2020105517 | 5/2020 | |

\* cited by examiner

Scanning Speed Information

| Position (mm) | X1 | X2 | X3 | X4 | X5 | X6 | X7 | X8 | X9 |
|---|---|---|---|---|---|---|---|---|---|
| Speed (mm/s) | Y1 | Y2 | Y3 | Y4 | Y5 | Y6 | Y7 | Y8 | Y9 |

TB10

| Learning Data Set | TB11 | TB12 | TB13 |
|---|---|---|---|
| | Learning Target Speed Information | Amount Of Treatment | Flag |
| | #A1 | DA1 | NG |
| | #A2 | DA2 | OK |

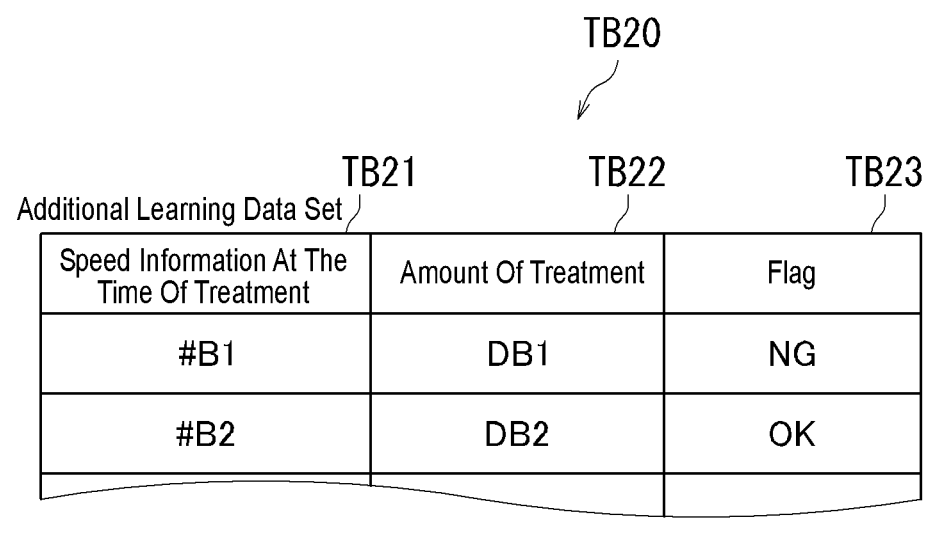

| Additional Learning Data Set TB21 | TB22 | TB23 |
|---|---|---|
| Speed Information At The Time Of Treatment | Amount Of Treatment | Flag |
| #B1 | DB1 | NG |
| #B2 | DB2 | OK |

FIG. 19

| Class (Number Of Lots) | Learning Data Set |
|---|---|
| 1 | #DS1 |
| 2 | #DS2 |

SUBSTRATE TREATMENT APPARATUS, SUBSTRATE TREATMENT METHOD, SUBSTRATE TREATMENT SYSTEM, AND LEARNING DATA GENERATION METHOD

CROSS-REFERENCE TO RELATED ART

The present application claims priority based on Japanese Patent Application No. 2019-238989 filed Dec. 27, 2019 and Japanese Patent Application No. 2020-194253 filed Nov. 24, 2020 under 35 USC 119, the entire contents of which are incorporated herein.

BACKGROUND

Technical Field

The subject matter of the present application relates to a substrate treatment apparatus, a substrate treatment method, a substrate treatment system, and a learning data generation method.

Description of Related Art

Substrate treatment apparatuses that perform film thickness adjustment for the coating films and removal of foreign matters through liquid treatments on wafers with coating films formed on the surfaces thereof as a treatment target are known. As a type of such substrate treatment apparatuses, there is a sheet feeding-type substrate treatment apparatus provided with a nozzle that supplies a treatment solution for etching to a wafer surface. In such a type of substrate treatment apparatus, the nozzle is caused to eject the treatment solution for etching while causing the nozzle to move on the basis of a predefined speed profile at the time of execution of an etching treatment.

SUMMARY

According to a substrate treatment apparatus causing a nozzle to move on the basis of a predefined speed profile, it may be necessary to redevelop the speed profile in accordance with a change in pretreatment executed on the wafer, for example. This is because the film thickness of the coating film before the etching treatment or variation in film thickness of the coating film before the etching treatment change if the pretreatment is changed. This leads to a burden on an operator who is involved in development of the speed profile.

According to an aspect of the subject matter of the present application, a substrate treatment apparatus supplies a treatment solution to a substrate and executes a treatment on the substrate. The substrate treatment apparatus includes a nozzle, a moving mechanism, a storage portion, and a control portion. The nozzle supplies the treatment solution to the substrate. The moving mechanism causes at least either the nozzle or the substrate to move. The storage portion stores a learned model. The control portion controls the moving mechanism using the learned model. The learned model is generated by learning, as learning data, learning target speed information indicating at least either a moving speed of the nozzle or a moving speed of a substrate that is a learning target or indicating a relative moving speed of the nozzle and the substrate that is the learning target and an amount of treatment acquired by executing the treatment on the substrate that is the learning target while causing at least either the nozzle or the substrate that is the learning target to move at a speed based on the learning target speed information. The amount of treatment indicates an amount by which the substrate is treated in the treatment. The control portion causes speed information at the time of treatment to be outputted from the learned model by inputting a target amount of the amount of treatment to the learned model. The control portion controls the moving mechanism such that at least either the nozzle or a substrate that is a treatment target moves at a speed based on the speed information at the time of treatment when the treatment is executed on the substrate that is treatment target. The speed information at the time of treatment indicates at least either the moving speed of the nozzle or a moving speed of the substrate that is the treatment target or indicates a relative moving speed of the nozzle and the substrate that is the treatment target.

In an embodiment, the learning target speed information indicates at least either a moving speed of the nozzle set for each of nozzle positions that divide a moving section, in which the nozzle moves, into a plurality of sections or a moving speed of the substrate that is the learning target set for each of substrate positions that divide a moving section, in which the substrate that is the learning target moves, into a plurality of sections or indicates a relative moving speed of the nozzle and the substrate that is the learning target for each of the nozzle positions or for each of the substrate positions. The speed information at the time of treatment indicates at least either the moving speed of the nozzle set for each of the nozzle positions or the moving speed of the substrate that is the treatment target set for each of the substrate positions or indicates the relative moving speed of the nozzle and the substrate that is the treatment target for each of the nozzle positions or for each of the substrate positions.

In an embodiment, the substrate treatment apparatus may further include a substrate holding portion and a substrate rotating portion. The substrate holding portion holds the substrate horizontally. The substrate rotating portion causes the substrate and the substrate holding portion to integrally rotate about a center axis extending in an up-down direction. The relative moving speed indicates a relative moving speed of a surface of the rotating substrate and the nozzle.

In an embodiment, the control portion learns, as learning data for additional learning, the speed information at the time of treatment and the amount of treatment acquired by executing the treatment on the substrate that is the treatment target while causing at least either the nozzle or the substrate that is the treatment target to move at the speed based on the speed information at the time of treatment and generates a learned model after the additional learning.

In an embodiment, the control portion determines whether or not the amount of treatment is able to be used for the additional learning.

In an embodiment, the substrate treatment apparatus further includes: a measuring instrument. The measuring instrument measures a value of a measurement target. The storage portion stores a recipe for controlling execution of the treatment. The recipe indicates a setting value for the measurement target. The control portion executes a different error report in accordance with whether or not the amount of treatment is able to be used for the additional learning in a case in which a difference between the value of the measurement target and the setting value is equal to or greater than a defined value.

In an embodiment, the substrate treatment apparatus further includes a treatment amount detection portion that detects the amount of treatment.

In an embodiment, the storage portion stores the learning target speed information. The control portion causes the nozzle to supply the treatment solution to the substrate that is the learning target while controlling the moving mechanism such that at least either the nozzle or the substrate that is the learning target moves at the speed based on the learning target speed information, thereby executing the treatment on the substrate that is the learning target. The control portion generates the learning data including the amount of treatment acquired by executing the treatment on the substrate that is the learning target and the learning target speed information. The control portion categorizes the learning data into each of classes on the basis of a predefined categorization rule. The control portion learns the learning data for each of the classes and generates the learned model. The control portion selects one of the classes on the basis of a predefined selection rule when the treatment is executed on the substrate that is the treatment target. The control portion causes the speed information at the time of treatment to be outputted from the learned model by inputting the target amount to the learned model corresponding to the selected class.

In an embodiment, the categorization rule defines that the learning data is to be categorized into each of the classes in accordance with the number of treated substrates that are learning targets. The number of treated substrates that are the learning targets indicates the number of treated substrates from the time of starting utilization of the treatment solution used for the treatment on the substrates that are the learning targets. The selection rule defines that one of the classes is to be selected in accordance with the number of treated substrates that are treatment targets. The number of treated substrates that are the treatment targets indicates the number of treated substrates from the time of starting utilization of the treatment solution used for the treatment on the substrates that are the treatment targets.

In an embodiment, the control portion acquires a number of lots at the time of learning when the treatment is executed on the substrate that is the learning target. The number of lots at the time of learning is a number of lots from the time of starting utilization of the treatment solution used for the treatment. The categorization rule defines that the learning data is to be categorized into each of the classes in accordance with the number of lots at the time of learning. The control portion acquires a number of lots at the time of treatment when the treatment is executed on the substrate that is the treatment target. The number of lots at the time of treatment is a number of lots from the time of starting utilization of the treatment solution used for the treatment. The selection rule defines that one of the classes is to be selected in accordance with the number of lots at the time of treatment.

In an embodiment, the substrate treatment apparatus further includes: an input portion. The input portion inputs, for each of the classes, an instruction for choosing each piece of reference learning data from the learning data included in each of the classes. The control portion chooses, for each of the classes, the learning data with a correlation with the reference learning data that satisfies a predefined condition from the learning data included in each of the classes. The control portion learns the chosen learning data and generates the learned model for each of the classes.

According to another aspect of the subject matters of the present application, a substrate treatment method is a method of supplying a treatment solution from a nozzle to a substrate that is a treatment target and executing a treatment on the substrate that is the treatment target. The substrate treatment method includes: a step of acquiring a target amount of an amount of treatment indicating an amount by which the substrate that is the treatment target is treated in the treatment; a step of causing speed information at the time of treatment to be outputted from a learned model by inputting the target amount to the learned model; and a step of treatment for supplying the treatment solution to the substrate that is the treatment target while causing at least either the nozzle or the substrate that is the treatment target to move at a speed based on the speed information at the time of treatment. The learned model is generated by learning, as learning data, learning target speed information indicating at least either a moving speed of the nozzle or a moving speed of a substrate that is a learning target or indicating a relative moving speed of the nozzle and the substrate that is the learning target and the amount of treatment acquired by executing the treatment on the substrate that is the learning target while causing at least either the nozzle or the substrate that is the learning target to move at a speed based on the learning target speed information. The speed information at the time of treatment indicates at least either the moving speed of the nozzle or a moving speed of the substrate that is the treatment target or indicates a relative moving speed of the nozzle and the substrate that is the treatment target.

In an embodiment, the learning target speed information indicates at least either a moving speed of the nozzle set for each of nozzle positions that divide a moving section, in which the nozzle moves, into a plurality of sections or a moving speed of the substrate that is the learning target set for each of substrate positions that divide a moving section, in which the substrate that is the learning target moves, into a plurality of sections or indicates a relative moving speed of the nozzle and the substrate that is the learning target for each of the nozzle positions or for each of the substrate positions. The speed information at the time of treatment indicates at least either the moving speed of the nozzle set for each of the nozzle positions or the moving speed of the substrate that is the treatment target set for each of the substrate positions or indicates the relative moving speed of the nozzle and the substrate that is the treatment target for each of the nozzle positions or for each of the substrate positions.

In an embodiment, in the step of treatment, the substrate that is the treatment target is caused to rotate about a center axis extending in an up-down direction in a state in which the substrate is horizontally held. The relative moving speed of the nozzle and the substrate that is the learning target indicates a relative moving speed of a surface of the rotating substrate that is the learning target and the nozzle. The relative moving speed of the nozzle and the substrate that is the treatment target indicates a relative moving speed of a surface of the rotating substrate that is the treatment target and the nozzle.

In an embodiment, the substrate treatment method further includes: a step of learning data generation for generating learning data for additional learning on the basis of the speed information at the time of treatment outputted in the step of causing the speed information at the time of treatment to be outputted and the amount of treatment of the substrate that is the treatment target treated in the step of treatment; and a step of generating a learned model after the additional learning through learning the learning data for the additional learning.

In an embodiment, the step of learning data generation includes a step of determining whether or not the amount of treatment is able to be used for the additional learning.

In an embodiment, the substrate treatment method further includes: a step of determining whether or not a difference between a value of a measurement target and a setting value set in advance for the measurement target is equal to or greater than a defined value; and a step of executing a different error report in accordance with whether or not the amount of treatment is able to be used for the additional learning in a case in which a difference between the value of the measurement target and the setting value is equal to or greater than a defined value.

In an embodiment, the substrate treatment method further includes: a step of supplying the treatment solution to the substrate that is the learning target while causing at least either the nozzle or the substrate that is the learning target to move at the speed based on the learning target speed information, thereby executing the treatment on the substrate that is the learning target; a step of acquiring the amount of treatment of the substrate that is the learning target; a step of generating the learning data including the amount of treatment of the substrate that is the learning target and the learning target speed information; and a step of learning for categorizing the learning data into each of classes on the basis of a predefined categorization rule and learning the learning data for each of the classes to generate the learned model. In the step of causing the speed information at the time of treatment to be outputted, one of the classes is selected on the basis of a predefined selection rule, and the speed information at the time of treatment is caused to be outputted from the learned model by inputting the target amount to the learned model corresponding to the selected class.

In an embodiment, the categorization rule defines that the learning data is to be categorized into each of the classes in accordance with the number of treated substrates that are learning targets. The number of treated substrates that are the learning targets indicates the number of treated substrates from the time of starting utilization of the treatment solution used for the treatment on the substrates that are the learning targets. The selection rule defines that one of the classes is to be selected in accordance with the number of treated substrates that are treatment targets. The number of treated substrates that are the treatment targets indicates the number of treated substrates from the time of starting utilization of the treatment solution used for the treatment on the substrates that are the treatment targets.

In an embodiment, in the step of executing the treatment on the substrate that is the learning target, a number of lots at the time of learning is acquired. The number of lots at the time of learning is a number of lots from the time of starting utilization of the treatment solution used for the treatment. The categorization rule defines that the learning data is to be categorized into each of the classes in accordance with the number of lots at the time of learning. In the step of executing the treatment on the substrate that is the treatment target, a number of lots at the time of treatment is acquired. The number of lots at the time of treatment is a number of lots from the time of starting utilization of the treatment solution used for the treatment. The selection rule defines that one of the classes is to be selected in accordance with the number of lots at the time of treatment.

In an embodiment, the substrate treatment method further includes: a step of choosing reference learning data for each of the classes in the learning data included in each of the classes; and a step of choosing, for each of the classes, the learning data with a correlation with the reference learning data that satisfies a predefined condition in the learning data included in each of the classes. In the step of learning, the chosen learning data is learned to generate the learned model for each of the classes.

According to another aspect of the subject matters of the present application, a substrate treatment system includes a substrate treatment apparatus and an information processing apparatus. The substrate treatment apparatus supplies a treatment solution to a substrate and executes a treatment on the substrate. The information processing apparatus transmits speed information at the time of treatment to the substrate treatment apparatus. The information processing apparatus includes a communication portion, a storage portion, and a processing portion. The communication portion of the information processing apparatus receives a target amount of an amount by which a substrate that is a treatment target is treated in the treatment from the substrate treatment apparatus. The communication portion of the information processing apparatus transmits the speed information at the time of treatment to the substrate treatment apparatus. The storage portion stores a learned model. The processing portion causes the speed information at the time of treatment to be outputted from the learned model by inputting the target amount acquired from the substrate treatment apparatus via the communication portion to the learned model. The substrate treatment apparatus includes a communication portion, a nozzle, a moving mechanism, and a control portion. The communication portion of the substrate treatment apparatus transmits the target amount to the information processing apparatus. The communication portion of the substrate treatment apparatus receives the speed information at the time of treatment from the information processing apparatus. The nozzle supplies the treatment solution to the substrate. The moving mechanism causes at least either the nozzle or the substrate to move. The control portion controls the moving mechanism on the basis of the speed information at the time of treatment. The learned model is generated by learning, as learning data, learning target speed information indicating at least either a moving speed of the nozzle or a moving speed of a substrate that is a learning target or indicating a relative moving speed of the nozzle and the substrate that is the learning target and an amount of treatment acquired by executing the treatment on the substrate that is the learning target while causing at least either the nozzle or the substrate that is the learning target to move at a speed based on the learning target speed information. The amount of treatment indicates an amount by which the substrate that is the learning target is treated in the treatment. The control portion controls the moving mechanism such that at least either the nozzle or the substrate that is the treatment target moves at a speed based on the speed information at the time of treatment when the treatment is executed on the substrate that is the treatment target. The speed information at the time of treatment indicates at least either the moving speed of the nozzle or a moving speed of the substrate that is the treatment target or indicates a relative moving speed of the nozzle and the substrate that is the treatment target.

According to another aspect of the subject matters of the present application, a learning apparatus includes a storage portion and a learning portion. The storage portion stores a learning program. The learning portion learns learning data on the basis of the learning program. The learning portion learns, as the learning data, speed information indicating at least either a moving speed of the nozzle or a moving speed of the substrate or indicating a relative moving speed of the nozzle and the substrate and the amount of treatment acquired by supplying the treatment solution from the nozzle to the substrate while causing at least either the nozzle or the substrate to move at a speed based on the speed information. The amount of treatment indicates the amount by which the substrate is treated through supply of the treatment solution.

According to another aspect of the subject matters of the present application, a learning method includes: a step of acquiring learning data; and a step of learning the learning data on the basis of a learning program. The learning data indicates speed information and an amount of treatment acquired by supplying a treatment solution from a nozzle to a substrate while causing at least either the nozzle or the substrate to move at a speed based on the speed information. The speed information indicates at least either a moving speed of the nozzle or a moving speed of the substrate or indicates a relative moving speed of the nozzle and the substrate. The amount of treatment indicates an amount by which the substrate is treated through supply of the treatment solution.

According to another aspect of the subject matters of the present application, a learned model generation method includes a step of acquiring learning data and a step of learning the learning data on the basis of a learning program and generating a learned model. The learning data indicates speed information and an amount of treatment acquired by supplying a treatment solution from a nozzle to a substrate while causing at least either the nozzle or the substrate to move at a speed based on the speed information. The speed information indicates at least either a moving speed of the nozzle or a moving speed of the substrate or indicates a relative moving speed of the nozzle and the substrate. The amount of treatment indicates an amount by which the substrate is treated through supply of the treatment solution.

According to another aspect of the subject matters of the present application, a learning data generation method includes: a step of supplying a treatment solution from a nozzle to a substrate while causing at least either the nozzle or the substrate to move at a speed based on speed information, thereby executing a treatment on the substrate; a step of acquiring an amount of treatment indicating an amount by which the substrate is treated in the treatment; and a step of generating learning data on the basis of the speed information and the amount of treatment. The speed information indicates at least either a moving speed of the nozzle or a moving speed of the substrate or indicates a relative moving speed of the nozzle and the substrate.

BRIEF DESCRIPTION OF THE DRAWINGS

FIG. 13 is a diagram illustrating an example of a learning data set table according to the first embodiment.

FIG. 19 is a diagram illustrating an example of an additional learning data set table according to the first embodiment.

FIG. 34 is a diagram illustrating an example of a learning data set table according to the fifth embodiment.

DESCRIPTION OF THE EMBODIMENTS

Figure 1:
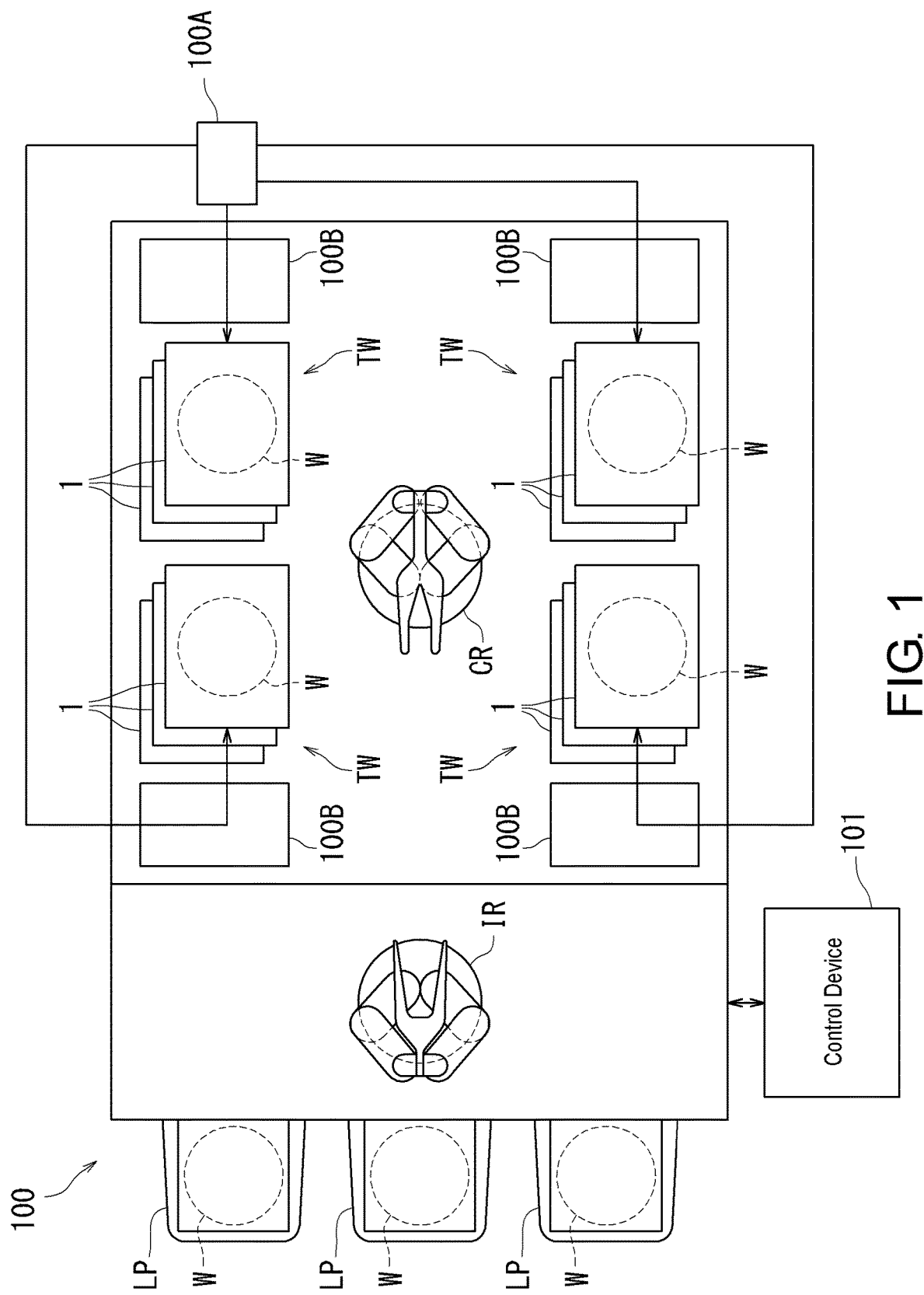
FIG. 1 is a schematic view of a substrate treatment apparatus according to a first embodiment.

Hereinafter, embodiments of the present disclosure will be described with reference to the drawings. However, the present disclosure is not limited to the following embodiments and can be implemented in various aspects without departing from the gist thereof. Note that repeated description may appropriately be omitted. Also, the same reference signs will be applied to the same or corresponding components in the drawings, and the description thereof will not be repeated.

First Embodiment

Referring to FIG. 1, a substrate treatment apparatus 100 according to the present embodiment will be described. FIG. 1 is a schematic view of the substrate treatment apparatus 100 according to the present embodiment. Specifically, FIG. 1 is a schematic plan view of the substrate treatment apparatus 100. The substrate treatment apparatus 100 is a sheet feeding-type apparatus that treats substrates W one by one. In the present embodiment, the substrates W are semiconductor wafers. The substrates W have substantially disk shapes.

As illustrated in FIG. 1, the substrate treatment apparatus 100 includes a plurality of treatment units 1, a fluid cabinet 100A, a plurality of fluid boxes 100B, a plurality of load ports LP, an indexer robot IR, a center robot CR, and a control device 101.

Each load port LP accommodates a plurality of substrates W in a stacking manner. The indexer robot IR transports the substrates W between the load port LP and the center robot CR. The center robot CR transports the substrates W between the indexer robot IR and the treatment units 1. Each treatment unit 1 supplies a treatment solution to the substrates W and executes a treatment on the substrates W. The fluid cabinet 100A accommodates the treatment solution therein.

The plurality of treatment units 1 form a plurality of towers TW (four towers TW in FIG. 1) disposed to surround the center robot CT in a plan view. Each tower TW includes a plurality of treatment units 1 (three treatment units 1 in FIG. 1) stacking in an up-down direction. The fluid boxes 100B correspond to the plurality of towers TW, respectively. The treatment solution in the fluid cabinet 100A is supplied to all the treatment units 1 included in the towers TW corresponding to the fluid boxes 100B via any of the fluid boxes 100n.

The control device 101 controls operations of each component in the substrate treatment apparatus 100. For example, the control device 101 controls the load port LP, the indexer robot IR, and the center robot CR.

In the present embodiment, the control device 101 functions as a learning apparatus. Specifically, the control device 101 executes machine learning. The control device 101 in the present embodiment further executes additional learning. The machine learning and the additional learning are, for example, any of supervised learning, non-supervised learning, semi-supervised learning, reinforcement learning, and deep learning.

Note that although the machine learning is typically a concept including additional learning, the present embodiment will be described with the term "machine learning" and the term "additional learning" used separately herein for convenience. In the present embodiment, the "machine learning" represents machine learning executed before manufacturing of the semiconductor product. In other words, the "machine learning" represents machine learning executed in a stage of manufacturing the substrate treatment apparatus 100. On the other hand, the "additional learning" represents machine learning executed in a stage of manufacturing the semiconductor product. In other words, the "additional learning" represents machine learning executed when the substrate treatment apparatus 100 is adjusted.

Figure 2:
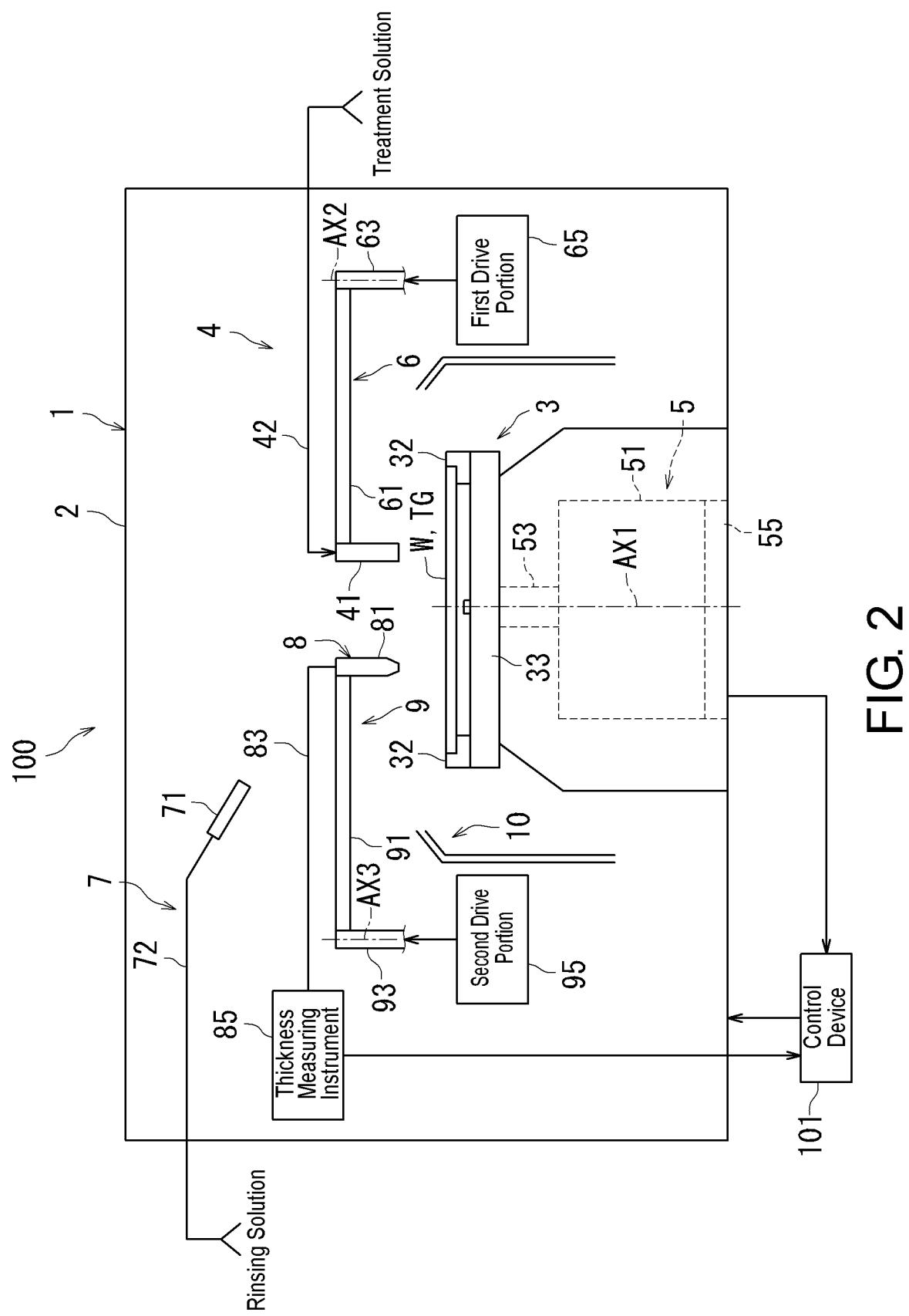
FIG. 2 is a schematic view of a treatment unit according to the first embodiment.

Next, the treatment units 1 in the present embodiment will be described with reference to FIG. 2. FIG. 2 is a schematic view of each treatment unit 1 according to the present embodiment. Specifically, FIG. 2 is a schematic sectional view of each treatment unit 1.

The treatment unit 1 treats a target object configuring each substrate W with a treatment solution. Hereinafter, the target object that is a target of the treatment with the treatment solution will be described as a "target object TG". The target object TG is a substrate body (a substrate body made of silicon, for example) or a substance formed on the surface of the substrate body, for example. The substance formed on the surface of the substrate body is, for example, a substance of the same material as that of the substrate body (a layer made of silicon, for example) or a substance of a material that is different from that of the substrate body (for example, a silicon oxide film, a silicon nitride film, or a resist). The "substance" may configure a film.

In the present embodiment, the treatment solution contains an etching solution, and the treatment unit 1 executes an etching treatment. The target object TG is treated (etched) with the etching solution. The etching solution is a chemical solution. Examples of the etching solution include fluonitric acid (a mixture solution of hydrofluoric acid (HF) and nitric acid ($HNO_3$), hydrofluoric acid, buffered hydrofluoric acid (BHF), ammonium fluoride, HFEG (a mixed solution of hydrofluoric acid and ethylene glycol), and phosphoric acid ($H_3PO_4$).

As illustrated in FIG. 2, the treatment unit 1 includes a chamber 2, a spin chuck 3, a spin motor portion 5, a nozzle moving mechanism 6, a thickness measurement portion 8, a probe moving mechanism 9, a plurality of guards 10 (two guards 10 in FIG. 2), a first nozzle 41, and a second nozzle 71. Also, the substrate treatment apparatus 100 includes an etching solution supply portion 4 and a rinsing solution supply portion 7. The etching solution supply portion 4 has a first supply pipe 42 while the rinsing solution supply portion 7 has a second supply pipe 72.

The chamber 2 has substantially a box shape. The chamber 2 accommodates the substrate W, the spin chuck 3, the spin motor portion 5, the nozzle moving mechanism 6, the plurality of guards 10, the thickness measurement portion 8, the probe moving mechanism 9, the first nozzle 41, the second nozzle 71, a part of the first supply pipe 42, and a part of the second supply pipe 72.

The spin chuck 3 horizontally holds the substrate W. The spin chuck 3 is an example of the substrate holding portion. Specifically, the spin chuck 3 has a plurality of chuck members 32 and a spin base 33. The plurality of chuck members 32 are provided at the spin base 33 along a peripheral edge of the substrate W. The plurality of chuck members 32 hold the substrate W in a horizontal posture. The spin base 33 has substantially a disk shape and supports the plurality of chuck members 32 in a horizontal posture.

The spin motor portion 5 causes the substrate W and the spin chuck 3 to integrally rotate about a first rotational axis line AX1. The first rotational axis line AX1 extends in the up-down direction. In the present embodiment, the first rotational axis line AX1 extends in a substantially vertical direction. The first rotational axis line AX1 is an example of the center axis while the spin motor portion 5 is an example of the substrate rotating portion. Specifically, the spin motor portion 5 causes the spin base 33 to rotate about the first rotational axis line AX1. Therefore, the spin base 33 rotates about the first rotational axis line AX1. As a result, the substrate W held by the plurality of chuck members 32 provided at the spin base 33 rotates about the first rotational axis line AX1.

Specifically, the spin motor portion 5 has a motor body 51, a shaft 53, and an encoder 55. The shaft 53 is coupled to the spin base 33. The motor body 51 causes the shaft 53 to rotate. As a result, the spin base 33 rotates.

The encoder 55 is an example of the measuring instrument that measures a value of a measurement target, and the measurement target of the encoder 55 is a rotation speed of the substrate W. The encoder 55 generates a signal indicating the rotation speed of the substrate W. Specifically, the encoder 55 generates a rotation speed signal indicating the rotation speed of the motor body 51.

The first nozzle 41 supplies the etching solution to the substrate W. Specifically, the first nozzle 41 ejects the etching solution toward the rotating substrate W. The etching solution supply portion 4 supplies the etching solution to the first nozzle 41. Specifically, the first nozzle 41 is connected to one end of the first supply pipe 42. The etching solution is supplied to the first nozzle 41 via the first supply pipe 42. The first supply pipe 42 is a pipe-shaped member through which the etching solution is distributed.

The nozzle moving mechanism 6 causes the first nozzle 41 to move. The nozzle moving mechanism 6 is an example of the moving mechanism. In the present embodiment, the nozzle moving mechanism 6 causes the first nozzle 41 to move in a substantially horizontal direction. Specifically, the nozzle moving mechanism 6 causes the first nozzle 41 to turn around a second rotational axis line AX2 along the substantially vertical direction. The first nozzle 41 ejects the etching solution toward the substrate W while moving (being turned). The first nozzle 41 may be called a scan nozzle.

Specifically, the nozzle moving mechanism 6 has a nozzle arm 61, a first rotational axis 63, and a first drive portion 65. The nozzle arm 61 extends in the substantially horizontal direction. The first nozzle 41 is disposed at a distal end portion of the nozzle arm 61. The nozzle arm 61 is coupled to the first rotational axis 63. The first rotational axis 63 extends in the substantially vertical direction. The first drive portion 65 causes the first rotational axis 63 to rotate about the second rotational axis line AX2 and causes the nozzle arm 61 to rotate about the first rotational axis 63 along a substantially horizontal plane. As a result, the first nozzle 41 moves along the substantially horizontal plane. Specifically, the first nozzle 41 turns around the first rotational axis 63 with the second rotational axis line AX2 located at the center. The first drive portion 65 includes, for example, a stepping motor.

The second nozzle 71 supplies the rinsing solution to the substrate W. Specifically, the second nozzle 71 ejects the rinsing solution toward the rotating substrate W. The rinsing solution supply portion 7 supplies the rinsing solution to the second nozzle 71. Specifically, the rinsing solution is supplied to the second nozzle 71 via the second supply pipe 72. The second supply pipe 72 is a pipe-shaped member through which the rinsing solution is distributed. The rinsing solution is, for example, deionized water, carbonated water, electrolytic ionized water, hydrogen water, ozone water, or hydrochloric acid water with a diluted concentration (of about 10 ppm to 100 ppm, for example). The second nozzle 71 ejects the rinsing solution in a stationary state. The second nozzle 71 may be referred to as a fixed nozzle. Note that the second nozzle 71 may be a scan nozzle.

Each guard 10 has a substantially tubular shape. The plurality of guards 10 receives the etching solution and the rinsing solution discharged from the substrate W.

The thickness measurement portion 8 measures the thickness of the target object TG in a non-contact manner and generates a thickness detection signal indicating the thickness of the target object TG. The thickness detection signal is input to the control device 101.

The thickness measurement portion 8 measures the thickness of the target object TG by spectral interferometry, for example. Specifically, the thickness measurement portion 8 includes an optical probe 81, a signal line 83, and a thickness measuring instrument 85. The optical probe 81 has a lens. The signal line 83 connects the optical probe 81 to the thickness measuring instrument 85. The signal line 83 includes, for example, an optical fiber. The thickness measuring instrument 85 has a light source and a light receiving element. Light emitted from the light source of the thickness measuring instrument 85 is emitted to the target object TG via the signal line 83 and the optical probe 81. The light reflected by the target object TG is received by the light receiving element of the thickness measuring instrument 85 via the optical probe 81 and the signal line 83. The thickness measuring instrument 85 analyzes the light received by the light receiving element and calculates the thickness of the target object TG. The thickness measuring instrument 85 generates a thickness detection signal indicating the calculated thickness of the target object TG.

The probe moving mechanism 9 causes the optical probe 81 to move in the substantially horizontal direction. Specifically, the probe moving mechanism 9 causes the optical probe 81 to turn around a third rotational axis line AX3 along the substantially vertical direction. The optical probe 81 emits light toward the substrate W while moving (being turned). Therefore, the thickness detection signal indicates distribution of the thickness of the target object TG.

Specifically, the probe moving mechanism 9 has a probe arm 91, a second rotational axis 93, and a second drive portion 95. The probe arm 91 extends in the substantially horizontal direction. The optical probe 81 is disposed at a distal end portion of the probe arm 91. The probe arm 91 is coupled to the second rotational axis 93. The second rotational axis 93 extends in the substantially vertical direction. The second drive portion 95 causes the second rotational axis 93 to rotate about the third rotational axis line AX3 and causes the probe arm 91 to rotate about the second rotational axis 93 along a substantially horizontal plane. As a result, the optical probe 81 moves along the substantially horizontal plane. Specifically, the optical probe 81 turns around the second rotational axis 93 with the third rotational axis line AX3 located at the center. The second drive portion 95 includes, for example, a stepping motor.

In the present embodiment, the thickness measurement portion 8 is an example of the treatment amount detection portion and is used to detect the amount of treatment. The amount of treatment indicates the amount by which the substrate W is treated in the treatment performed on the substrate W by the treatment unit 1. Specifically, the amount of treatment indicates the amount by which the substrate W is treated with the etching solution (treatment solution) supplied from the first nozzle 41 to the substrate W. In the present embodiment, the amount of treatment indicates the amount of etching. The amount of etching indicates a difference between the thickness of the target object TG before the etching treatment and the thickness of the target object TG after the etching treatment.

The control device 101 acquires the amount of etching by calculating the amount of etching on the basis of the thickness detection signal input by the thickness measurement portion 8 (thickness measuring instrument 85) when the machine learning is executed. More specifically, the control device 101 acquires a distribution of the amount of etching (a distribution of the amount of treatment). The control device 101 generates learning data (learning data set) for the machine learning using the acquired etching amount.

Also, the control device 101 acquires the amount of etching by calculating the amount of etching on the basis of the thickness detection signal input by the thickness measurement portion 8 (thickness measuring instrument 85) when the semiconductor product is manufactured. The control device 101 determines whether or not to generate learning data for additional learning on the basis of the acquired amount of etching when the semiconductor product is manufactured. If the control device 101 determines that the learning data for additional learning is to be generated, the learning data for additional learning is generated on the basis of the acquired amount of etching.

Also, a rotation speed signal is input from the encoder 55 to the control device 101. The rotation speed of the substrate W affects the amount of etching. The control device 101 determines whether or not an abnormality has occurred in the substrate treatment apparatus 100 on the basis of the rotation speed signal. Specifically, the control device 101 stores a recipe 131 for controlling each component of the substrate treatment apparatus 100 as will be described with reference to FIG. 8, and the recipe 131 indicates a setting value for the rotation speed of the motor body 51. The setting value for the rotation speed of the motor body 51 is an example of the setting value for the measurement target. The control device 101 controls the treatment executed by the treatment unit 1, with reference to the recipe 131. The control device 101 determines that the rotation speed of the substrate W indicates an abnormal value in a case in which a difference between the rotation speed indicated by the rotation speed signal and the setting value for the rotation speed of the motor body 51 included in the recipe 131 is equal to or greater than a defined value set in advance. If the control device 101 determines that the rotation speed of the substrate W indicates the abnormal value, then the control device 101 determines that abnormality has occurred in the substrate treatment apparatus 100.

Figures 3, 4:
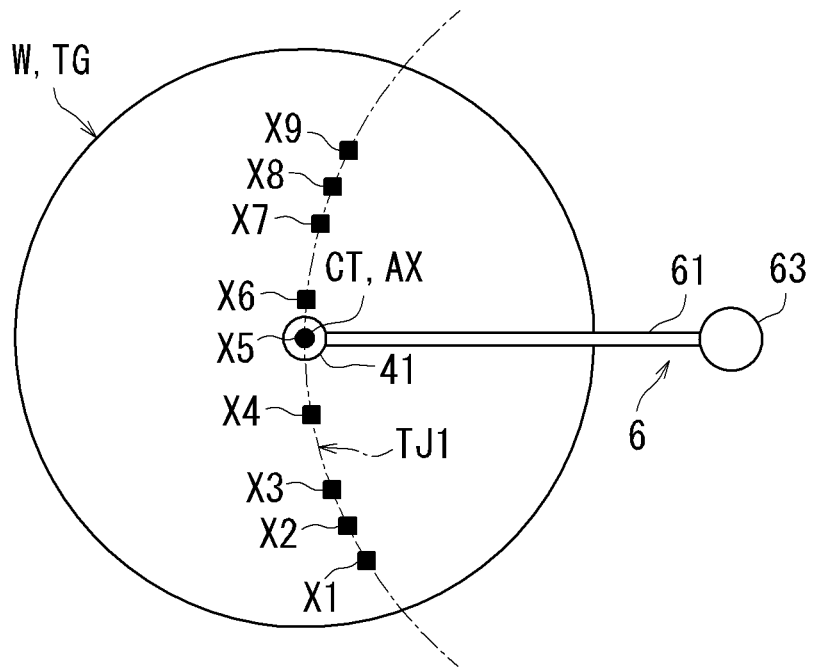
FIG. 3 is a plan view illustrating a scanning treatment according to the first embodiment.
FIG. 4 is a diagram illustrating scanning speed information according to the first embodiment.

Next, a scanning treatment performed on the substrate W by the first nozzle 41 will be described with reference to FIG. 3. FIG. 3 is a plan view illustrating the scanning treatment according to the present embodiment. As illustrated in FIG. 3, the scanning treatment is a treatment of ejecting the treatment solution to the target object TG while moving the first nozzle 41 such that solution landing positions of the treatment solution on the surface of the target object TG form an arc trajectory TJ1 in a plan view. The trajectory TJ1 passes through a center portion CT of the substrate W. The center portion CT indicates a portion on the substrate W through which the first rotational axis line AX1 passes. The scanning treatment is executed when the substrate W is rotated.

In the present embodiment, the first nozzle 41 ejects the etching solution toward the rotating substrate W while moving from a first position X1 to a ninth position X9. Each of the positions X1 to X9 included in the first position X1 to the ninth position X9 is included in the trajectory TJ1. The section from the first position X1 to the ninth position X9 indicates a moving section in which the first nozzle 41 moves.

Among the first position X1 to the ninth position X9, the first position X1 indicates an ejection start position of the treatment solution (etching solution), and the ninth position X9 indicates an ejection stop position of the treatment solution (etching solution). The moving speed of the first nozzle 41 at the first position X1 is 0 mm/s, and the moving speed of the first nozzle 41 at the ninth position X9 is 0 mm/s. Therefore, the first position X1 is a start position of the scanning treatment, and the ninth position X9 is an end position of the scanning treatment. Also, the first position X1 is a moving start position of the first nozzle 41, and the ninth position X9 is a moving end position of the first nozzle 41. Note that the moving speed of the first nozzle 41 during the scanning treatment may be referred to as a "scanning speed" in the following description.

The first nozzle 41 passes through each of intermediate positions (each of positions X2 to X8 from a second position X2 to an eighth position X8) between the first position X1 and the ninth position X9 during the scanning process. The intermediate positions are an example of the nozzle positions and divide the moving section of the first nozzle 41 into a plurality of sections.

Next, scanning speed information will be described with reference to FIG. 4. The scanning speed information indicates a setting value for the moving speed of the first nozzle 41 (setting value for the scanning speed) during the scanning treatment. FIG. 4 is a diagram illustrating scanning speed information according to the present embodiment. The scanning speed information is an example of speed information, learning target speed information, and speed information at the time of treatment. Specifically, FIG. 4 illustrates a relationship between each of the positions X1 to X9 included in the moving section of the first nozzle 41 described above with reference to FIG. 3 and the setting value for the scanning speed.

In FIG. 4, the upper section illustrates each of the positions X1 to X9 included in the moving section of the first nozzle 41, and the lower section illustrates the setting value for the scanning speed. Each of the positions X1 to X9 included in the moving section of the first nozzle 41 is defined at a radial position of the substrate W. Specifically, the upper section illustrates a start position of the moving section of the first nozzle 41 (first nozzle 41 moving start position), an end position of the moving section of the first nozzle 41 (first nozzle 41 moving end position), and the plurality of intermediate positions between the start position and the end position of the moving section of the first nozzle 41 (the plurality of positions through which the first nozzle 41 passes).

As illustrated in FIG. 4, the scanning speed information indicates the setting value for the scanning speed for each of the positions X1 to X9 included in the moving section of the first nozzle 41. Hereinafter, each of the positions X1 to X9 included in the moving section of the first nozzle 41 may be described as a "speed setting position". In the present embodiment, the scanning speed information indicates nine speed setting positions.

Specifically, each of the speed setting positions corresponds to each of the positions X1 to X9 from the first position X1 to the ninth position X9 described above with reference to FIG. 3. Note that as described above with reference to FIG. 3, the scanning speed set at the start position (first position X1) of the moving section of the first nozzle 41 is 0 [mm/s] and the scanning speed set at the end position (ninth position X9) of the moving section of the first nozzle 41 is 0 [mm/s].

The control device 101 described above with reference to FIGS. 1 and 2 controls the nozzle moving mechanism 6 (first drive portion 65) with reference to FIG. 2 on the basis of the scanning speed information. As a result, the first nozzle 41 moves along the trajectory TJ1 described above with reference to FIG. 3 such that the scanning speed at each speed setting position is the scanning speed defined by the scanning speed information.

Figure 5:
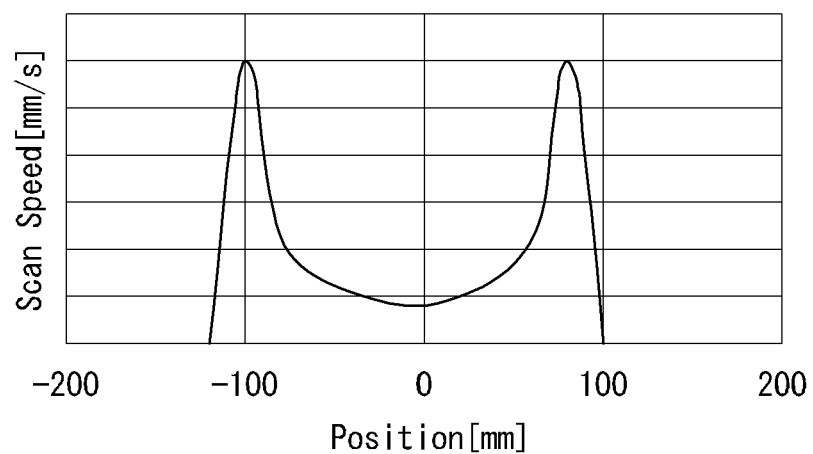
FIG. 5 is a graph illustrating an example of a moving speed of a first nozzle according to the first embodiment.

Next, the moving speed (scanning speed) of the first nozzle 41 during the scanning treatment will be described with reference to FIG. 5. FIG. 5 is a graph illustrating an example of the moving speed of the first nozzle 41 according to the present embodiment.

In FIG. 5, the vertical axis represents the scanning speed [mm/s] while the horizontal axis represents the radial position [mm] of the substrate W. As illustrated in FIG. 5, the scanning speed when the scanning treatment is started is 0 [mm/s]. Also, the scanning speed when the scanning treatment ends is 0 [mm/s].

As described above with reference to FIGS. 3 and 4, the scanning speed is set for each of the positions X1 to X9 (each speed setting position) from the first position X1 to the ninth position X9. As a result, the scanning speed successively changes from the scanning speed set for the speed setting position on one side to the scanning speed set for the speed setting position on the other side between adjacent speed setting positions as illustrated in FIG. 5. For example, a scanning speed Y3 is set for the third position X3, and a scanning speed Y4 is set for the fourth position X4 as illustrated in FIG. 4. Therefore, the scanning speed of the first nozzle 41 successively changes from the scanning speed Y3 to the scanning speed Y4 when the first nozzle 41 moves from the third position X3 to the fourth position X4.

Figure 6:
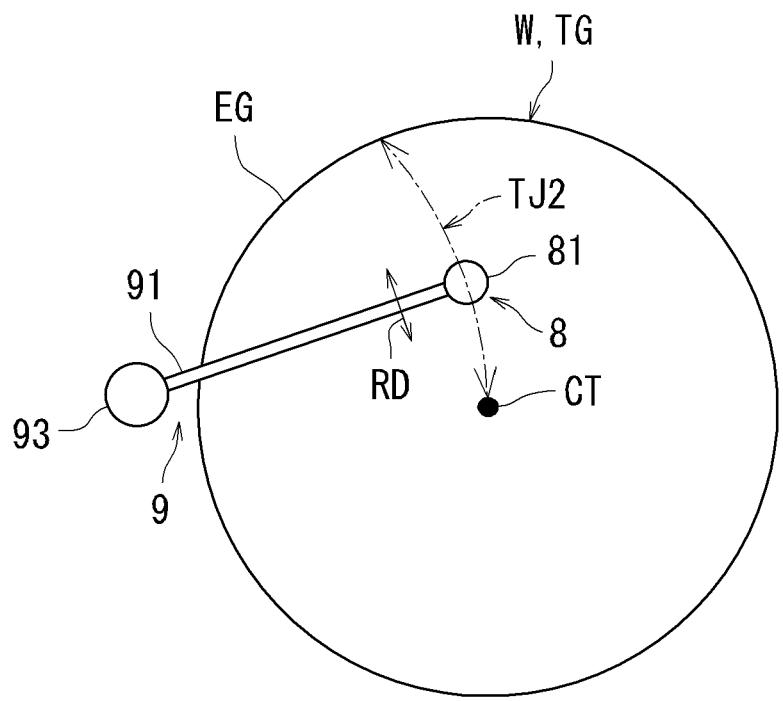
FIG. 6 is a plan view illustrating a thickness measurement process according to the first embodiment.

Next, a thickness measurement process performed by the thickness measurement portion 8 will be described with reference to FIG. 6. FIG. 6 is a plan view illustrating the thickness measurement process according to the present embodiment. As illustrated in FIG. 6, the thickness measurement process is a process of measuring the thickness of the target object TG while moving the optical probe 81 such that thickness measurement positions of the target object TG form an arc trajectory TJ2 in a plan view. The trajectory TJ2 passes through an edge portion EG of the substrate W and a center portion CT of the substrate W. The edge portion EG indicates a peripheral edge portion of the substrate W. The thickness measurement process is executed when the substrate W rotates.

Specifically, the optical probe 81 emits light toward the target object TG while moving between the center portion CT and the edge portion EG of the substrate W in a plan view. As a result, the thickness of the target object TG is measured at each measurement position included in the trajectory TJ2. Each measurement position corresponds to one radial position of the substrate W. Therefore, the thickness distribution of the target TG in the radial direction RD of the substrate W is measured in the thickness measurement process.

Figure 7:
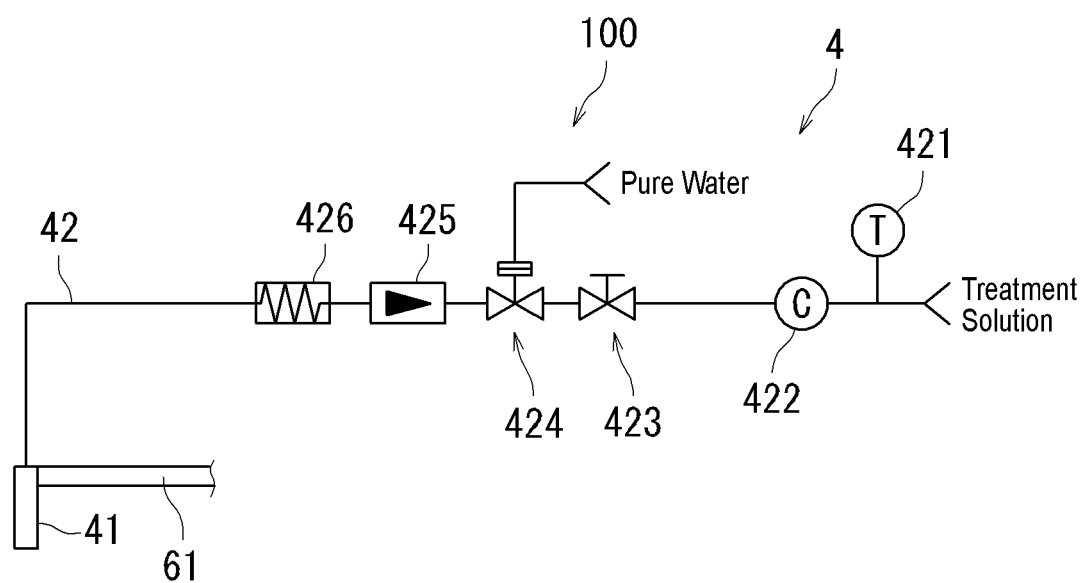
FIG. 7 is a schematic view of an etching solution supply portion according to the first embodiment.

Next, the etching solution supply portion 4 in the present embodiment will be described with reference to FIG. 7. FIG. 7 is a schematic view of the etching solution supply portion 4 according to the present embodiment. As illustrated in FIG. 7, the etching solution supply portion 4 further has a temperature sensor 421, a concentration sensor 422, a valve 423, a mixing valve 424, a flowmeter 425, and a heating heater 426 in addition to the first supply pipe 42 described above with reference to FIG. 2.

The temperature sensor 421 is an example of the measuring instrument that measures a value of a measurement target, and the measurement target of the temperature sensor 421 is a temperature of the etching solution flowing through the first supply pipe 42. Hereinafter, the temperature of the etching solution flowing through the first supply pipe 42 will be referred to as a "temperature of the etching solution". The temperature sensor 421 generates a temperature signal indicating the temperature of the etching solution. The temperature of the etching solution affects the amount of etching.

The temperature signal is input to the control device 101 described above with reference to FIGS. 1 and 2. The control device 101 determines whether or not an abnormality has occurred in the substrate treatment apparatus 100 on the basis of the temperature signal. Specifically, the recipe 131 described with reference to FIG. 8 indicates a setting value for the temperature of the etching solution. The setting value for the temperature of the etching solution is an example of the setting value for the measurement target. The control device 101 determines that the temperature of the etching solution indicates an abnormal value in a case in which a difference between the temperature indicated by the temperature signal and the setting value for the temperature of the etching solution included in the recipe 131 is equal to or greater than a defined value set in advance. If the control device 101 determines that the temperature of the etching solution indicates an abnormal value, then the control device 101 determines that abnormality has occurred in the substrate treatment apparatus 100.

The concentration sensor 422 is an example of the measuring instrument that measures a value of a measurement target, and the measurement target of the concentration sensor 422 is a concentration of an etching component contained in the etching solution flowing through the first supply pipe 42. Hereinafter, the concentration of the etching component contained in the etching solution flowing through the first supply pipe 42 will be referred to as a "concentration of the etching solution". The concentration sensor 422 generates a concentration signal indicating the concentration of the etching solution. The concentration of the etching solution affects the amount of etching.

The concentration signal is inputted to the control device 101 described above with reference to FIGS. 1 and 2. The control device 101 determines whether or not an abnormality has occurred in the substrate treatment apparatus 100 on the basis of the concentration signal. Specifically, the recipe 131 described with reference to FIG. 8 indicates a setting value for the concentration of the etching solution. The setting value for the concentration of the etching solution is an example of the setting value for the measurement target. The control device 101 determines that the concentration of the etching solution indicates an abnormal value in a case in which a difference between the concentration indicated by the concentration signal and the setting value for the concentration of the etching solution included in the recipe 131 is equal to or greater than a defined value set in advance. If the control device 101 determines that the concentration of the etching solution indicates an abnormal value, then the control device 101 determines that abnormality has occurred in the substrate treatment apparatus 100.

The valve 423 is disposed in the first supply pipe 42. The valve 423 performs switching between supply and stopping of supply of the etching solution to the first nozzle 41. Specifically, if the valve 423 is open, then the etching solution is ejected from the first nozzle 41 toward the substrate W. On the other hand, if the valve 423 is closed, then the ejection of the etching solution is stopped. Also, the valve 423 controls the flow amount of the etching solution flowing further downward than the valve 423 in the first supply pipe 42. Specifically, the flow amount of the etching solution flowing further downward than the valve 423 is adjusted in accordance with an opening degree of the valve 423. Therefore, the flow amount of ejected etching solution is adjusted in accordance with an opening degree of the valve 423. The valve 423 is, for example, a motor valve.

The mixing valve 424 is disposed in the first supply pipe 42. If the mixing valve 424 is open, then pure water flows into the first supply pipe 42, and the concentration of the etching solution is diluted.

The flowmeter 425 is an example of the measuring instrument that measures a value of a measurement target, and the measurement target of the flowmeter 425 is the flow amount of ejected etching solution. Specifically, the measurement target of the flowmeter 425 is the flow amount of the etching solution flowing through the first supply pipe 42. The flowmeter 425 generates an ejection flow amount signal indicating the flow amount of ejected etching solution. The flow amount of ejected etching solution affects the amount of etching.

The ejection flow amount signal is inputted to the control device 101 described above with reference to FIGS. 1 and 2. The control device 101 determines whether or not abnormality has occurred in the substrate treatment apparatus 100 on the basis of the ejection flow amount signal. Specifically, the recipe 131 described with reference to FIG. 8 indicates a setting value for the flow amount of ejected etching solution. The setting value for the flow amount of ejected etching solution is an example of the setting value for the measurement target. The control device 101 determines that the flow amount of ejected etching solution indicates an abnormal value in a case in which a difference between the ejection flow amount indicated by the ejection flow amount signal and the setting value for the flow amount of ejected etching solution included in the recipe 131 is equal to or greater than a defined value set in advance. If the control device 101 determines that the flow amount of ejected etching solution indicates an abnormal value, then the control device 101 determines that abnormality has occurred in the substrate treatment apparatus 100.

The heating heater 426 heats the etching solution flowing through the first supply pipe 42.

Figure 8:
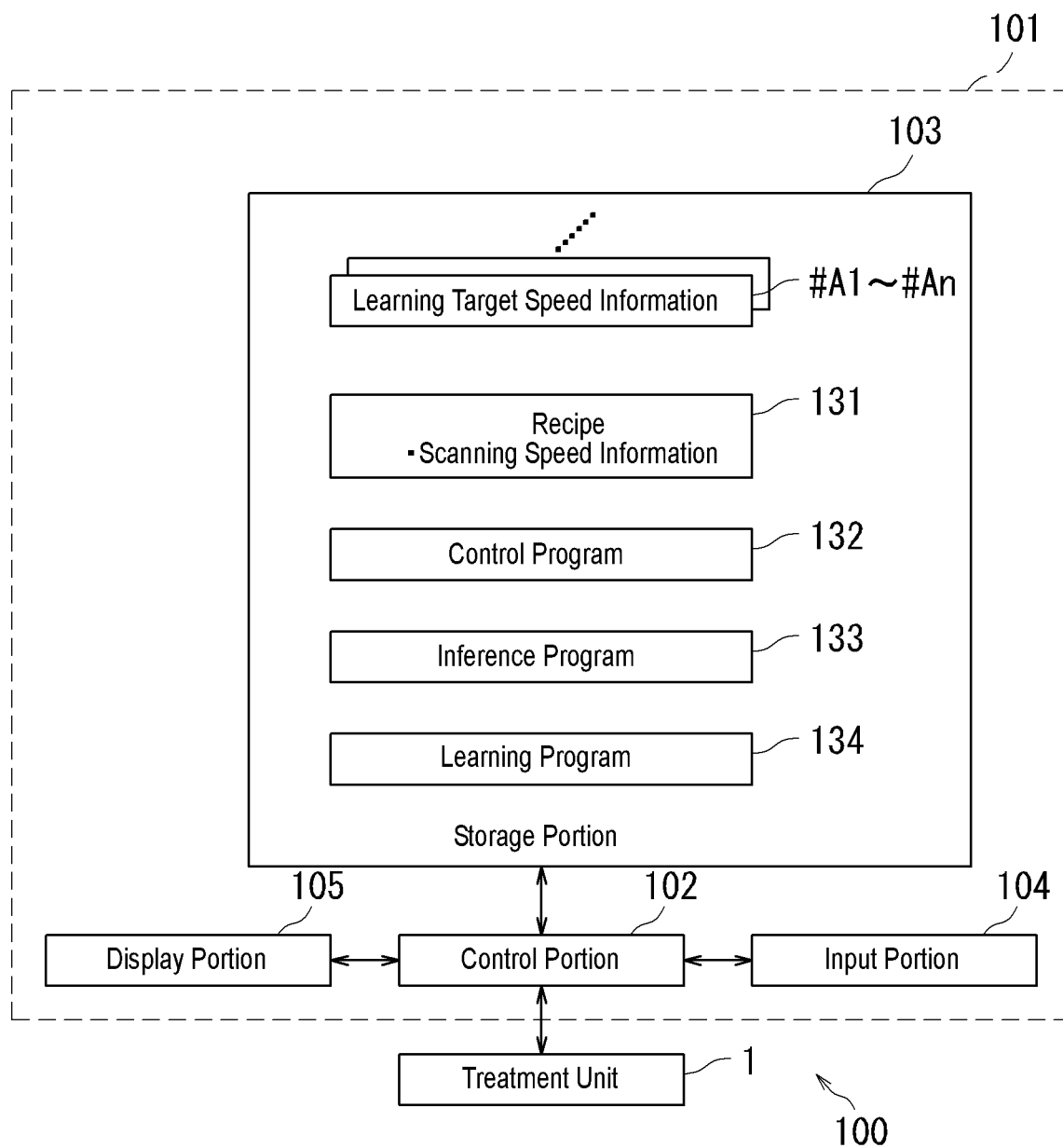
FIG. 8 is a block diagram of a control device according to the first embodiment.

Next, the control device 101 will be described with reference to FIG. 8. FIG. 8 is a block diagram of the control device 101 according to the present embodiment. Specifically, FIG. 8 illustrates the control device 101 before execution of the machine learning. As illustrated in FIG. 8, the control device 101 has a control portion 102, a storage portion 103, an input portion 104, and a display portion 105.

The control portion 102 has a processor. The control portion 102 has a central processing unit (CPU) or a micro processing unit (MPU), for example. Alternatively, the control portion 102 has a general-purpose computing machine. The control portion 102 may further have a neural network processing unit (NCU).

The storage portion 103 stores data and a computer program. The storage portion 103 has a main storage device. The main storage device is, for example, a semiconductor memory. The storage portion 103 may further have an auxiliary storage device. The auxiliary storage device is, for example, a semiconductor memory and/or a hard disk drive. The storage portion 103 may have a removable medium. The control portion 102 controls operations of each component of the substrate treatment apparatus 100 on the basis of the data and the computer program stored in the storage portion 103. Further, the control portion 102 executes machine learning and additional learning on the basis of the data and the computer program stored in the storage portion 103.

Specifically, the storage portion 103 stores the recipe 131, a control program 132, an inference program 133, and a learning program 134. The recipe 131 defines details and a procedure of the treatment on the substrate W. Also, the recipe 131 indicates various setting values. For example, the recipe 131 indicates the scanning speed information described above with reference to FIG. 4.

The control portion 102 controls operations of each component of the substrate treatment apparatus 100 on the basis of the recipe 131 and the control program 132. The inference program 133 is used to generate a learned model described with reference to FIG. 15. The learning program 134 is a program for executing an algorithm for finding a specific rule in a learning data set and generating a model (learned model) that expresses the rule.

The storage portion 103 stores learning target speed information #A1 to #An when the machine learning is executed. Here, "n" is a positive integer. The learning target speed information #A1 to #An indicates scanning speed information similarly to the scanning speed information described above with reference to FIG. 4. The learning target speed information #A1 to #An includes mutually different details for sets of scanning speeds set for the speed setting positions described above with reference to FIG. 4.

The input portion 104 receives an input from an operator and outputs information indicating an input result to the control portion 102. For example, the input portion 104 receives inputs of the learning target speed information #A1 to #An. The input portion 104 includes, for example, a touch panel and a pointing device. The touch panel is disposed on a display surface of the display portion 105, for example. The input portion 104 and the display portion 105 configure a graphical user interface, for example.

The display portion 105 displays various kinds of information. In the present embodiment, the display portion 105 displays various error screens and various setting screens (input screens), for example. The display portion 105 has, for example, a liquid crystal display or an organic electroluminescence (EL) display.

Note that the control device 101 may have an interface that acquires the learning target speed information #A1 to #An from a removable memory. The removable memory includes, for example, a universal serial bus (USB). Alternatively, the control device 101 may have a drive that acquires the learning target speed information #A1 to #An from the removable medium. The removable medium includes an optical disc such as a compact disc (CD), for example.

Figure 9:
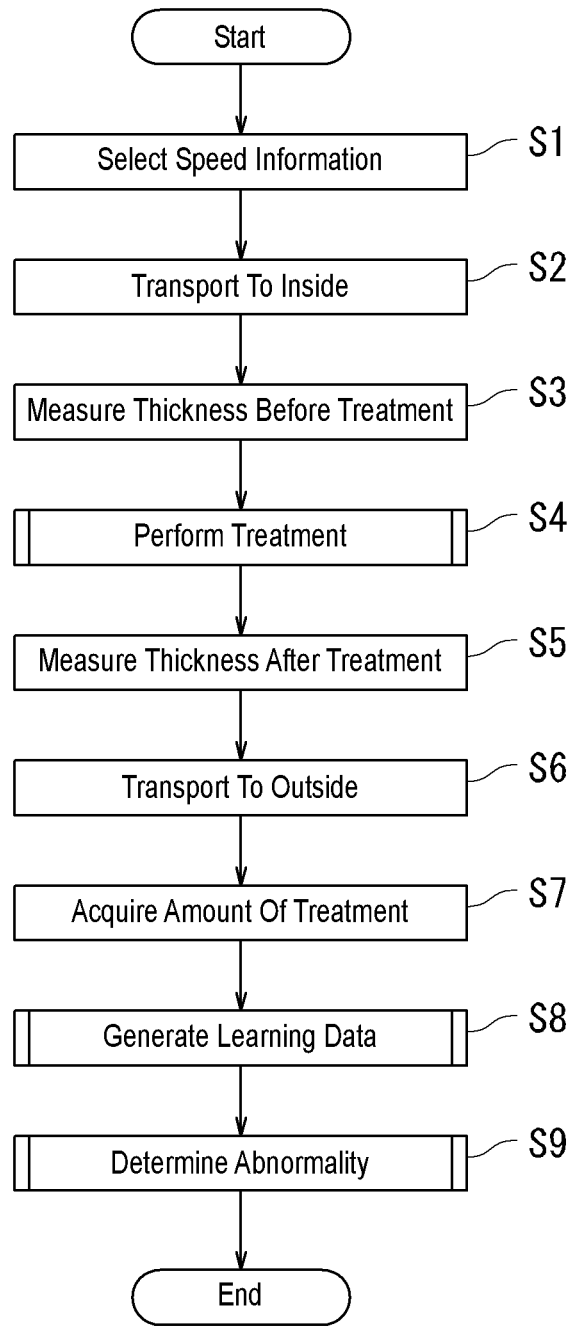
FIG. 9 is a flowchart illustrating a learning data generation method according to the first embodiment.

Next, a learning data generation method executed by the substrate treatment apparatus 100 will be described with reference to FIGS. 1, 2, 8, and 9. FIG. 9 is a flowchart illustrating the learning data generation method according to the present embodiment. Specifically, FIG. 9 illustrates a process executed by the control portion 102 when the learning data is generated. The learning data generation method in the present embodiment includes each of processes in Steps S1 to S9.

The process illustrated in FIG. 9 is started by the operator operating the input portion 104. When the learning data (learning data set) is generated, a plurality of substrates W that are learning targets are accommodated in at least one of the plurality of load ports LP. Note that as the substrates W that are the learning targets, the substrates W of the same type as the substrates W used when semiconductor products are manufactured are used.

In a case in which the learning data (learning data set) is generated, the control portion 102 selects, as a treatment unit 1 that is a learning target, one of the plurality of treatment units 1 first. Note that the process described with reference to FIG. 9 is executed in order on the plurality of treatment units 1 included in the substrate treatment apparatus 100.

The control portion 102 determines the treatment unit 1 that is the learning target, then selects one of the pieces of learning target speed information #A1 to #An, and acquires one of the pieces of learning target speed information #A1 to #An (Step S1). Hereinafter, one of the pieces of learning target speed information #A1 to #An will be referred to as "learning target speed information #A". For example, the control portion 102 selects the learning target speed information #A in an ascending order of identification numbers applied to the learning target speed information #A1 to #An.

The control portion 102 selects one of the pieces of learning target speed information #A1 to #An and then controls the indexer robot IR and the center robot CR such that the substrate W that is the learning target is transported to the inside of the chamber 2 of the treatment unit 1 that is the learning target (Step S2). The control portion 102 causes the spin chuck 3 to hold the substrate W that is the learning target and has been transported to the inside of the chamber 2.

If the substrate W that is the learning target is held by the spin chuck 3, then the control portion 102 causes the thickness measurement portion 8 to measure thickness distribution of the target object TG included in the substrate W that is the learning target (Step S3). The thickness distribution of the target object TG measured here indicates the thickness distribution of the target object TG before the etching treatment. Hereinafter, the thickness distribution of the target object TG before the etching treatment may be referred to as "thickness distribution before the treatment".

After the measurement of the thickness distribution before the treatment, the control portion 102 controls operations of each component of the substrate treatment apparatus 100 such that the etching treatment is executed on the substrate W that is the learning target (Step S4). Specifically, the control portion 102 controls operations of each component of the substrate treatment apparatus 100 such that the etching solution is supplied from the first nozzle 41 to the substrate W that is the learning target with the first nozzle 41 moving (turning) at a speed based on the learning target speed information #A, thereby executing the etching treatment on the substrate W that is the learning target as described above with reference to FIGS. 3 to 5.

The control portion 102 causes the thickness measurement portion 8 to measure the thickness distribution of the target object TG included in the substrate W that is the learning target after the execution of the etching treatment (Step S5). The thickness distribution of the target object TG measured here indicates the thickness distribution of the target object TG after the etching treatment. Hereinafter, the thickness distribution of the target object TG after the etching treatment may be described as "thickness distribution after the treatment". Note that as will be described with reference to FIG. 10, the thickness distribution after the treatment indicates thickness distribution after a drying treatment.

After the measurement of the thickness distribution after the treatment, the control portion 102 releases the holding of the substrate W that is the learning target achieved by the spin chuck 3 and causes the indexer robot IR to transport the substrate W that is the learning target out of the chamber 2 (Step S6). Thereafter, the control portion 102 controls the indexer robot IR and the center robot CR such that the substrate W that is the learning target is transported up to one of the plurality of load ports LP.

Next, the control portion 102 acquires the amount of treatment (the amount of etching) (Step S7). Specifically, the control portion 102 calculates a difference between the thickness distribution before the treatment and the thickness distribution after the treatment to acquire the amount of etching.

The control portion 102 acquires the amount of treatment (the amount of etching) and then generates learning data on the basis of the learning target speed information #A and the amount of treatment (the amount of etching) (Step S8). The learning data indicates the learning target speed information #A and the amount of treatment (the amount of etching). The learning data is stored in the storage portion 103.

The control portion 102 generates the learning data, then determines whether abnormality has occurred in the substrate treatment apparatus 100 (Step S9), and ends the treatment illustrated in FIG. 9. For example, the control portion 102 determines whether or not at least one of the rotation speed of the substrate W, the temperature of the etching solution, the concentration of the etching solution, and the flow amount of the ejected etching solution indicates an abnormal value as described above with reference to FIGS. 2 and 7.

The control portion 102 repeatedly executes the treatment illustrated in FIG. 9 until all the pieces of the learning target speed information #A1 to #An are selected. As a result, a learning data set is generated. The learning data set includes a plurality of pieces of learning data. The learning data set is stored in the storage portion 103. Note that at least one of the processes in Steps S7 to S9 may be executed between the process in Step S5 and the process in Step S6.

Figure 10:
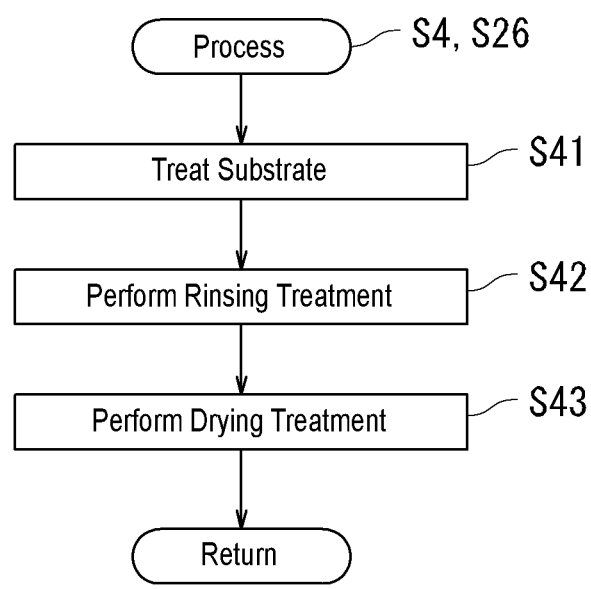
FIG. 10 is a flowchart illustrating an etching treatment according to the first embodiment.

Next, the etching treatment (Step S4) will be described with reference to FIGS. 2, 8 and 10. FIG. 10 is a flowchart illustrating the etching treatment according to the present embodiment.

As illustrated in FIG. 10, the spin chuck 3 holds the substrate W that is the learning target, and the substrate W that is the learning target is then treated (Step S41). Specifically, the control portion 102 causes the spin motor portion 5 to rotate the substrate W held by the spin chuck 3. Thereafter, the control portion 102 controls the nozzle moving mechanism 6 and the etching solution supply portion 4 such that the etching solution is supplied from the first nozzle 41 toward the substrate W that is the learning target as described above with reference to FIG. 9. As a result, the substrate W that is the learning target is etched.

If the etching of the substrate W that is the learning target is completed, then the control portion 102 controls the rinsing solution supply portion 7 and supplies the rinsing solution to the substrate W that is the learning target, thereby removing the etching solution from the substrate W that is the learning target (Step S42). Specifically, the etching solution is pushed and caused to flow to the outside of the substrate W that is the learning target with the rinsing solution and is then discharged to the surroundings of the substrate W that is the learning target. As a result, a liquid film of the rinsing solution on the substrate W that is the learning target is replaced with a liquid film of the rinsing solution.

After the etching solution is replaced with the rinsing solution, the control portion 102 controls the spin motor portion 5 such that the substrate W that is the learning target is dried (Step S43). As a result, the treatment illustrated in FIG. 10 is ended. Specifically, the control portion 102 increases the rotation speed of the substrate W that is the learning target as compared with the rotation speed during the etching treatment and the rinsing treatment. As a result, a large centrifugal force is applied to the rinsing solution on the substrate W that is the learning target, and the rinsing solution adhering to the substrate W that is the learning target is shaken and removed to the surroundings of the substrate W that is the learning target. In this manner, the rinsing solution is removed from the substrate W that is the learning target, and the substrate W that is the learning target is dried. Note that the control portion 102 causes the spin motor portion 5 to stop the rotation of the substrate W after a predetermined period of time elapses from the start of high-speed rotation of the substrate W that is the learning target, for example.

Figure 11:
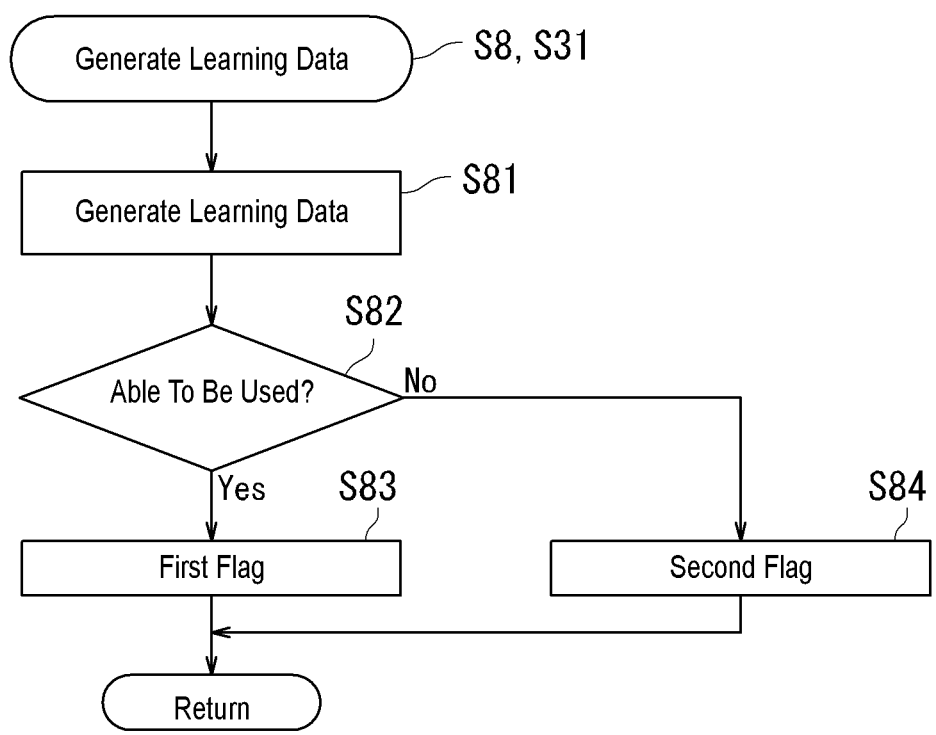
FIG. 11 is a flowchart illustrating a learning data generation process according to the first embodiment.

Next, a process of generating learning data (Step S8) will be described with reference to FIGS. 2, 8, and 11. FIG. 11 is a flowchart illustrating a learning data generation process according to the present embodiment.

As illustrated in FIG. 11, the control portion 102 generates learning data using the learning target speed information #A and the amount of treatment (the amount of etching) (Step S81). The control portion 102 determines whether or not the generated learning data (the amount of treatment) is able to be used for machine learning (Step S82).

Specifically, the control portion 102 determines whether or not the amount of processing (the amount of etching) is equal to or greater than a defined value. In a case in which the amount of treatment (the amount of etching) is not equal to or greater than the defined value, the control portion 102 determines that the learning data (the amount of treatment) is able to be used for machine learning. On the other hand, in a case in which the amount of treatment (the amount of etching) is equal to or greater than the defined value, the control portion 102 determines that the learning data (the amount of treatment) is not able to be used for machine learning. For example, the control portion 102 determines that the learning data (the amount of treatment) is not able to be used for machine learning in a case in which the amount of treatment is equal to or greater than the defined value at least one location in the distribution of the amount of treatment (the amount of etching).

Note that the control portion 102 may determine that the learning data (the amount of treatment) is not able to be used for machine learning in a case in which the amount of treatment is equal to or greater than the defined value at a plurality of locations in the distribution of the amount of treatment (the amount of etching) or may determine that the learning data (the amount of treatment) is not able to be used for machine learning when a range in which the amount of treatment (the amount of etching) is equal to or greater than the defined value is equal to or greater than a range set in advance.

If the control portion 102 determines that the learning data (the amount of treatment) is able to be used for machine learning (Yes in Step S82), then the control portion 102 applies a first flag to the learning data (Step S83) and ends the process illustrated in FIG. 11. Specifically, the control portion 102 causes the storage portion 103 to store the learning data and the first flag in an associated manner. The first flag indicates that the learning data is to be used.

On the other hand, if the control portion 102 determines that the learning data (the amount of treatment) is not able to be used for machine learning (No in Step S82), then the control portion 102 applies a second flag to the learning data (Step S84) and ends the process illustrated in FIG. 11. Specifically, the control portion 102 causes the storage portion 103 to store the learning data and the second flag in an associated manner. The second flag indicates that the learning data is not to be used. Therefore, the learning data to which the second flag is applied is removed from the learning data set for the machine learning.

Figure 12:
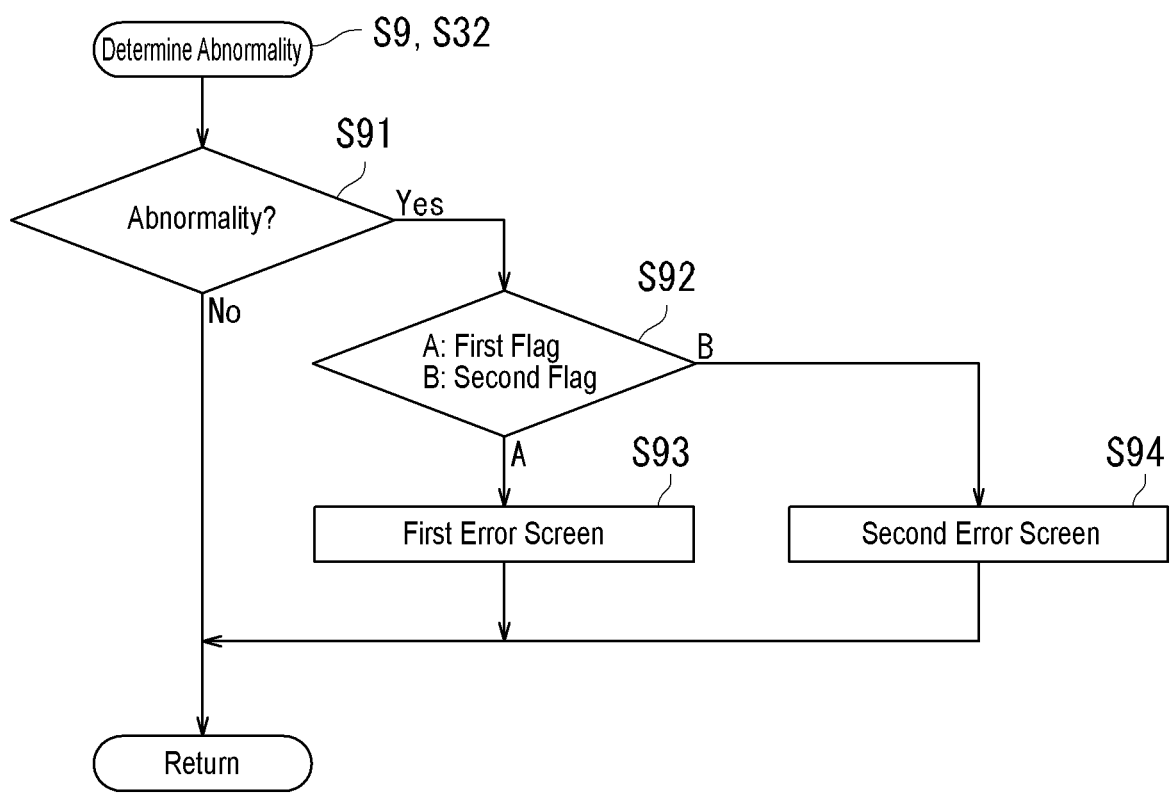
FIG. 12 is a flowchart illustrating an abnormality determination process according to the first embodiment.

Next, an abnormality determination process (Step S9) to determine whether or not abnormality has occurred in the substrate treatment apparatus 100 will be described with reference to FIGS. 2, 8, and 12. FIG. 12 is a flowchart illustrating the abnormality determination process according to the present embodiment.

As illustrated in FIG. 12, the control portion 102 determines whether or not abnormality has occurred in the substrate treatment apparatus 100 (Step S91). In a case in which the control portion 102 determines that no abnormality has occurred in the substrate treatment apparatus 100 (No in Step S91), the control portion 102 ends the process illustrated in FIG. 12.

On the other hand, in a case in which the control portion 102 determines that abnormality has occurred in the substrate treatment apparatus 100 (Yes in Step S91), the control portion 102 executes a different error report in accordance with whether or not the learning data (the amount of treatment) is able to be used for the machine learning. In the present embodiment, the control portion 102 determines whether the first flag has been associated with the learning data or whether the second flag has been associated therewith (Step S92).

In a case in which the first flag has been associated with the learning data (A in Step S92), the control portion 102 causes the display portion 105 to display a first error screen (Step S93) and ends the process illustrated in FIG. 12. The first error screen indicates that abnormality has occurred in the substrate treatment apparatus 100. Specifically, the first error screen indicates a measurement target (monitoring target) where abnormality has occurred.

In a case in which the second flag has been associated with the learning data (B in Step S92), the control portion 102 causes the display portion 105 to display a second error screen (Step S94) and ends the process illustrated in FIG. 12. The second error screen indicates that the amount of treatment (the amount of etching) is equal to or greater than the defined value, in response to the occurrence of abnormality in the substrate treatment apparatus 100. Therefore, the second error screen can notify the operator of a probability that a reason that the amount of treatment (the amount of etching) is equal to or greater than the defined value is caused on the side of the substrate treatment apparatus 100 rather than the side of the substrate W that is the learning target.

Next, a learning data set table TB10 for managing the learning data set will be described with reference to FIG. 13. FIG. 13 is a diagram illustrating an example of the learning data set table TB10 according to the present embodiment.

In the present embodiment, the control portion 102 causes the storage portion 103 to store the learning data in the form of a table. As illustrated in FIG. 13, the learning data set table TB10 has a speed information field TB11, a treatment amount field TB12, and a flag field TB13.

The learning target speed information #A is stored in the speed information field TB11. The amount of treatment (the amount of etching) is stored in the treatment amount field TB12. The flag is stored in the flag field TB13. As illustrated in FIG. 13, the learning target speed information #A, the amount of treatment (the amount of etching), and the flag are stored in the learning data set table TB10 in a mutually associated manner.

Note that in the flag field TB13, "OK" indicates the first flag while "NG" indicates the second flag. In other words, "OK" indicates that the corresponding learning data is able to be used for the machine learning while "NG" indicates that the corresponding learning data is not able to be used for the machine learning.

Figure 14:
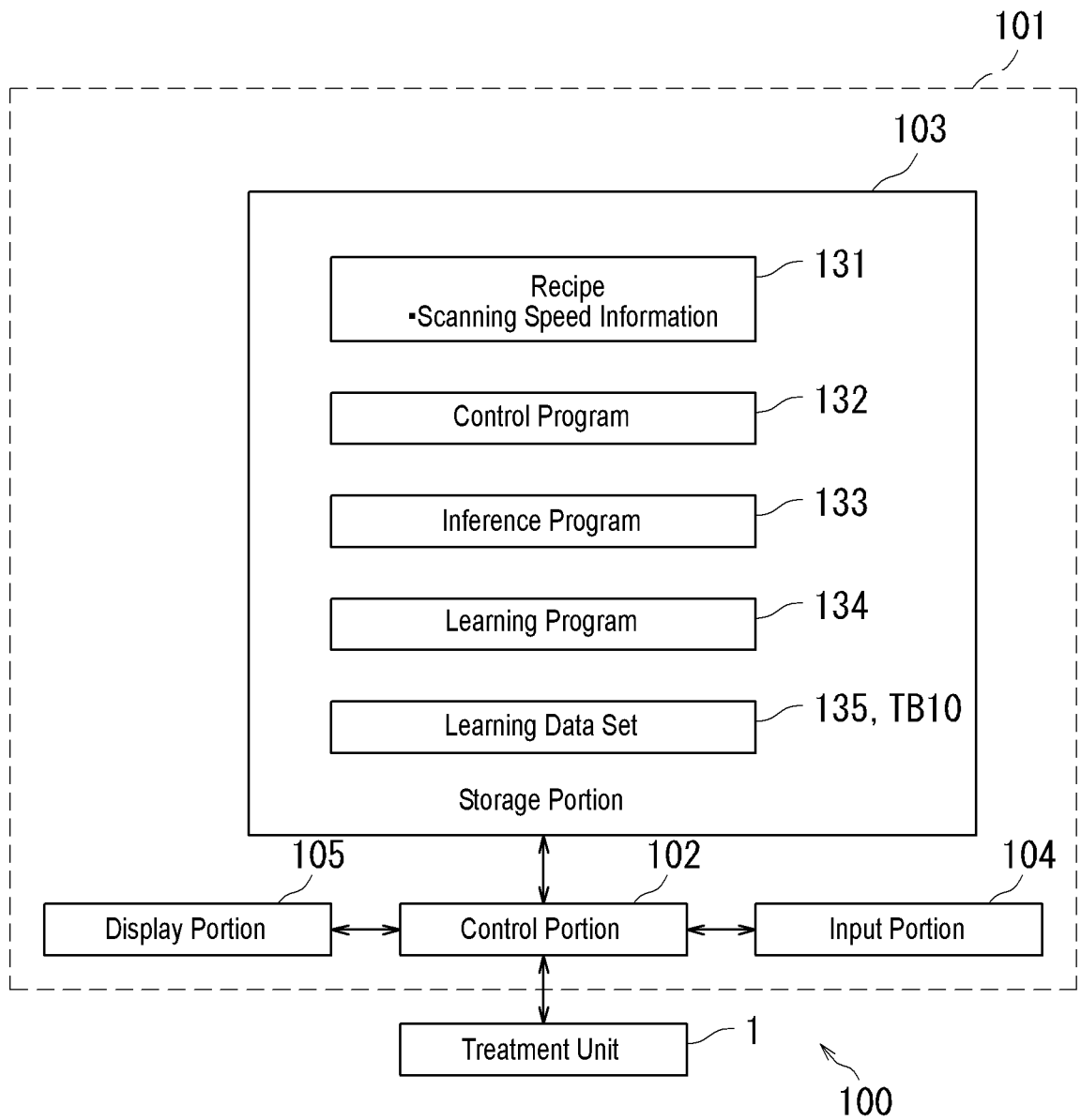
FIG. 14 is a block diagram of the control device according to the first embodiment.

Next, the control device 101 after generation of the learning data set 135 will be described with reference to FIG. 14. FIG. 14 is a block diagram of the control device 101 according to the present embodiment. Specifically, FIG. 14 illustrates the control device 101 after generation of the learning data set 135.

As illustrated in FIG. 14, the storage portion 103 stores the learning data set 135. The learning data set 135 includes a plurality of pieces of learning data. Specifically, the control portion 102 stores the plurality of pieces of learning data in the learning data set table TB10 as described above with reference to FIG. 13. Note that after the generation of the learning data set 135, the control portion 102 may or may not delete the learning target speed information #A1 to #An from the storage portion 103.

The control portion 102 learns the learning data set 135 (the plurality of pieces of learning data) and generates a learned parameter. The control portion 102 generates a learned model on the basis of the learned parameter.

Figure 15:
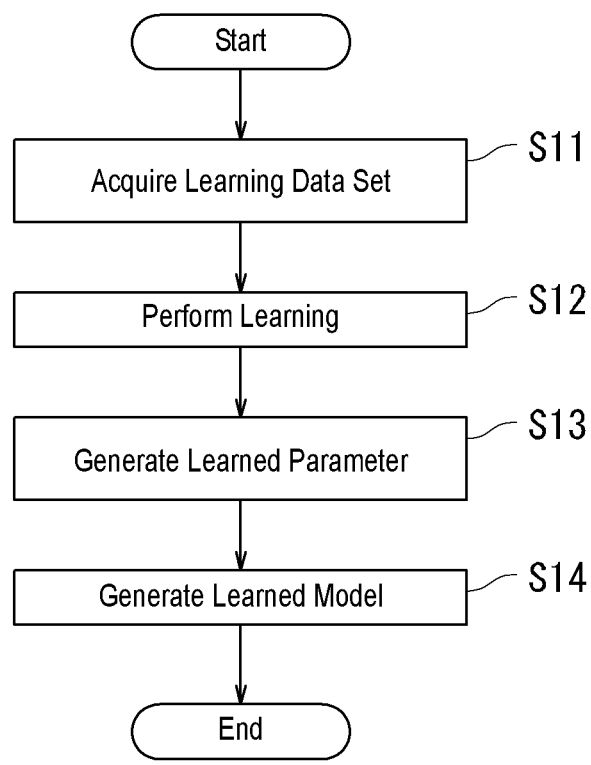
FIG. 15 is a flowchart illustrating a learned model generation method according to the first embodiment.

Next, a learned model generation method executed by the substrate treatment apparatus 100 will be described with reference to FIGS. 1, 2, 13, 14, and 15. FIG. 15 is a flowchart illustrating the learned model generation method according to the present embodiment. Specifically, FIG. 15 illustrates a process executed by the control portion 102 when the learned model is generated. The learned model generation method according to the present embodiment includes each of processes in Steps S11 to S14.

First, the control portion 102 acquires the learning data set 135 from the storage portion 103 (Step S11). At this time, the control portion 102 acquires learning data with the first flag applied thereto from among the plurality of pieces of learning data.

The control portion 102 acquires the learning data set 135 and then learns the learning data set 135 (the plurality of pieces of learning data) on the basis of the learning program 134 (Step S12). Here, the learning means that a specific rule is discovered in the learning data set 135. In the present embodiment, the learning data indicates a relationship between the scanning speed information (a scanning speed at each speed setting position) and the amount of treatment (the amount of etching). The control portion 102 learns the learning data set 135 and discovers the specific rule between the scanning speed information and the amount of treatment (the amount of etching).

The control portion 102 learns the learning data set 135, thereby generating a learned parameter (Step S13). More specifically, the learned parameter is outputted from the learning program 134. The learned parameter is a parameter (coefficient) acquired on the basis of the result of the learning using the learning data set 135.

Next, the control portion 102 generates a learned model on the basis of the acquired learned parameter (Step S14). As a result, the process illustrated in FIG. 15 is ended. Specifically, the control portion 102 generates the learned model by incorporating the learned parameter in the inference program 133. The inference program 133 is a program that outputs a specific result in response to an input by applying the incorporated learned parameter, and the learned model is a model including the learned parameter. In the present embodiment, the "input" is the target amount of the amount of treatment (the amount of etching), and the "output" is scanning speed information. In other words, the target amount of the amount of treatment (the amount of etching) is an explanatory variable, and the scanning speed information outputted from the learned model is an objective variable. Hereinafter, the target amount of the amount of treatment (the amount of etching) may be referred to as a "target treatment amount" or a "target etching amount". Also, the scanning speed information outputted from the learned model may be referred to as "speed information at the time of treatment".

Figure 16:
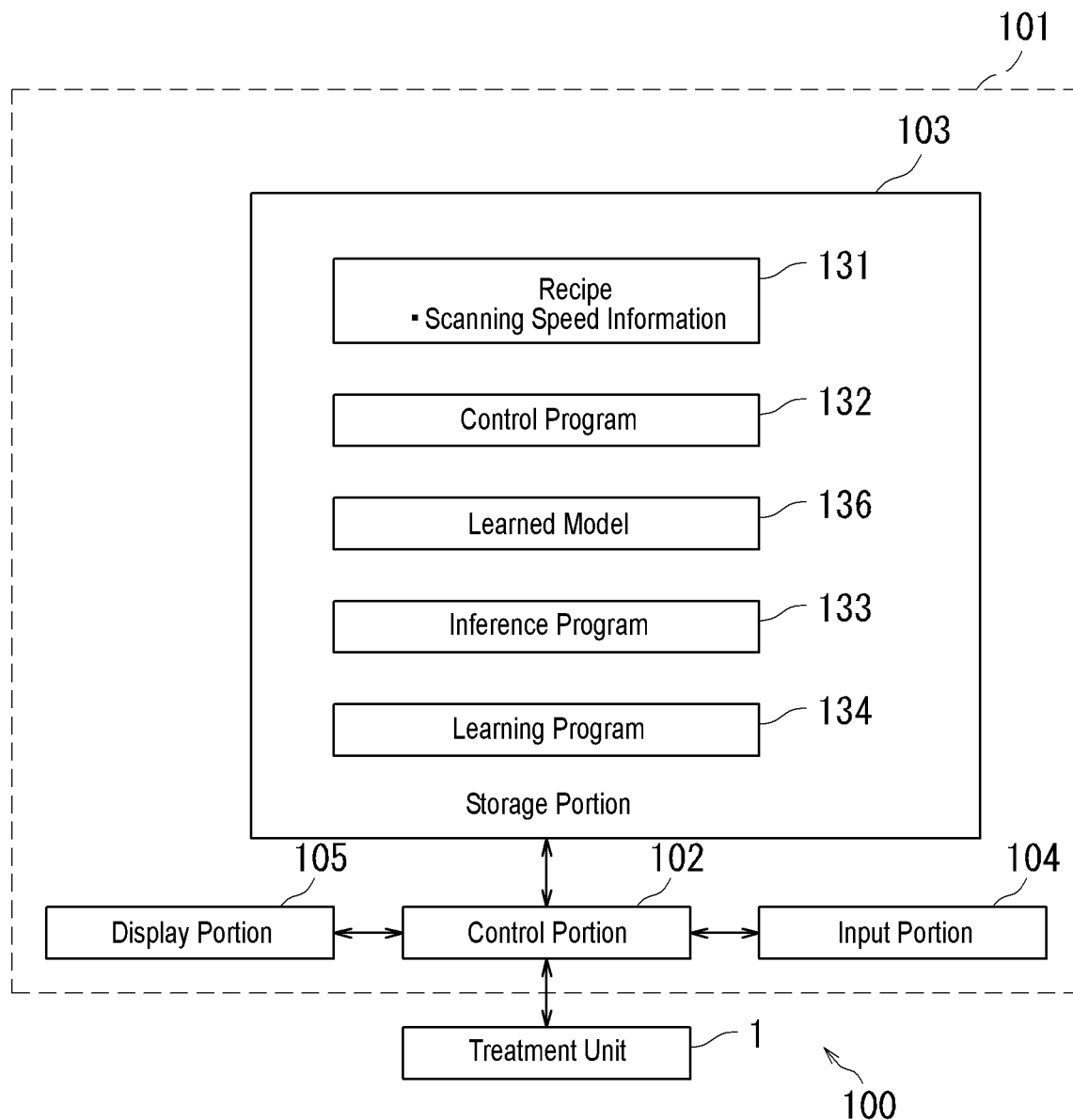
FIG. 16 is a block diagram of the control device according to the first embodiment.

Next, the control device 101 when a semiconductor product is manufactured will be described with reference to FIGS. 2 and 16. FIG. 16 is a block diagram of the control device 101 according to the present embodiment. Specifically, FIG. 16 is the control device 101 when the semiconductor product is manufactured.

As illustrated in FIG. 16, the storage portion 103 stores the learned model 136 when the semiconductor product is manufactured. Note that after the generation of the learned model 136, the control portion 102 may or may not delete the learning data set 135 from the storage portion 103.

The control portion 102 controls the nozzle moving mechanism 6 on the basis of the learned model 136 when the semiconductor product is manufactured. Specifically, the control portion 102 causes speed information at the time of treatment that is an objective variable to be outputted from the learned model 136 by inputting a target treatment amount (target etching amount) that is an explanatory variable to the learned model 136. The control portion 102 controls the nozzle moving mechanism 6 such that the first nozzle 41 moves at a speed based on the speed information at the time of treatment when the semiconductor product is manufactured. Specifically, the first nozzle 41 moves (is turned) at the speed based on the speed information at the time of treatment when the treatment (etching) is executed on the substrate W. Note that in the following description, the substrate W treated when the semiconductor product is manufactured may be referred to as a "substrate W that is a treatment target".

Figure 17:
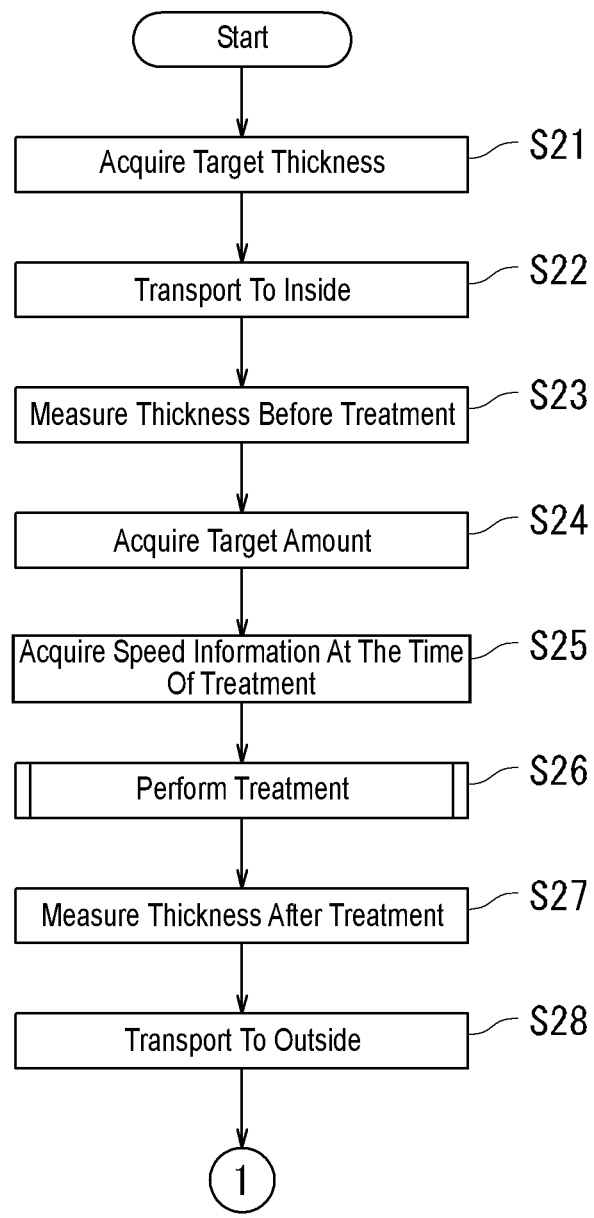
FIG. 17 is a flowchart illustrating a substrate treatment method according to the first embodiment.
Figure 18:
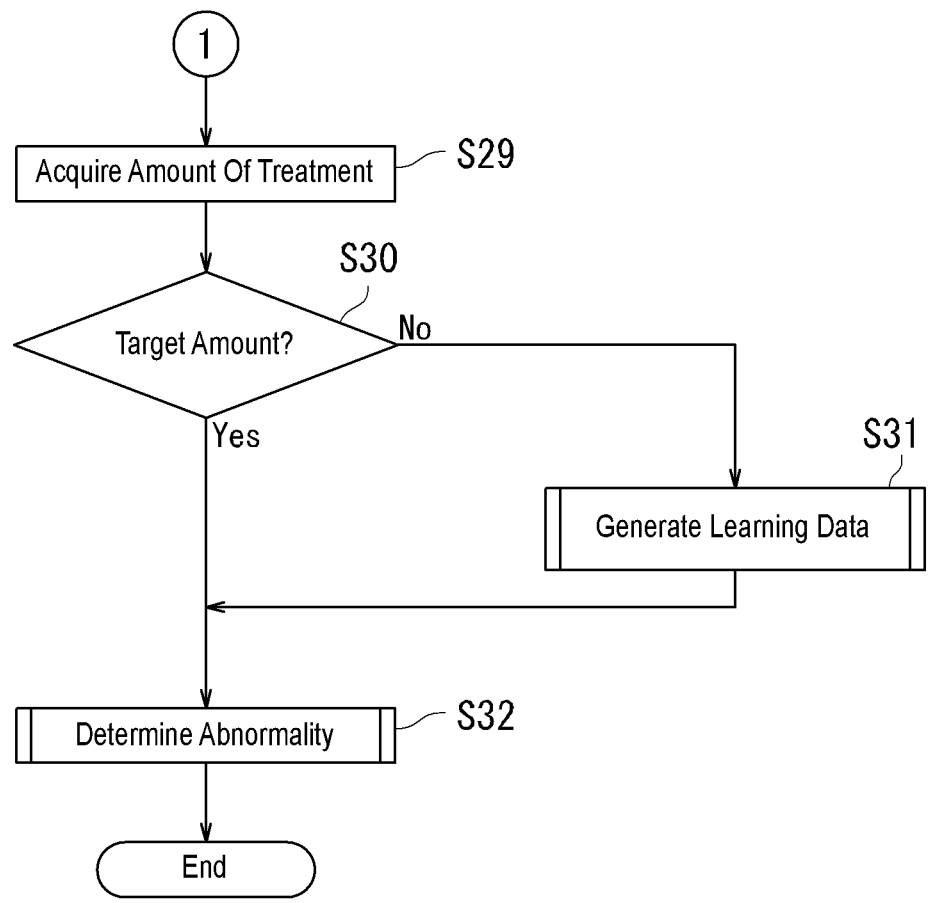
FIG. 18 is a flowchart illustrating the substrate treatment method according to the first embodiment.

Next, a substrate treatment method executed by the substrate treatment apparatus 100 will be described with reference to FIGS. 1, 2, 16, 17, and 18. FIGS. 17 and 18 are flowcharts illustrating the substrate treatment method according to the present embodiment. Specifically, FIGS. 17 and 18 illustrate the process executed by the control portion 102 when the substrate W that is the treatment target is etched. The substrate treatment method in the present embodiment includes processes in Steps S21 to S32.

The process illustrated in FIGS. 17 and 18 is started by the operator operating the input portion 104. A plurality of substrate W that are treatment targets are accommodated in at least one of the plurality of load ports LP.

In a case in which each substrate W that is the treatment target is etched, the control portion 102 acquires a target thickness of the target object TG first (Step S21). Specifically, the control portion 102 acquires target thickness distribution of the target object TG. The target thickness is inputted to the control portion 102 by the operator operating the input portion 104.

The control portion 102 acquires the target thickness and then controls the indexer robot IR and the center robot CR such that the substrate W that is the treatment target is transported to the inside of the chamber 2 of one of the plurality of treatment units 1 (Step S22). The control portion 102 causes the spin chuck 3 to hold the substrate W that is the treatment target and has been transported to the inside of the chamber 2.

If the substrate W that is the treatment target is held by the spin chuck 3, then the control portion 102 causes the thickness measurement portion 8 to measure the thickness distribution of the target object TG included in the substrate W that is the treatment target (Step S23). In other words, the thickness distribution before the treatment is measured.

Next, the control portion 102 acquires the target treatment amount (target etching amount) that is an explanatory variable on the basis of the thickness distribution before the treatment and the target thickness distribution (Step S24). Specifically, the control portion 102 calculates a difference between the thickness distribution before the treatment and the target thickness distribution and acquires the target treatment amount (target etching amount).

Next, the control portion 102 acquires speed information at the time of treatment that is an objective variable by inputting the target treatment amount (target etching amount) to the learned model 136 and causing the speed information at the time of treatment to be outputted from the learned model 136 (Step S25).

If the speed information at the time of treatment is acquired, then the control portion 102 controls operations of each component of the substrate treatment apparatus 100 such that the etching treatment is executed on the substrate W that is the treatment target (Step S26). Specifically, the control portion 102 controls operations of each component of the substrate treatment apparatus 100 such that the etching solution is supplied from the first nozzle 41 to the substrate W that is the treatment target with the first nozzle 41 moving (being turned) at the speed based on the speed information at the time of treatment, thereby executing the etching treatment on the substrate W that is the treatment target, as described above with reference to FIGS. 3 to 5. More specifically, the substrate W that is the treatment target is etched through a process similar to that described above with reference to FIG. 10.

The control portion 102 causes the thickness measurement portion 8 to measure thickness distribution of the target object TG included in the substrate W of the treatment target after execution of the etching treatment (Step S27). In other words, the thickness distribution after the treatment is measured.

After the measurement of the thickness distribution after the treatment, the control portion 102 releases the holding of the substrate W that is the treatment target achieved by the spin chuck 3 and causes the indexer robot IR to transport the substrate W that is the treatment target out of the chamber 2 (Step S28). Thereafter, the control portion 102 controls the indexer robot IR and the center robot CR such that the substrate W that is the treatment target is transported up to one of the plurality of load ports LP.

If the substrate W that is the treatment target is transported, then the control portion 102 acquires the amount of treatment (the amount of etching) as illustrated in FIG. 18 (Step S29). Specifically, the control portion 102 calculates a difference between the thickness distribution before the treatment and the thickness distribution after the treatment and acquires the amount of etching.

If the control portion 102 acquires the amount of treatment (the amount of etching), then the control portion 102 determines whether or not the amount of treatment (the amount of etching) conforms to the target treatment amount (target etching amount) (Step S30).

In a case in which the control portion 102 determines that the amount of treatment (the amount of etching) does not conform to the target treatment amount (target etching amount) (No in Step S30), the process proceeds to Step S31. In a case in which the control portion 102 determines that the amount of treatment (the amount of etching) conforms to the target treatment amount (target etching amount) (Yes in Step S30), the process proceeds to Step S32. Note that the control portion 102 may determine whether or not the amount of treatment (the amount of etching) conforms to the target treatment amount (target etching amount) within an allowable range.

In Step S31, the control portion 102 generates learning data for additional learning on the basis of the speed information at the time of treatment and the amount of treatment (the amount of etching). Specifically, the learning data for additional learning is generated through a process similar to that described above with reference to FIG. 11. If the learning data for additional learning is generated, then the process proceeds to Step S32.

In Step S32, the control portion 102 determines whether or not abnormality has occurred in the substrate treatment apparatus 100 (Step S32) and ends the process illustrated in FIGS. 17 and 18. Specifically, determination on whether or not abnormality has occurred in the substrate treatment apparatus 100 is made through the process similar to that described above with reference to FIG. 12.

The control portion 102 repeatedly executes the process in FIGS. 17 and 18 when the semiconductor product is manufactured. As a result, a learning data set for additional learning is generated. The learning data set for additional learning is stored in the storage portion 103. Note that at least one of the processes in Steps S29 to S32 may be executed between Step S26 and Step S27. Hereinafter, the learning data set for additional learning may be referred to as an "additional learning data set". Also, the learning data for additional learning may be referred to as "additional learning data".

Next, an additional learning data set table TB20 for managing the additional learning data set will be described with reference to FIG. 19. FIG. 19 is a diagram illustrating an example of the additional learning data set table TB20 according to the present embodiment.

In the present embodiment, the control portion 102 causes the storage portion 103 to store the additional learning data in the form of a table. As illustrated in FIG. 19, the additional learning data set table TB20 has a speed information field TB21, a treatment amount field TB22, and a flag field TB23.

Speed information at the time of treatment #B is stored in the speed information field TB21. The amount of treatment (the amount of etching) is stored in the treatment amount field TB22. A flag is stored in the flag field TB23 similarly to the flag field TB13 described above with reference to FIG. 13. As illustrated in FIG. 19, the speed information at the time of treatment #B, the amount of treatment (the amount of etching), and the flag are stored in the additional learning data set table TB20 in a mutually associated manner.

If the additional learning data set is generated, then the control portion 102 generates a learned model in a manner similarly to that when the machine learning is executed. Hereinafter, a method for generating the learned model after additional learning will be described with reference to FIG. 15.

First, the control portion 102 acquires the additional learning data set from the storage portion 103 (Step S11). At this time, the control portion 102 acquires the additional learning data with the first flag applied thereto from a plurality of pieces of additional learning data.

If the control portion 102 acquires the additional learning data set, then the control portion 102 learns the additional learning data set (a plurality of pieces of additional learning data) on the basis of the learning program 134 (Step S12).

The control portion 102 generates a new learned parameter by learning the additional learning data set (Step S13). More specifically, the new learned parameter is outputted from the learning program 134.

Next, the control portion 102 generates a learned model after additional learning on the basis of the new learned parameter (Step S14). As a result, the process illustrated in FIG. 15 is ended. Specifically, the control portion 102 generates the learned model after additional learning by incorporating the new learned parameter in the inference program 133.

The first embodiment has been described hitherto with reference to FIGS. 1 to 19. According to the present embodiment, it is possible to reduce a burden on the operator who is involved in development of the scanning speed information. Specifically, it is not necessary for the operator to newly develop the scanning speed information even if the pre-treatment is changed in the stage of manufacturing the semiconductor product, by generating the learned model 136 using various substrates W that are the learning targets for which different pre-treatments are to be performed.

Also, according to the present embodiment, the learned model 136 outputs the scanning speed information for setting the thickness of the target object TG after the treatment to the target thickness even if there are variations in thickness of the target object TG before the treatment. Therefore, it is not necessary to develop multiple pieces of scanning speed information in accordance with variations in thickness of the target object TG before the treatment. Also, even if there are variations in thickness of the target object TG before the treatment, it is possible to stably set the thickness distribution after the treatment to the target thickness distribution. For example, it is possible to set the surface of the substrate W to be substantially parallel to the horizontal surface. Alternatively, it is possible to set the thickness in a specific region of the target object TG to the target thickness.

In addition, according to the present embodiment, the substrate treatment apparatus 100 executes additional learning even if an error that the thickness of the target object TG after the treatment is not the target thickness occurs when the semiconductor product is manufactured, the learned parameter is thus adjusted after the occurrence of the error and during the manufacturing of the semiconductor product, and it is possible to set the thickness after the treatment to the target thickness. Also, since the substrate treatment apparatus 100 executes the additional learning, it is not necessary for the operator to develop new scanning speed information in accordance with the occurrence of the error. Further, even if the pre-treatment is changed, the learned parameter is adjusted through the additional learning, and it is thus not necessary for the operator to develop new scanning speed information.

Note that although factors that affect the amount of treatment (the amount of etching) include, for example, the rotation speed of the substrate W, the temperature of the treatment solution, the concentration of the treatment solution, and the flow amount of ejected treatment solution as well as the scanning speed, the control portion 102 does not actively perform a process (control) for changing the values of these other factors when the learning data for machine learning is generated and when the substrate W that is the treatment target is treated. In other words, the control portion 102 adjusts the scanning speed such that the amount of treatment is set to the target value and does not adjust (change) the values of these other factors. Thus, the values of these other factors indicate substantially the same values when the learning data is generated and when the substrate W that is the treatment target is treated, except for the time during which abnormality occurs. In the present embodiment, the speed information at the time of treatment is selected as the objective variable from among the plurality of factors that affect the amount of treatment because a correlation between the scanning speed and an evaluation index is stronger than correlations between factors other than the scanning speed and the evaluation index in a case in which homogenization of the distribution of the amount of treatment is used as the evaluation index. According to the present embodiment, since it is only necessary to create a data set of the learning target speed information #A (scanning speed information) to generate the learning data, it is possible to reduce a burden on the operator who is involved in development of the learned model or the scanning speed information.

Second Embodiment

Next, a second embodiment will be described with reference to FIGS. 20 and 21. However, matters that are different from those in the first embodiment will be described, and description of the same matters as those in the first embodiment will be omitted. The second embodiment is different from the first embodiment in that a learning apparatus 200 generates a learned model 136.

Figure 20:
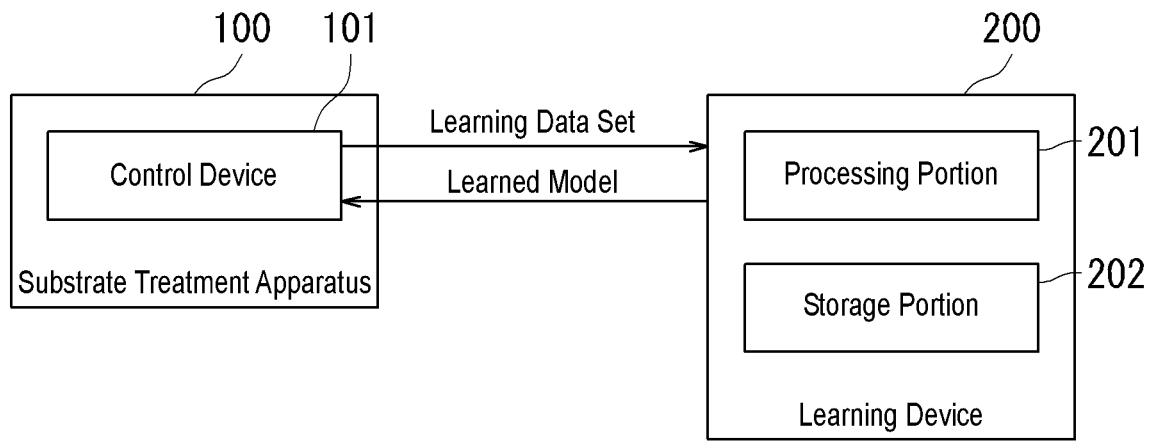
FIG. 20 is a diagram illustrating a substrate treatment apparatus and a learning apparatus according to a second embodiment.

FIG. 20 is a diagram illustrating a substrate treatment apparatus 100 and the learning apparatus 200 according to the present embodiment. In the present embodiment, a control device 101 of the substrate treatment apparatus 100 generates a learning data set 135 as described above with reference to FIGS. 1 to 13. The learning data set 135 is inputted to the learning apparatus 200.

The learning apparatus 200 generates a learned model 136 using the learning data set 135. The learned model 136 is inputted into a control device 101 of the substrate treatment apparatus 100. Specifically, the learning apparatus 200 includes a processing portion 201 and a storage portion 202. The processing portion 201 is an example of the learning portion.

The processing portion 201 has a processor. The processing portion 201 has, for example, a CPU or an MPU. Alternatively, the processing portion 201 has a general-purpose computing machine. The processing portion 201 may further have an NCU. The storage portion 202 stores data and a computer program. The storage portion 202 has a main storage device. The main storage device is, for example, a semiconductor memory. The storage portion 202 may further have an auxiliary storage device. The auxiliary storage device is, for example, a semiconductor memory and/or a hard disk drive. The storage portion 202 may have a removable medium. The processing portion 201 executes machine learning on the basis of the data and the computer program stored in the storage portion 202.

Specifically, the storage portion 202 stores the inference program 133 and the learning program 134 described in the first embodiment. The processing portion 201 learns the learning data set 135 (a plurality of pieces of learning data), generates a learned parameter, and generates the learned model 136 on the basis of the learned parameter, similarly to the control portion 102 described above in the first embodiment.

Note that the learning data set 135 may be inputted to the learning apparatus 200 via a removable memory or may be inputted to the learning apparatus 200 via a removable medium. Similarly, the learned model 136 may be inputted to the substrate treatment apparatus 100 via a removable memory or may be inputted to the substrate treatment apparatus 100 via a removable medium. Specifically, the learning apparatus 200 may have an interface that acquires the learning data set 135 from the removable memory and stores the learned model 136 in the removable memory or may have a drive that acquires the learning data set 135 from the removable medium and stores the learned model 136 in the removable medium.

Alternatively, the substrate treatment apparatus 100 and the learning apparatus 200 may be connected to each other in a mutually communicable manner. In this case, the learning data set 135 is transmitted from the substrate treatment apparatus 100 to the learning apparatus 200, and the learned model 136 is transmitted from the learning apparatus 200 to the substrate treatment apparatus 100. Note that the communication scheme may be a wired scheme or a wireless scheme. The substrate treatment apparatus 100 and the learning apparatus 200 may be connected in a mutually communicable manner via a public communication network such as the Internet line.

Next, a method for generating the learned model 136 executed by the learning apparatus 200 will be described with reference to FIGS. 20 and 21. FIG. 21 is a flowchart illustrating the method for generating the learned model 136 according to the present embodiment. Specifically, FIG. 21 illustrates a process executed by the processing portion 201 when the learned model 136 is generated. The method for generating the learned model 136 in the present embodiment includes processes in Steps S200 to S203.

First, the processing portion 201 acquires the learning data set 135 from the storage portion 202 (Step S200). At this time, the processing portion 201 acquires learning data with a first flag applied thereto from the plurality of pieces of learning data.

The processing portion 201 acquires the learning data set 135 and then learns the learning data set 135 (a plurality of pieces of learning data) on the basis of the learning program 134 (Step S201).

The processing portion 201 generates a learned parameter by learning the learning data set 135 (Step S202). More specifically, the learned parameter is outputted from the learning program 134.

Next, the processing portion 201 generates the learned model 136 on the basis of the acquired learned parameter (Step S203). As a result, the process illustrated in FIG. 21 is ended. Specifically, the processing portion 201 generates the learned model 136 by incorporating the learned parameter in the inference program 133.

Figure 21:
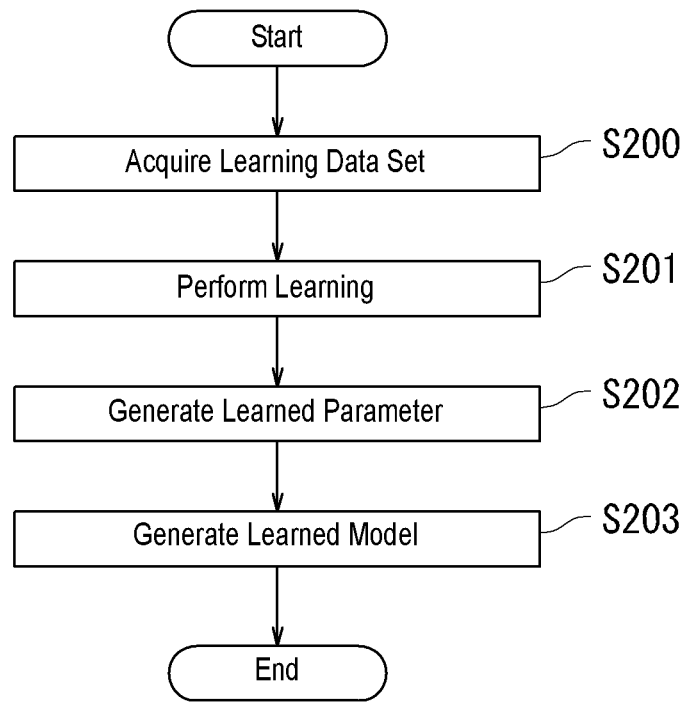
FIG. 21 is a flowchart illustrating a learned model generation method according to the second embodiment.

The second embodiment has been described hitherto with reference to FIGS. 20 and 21. According to the present embodiment, it is possible to reduce a burden on the operator who is involved in development of the scanning speed information similarly to the first embodiment. Also, according to the present embodiment, it is not necessary to execute machine learning in the substrate treatment apparatus 100. It is thus possible to use an existing substrate treatment apparatus instead, as the substrate treatment apparatus 100.

Note that although the learning data set 135 is inputted from the substrate treatment apparatus 100 to the learning apparatus 200 in the present embodiment, the learning data may be inputted from the substrate treatment apparatus 100 to the learning apparatus 200.

Also, the learning apparatus 200 may further execute the additional learning described above in the first embodiment. In a case in which the learning apparatus 200 executes the additional learning, an additional learning data set or additional learning data is inputted from the substrate treatment apparatus 100 to the learning apparatus 200.

Also, although the learning data set 135 is inputted from the substrate treatment apparatus 100 to the learning apparatus 200 in the present embodiment, the learned parameter may be inputted from the substrate treatment apparatus 100 to the learning apparatus 200. In a case in which the learned parameter is inputted from the substrate treatment apparatus 100 to the learning apparatus 200, the learning apparatus 200 (processing portion 201) executes the process in Step S203 described above with reference to FIG. 21.

Third Embodiment

Next, a third embodiment will be described with reference to FIGS. 17, 18, 22, and 23. However, matters different from those in the first and second embodiments will be described, and description of the same matters as those in the first and second embodiments will be omitted. The third embodiment is different from the first and second embodiments in that a learning apparatus 200 causes speed information at the time of treatment that is an objective variable to be outputted from a learned model 136.

Figure 22:
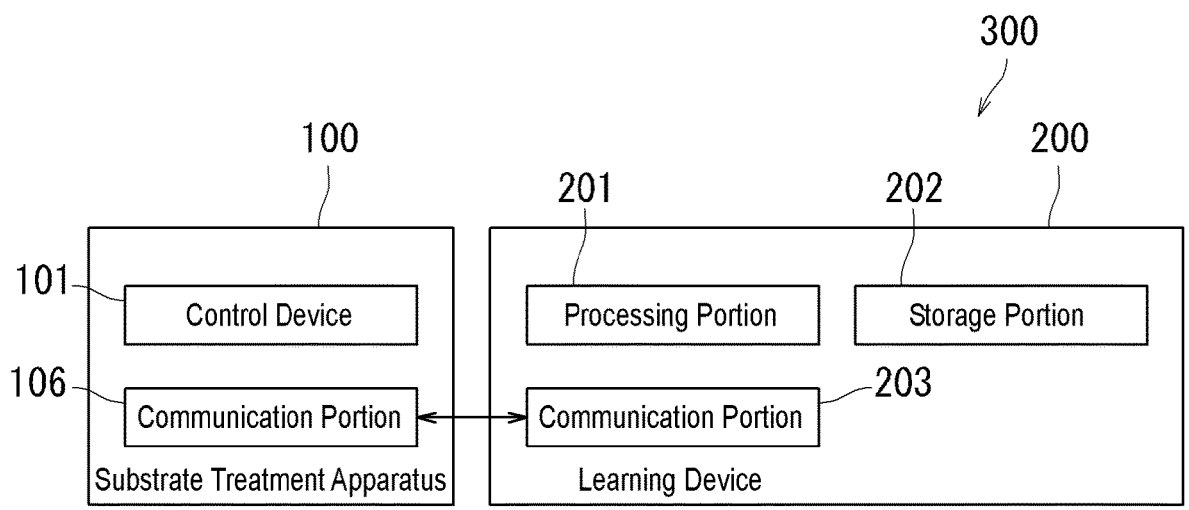
FIG. 22 is a diagram illustrating a substrate treatment system according to a third embodiment.

FIG. 22 is a diagram illustrating a substrate treatment system 300 according to the present embodiment. As illustrated in FIG. 22, the substrate treatment system 300 includes a substrate treatment apparatus 100 and a learning apparatus 200. The learning apparatus 200 is an example of the information processing apparatus. In the present embodiment, a processing portion 201 of the learning apparatus 200 generates a learned model 136 as described above in the second embodiment. The processing portion 201 causes a storage portion 202 to store the learned model 136.

As illustrated in FIG. 22, the substrate treatment apparatus 100 further includes a communication portion 106. The learning apparatus 200 further includes a communication portion 203. The communication portion 106 and the communication portion 203 are LAN boards or wireless LAN boards, for example. The communication portion 106 and the communication portion 203 are connected to each other in a mutually communicable manner via a public communication network such as the Internet line, for example.

The communication portion 106 of the substrate treatment apparatus 100 is controlled by a control device 101 (control portion 102) such that the communication portion 106 transmits a target treatment amount (target etching amount) to the communication portion 203 of the learning apparatus 200. Also, the communication portion 106 of the substrate treatment apparatus 100 is controlled by the control device 101 (control portion 102) such that the communication portion 106 receives speed information at the time of treatment from the communication portion 203 of the learning apparatus 200. As a result, the control device 101 (control portion 102) acquires the speed information at the time of treatment. The control portion 102 causes the storage portion 103 to store the acquired speed information at the time of treatment.

The communication portion 203 of the learning apparatus 200 is controlled by the processing portion 201 such that the communication portion 203 receives the target treatment amount (treatment etching amount) from the communication portion 106 of the substrate treatment apparatus 100. As a result, the processing portion 201 acquires the target treatment amount (target etching amount). Also, the communication portion 203 of the learning apparatus 200 is controlled by the processing portion 201 such that the communication portion 203 transmits the speed information at the time of treatment to the communication portion 106 of the substrate treatment apparatus 100.

Figure 23:
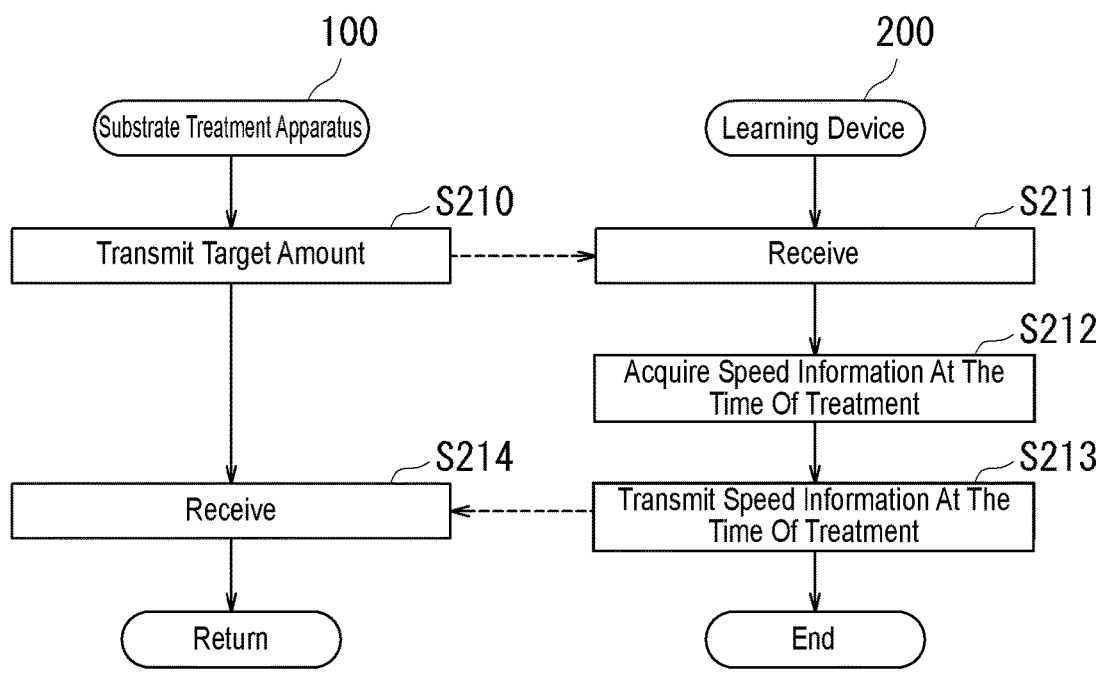
FIG. 23 is a flowchart illustrating a process executed by a control device of the substrate treatment apparatus and a process executed by a processing portion of a learning apparatus.

Next, a process executed by the control device 101 (control portion 102) and a process executed by the processing portion 201 will be described with reference to FIGS. 22 and 23. FIG. 23 is a flowchart illustrating the process executed by the control device 101 (control portion 102) of the substrate treatment apparatus 100 and the process executed by the processing portion 201 of the learning apparatus 200.

The control device 101 (control portion 102) of the substrate treatment apparatus 100 acquires the target treatment amount (target etching amount) as described above in the first embodiment (Steps S21 to S24 in FIG. 17) and then controls the communication portion 106 such that the target treatment amount (target etching amount) is transmitted to the communication portion 203 of the learning apparatus 200 (Step S210).

The processing portion 201 of the learning apparatus 200 controls the communication portion 203 such that the communication portion 203 is caused to receive the target treatment amount (target etching amount (Step S211)). As a result, the processing portion 201 acquires the target treatment amount (target etching amount).

The processing portion 201 causes speed information at the time of treatment that is an objective variable to be outputted from the learned model 136 by inputting a target treatment amount (target etching amount) that is an explanatory variable to the learned model 136. As a result, the processing portion 201 of the learning apparatus 200 acquires the speed information at the time of treatment (Step S212).

The processing portion 201 of the learning apparatus 200 controls the communication portion 203 such that the speed information at the time of treatment is transmitted to the communication portion 106 of the substrate treatment apparatus 100 (Step S213). The control device 101 (control portion 102) of the substrate treatment apparatus 100 controls the communication portion 106 such that the communication portion 106 is caused to receive the speed information at the time of treatment (Step S214). As a result, the control device 101 (control portion 102) acquires the speed information at the time of treatment. Thereafter, the control device 101 (control portion 102) executes the process in and after Step S26 described above with reference to FIGS. 17 and 18.

The third embodiment has been described hitherto with reference to FIGS. 17, 18, 22, and 23. According to the present embodiment, it is possible to reduce a burden on the operator who is involved in development of the scanning speed information similarly to the first and second embodiments. Also, according to the present embodiment, it is not necessary to cause the storage portion 103 of the substrate treatment apparatus 100 to store the learned model 136.

Fourth Embodiment

Next, a fourth embodiment will be described with reference to FIGS. 1, 8, 14, 16, and 24 to 31. However, matters different from those in the first to third embodiments will be described, and description of the same matters as those in the first to third embodiments will be omitted. The fourth embodiment is different from the first to third embodiments in that a learned model 136 is categorized into a plurality of classes.

Figure 24:
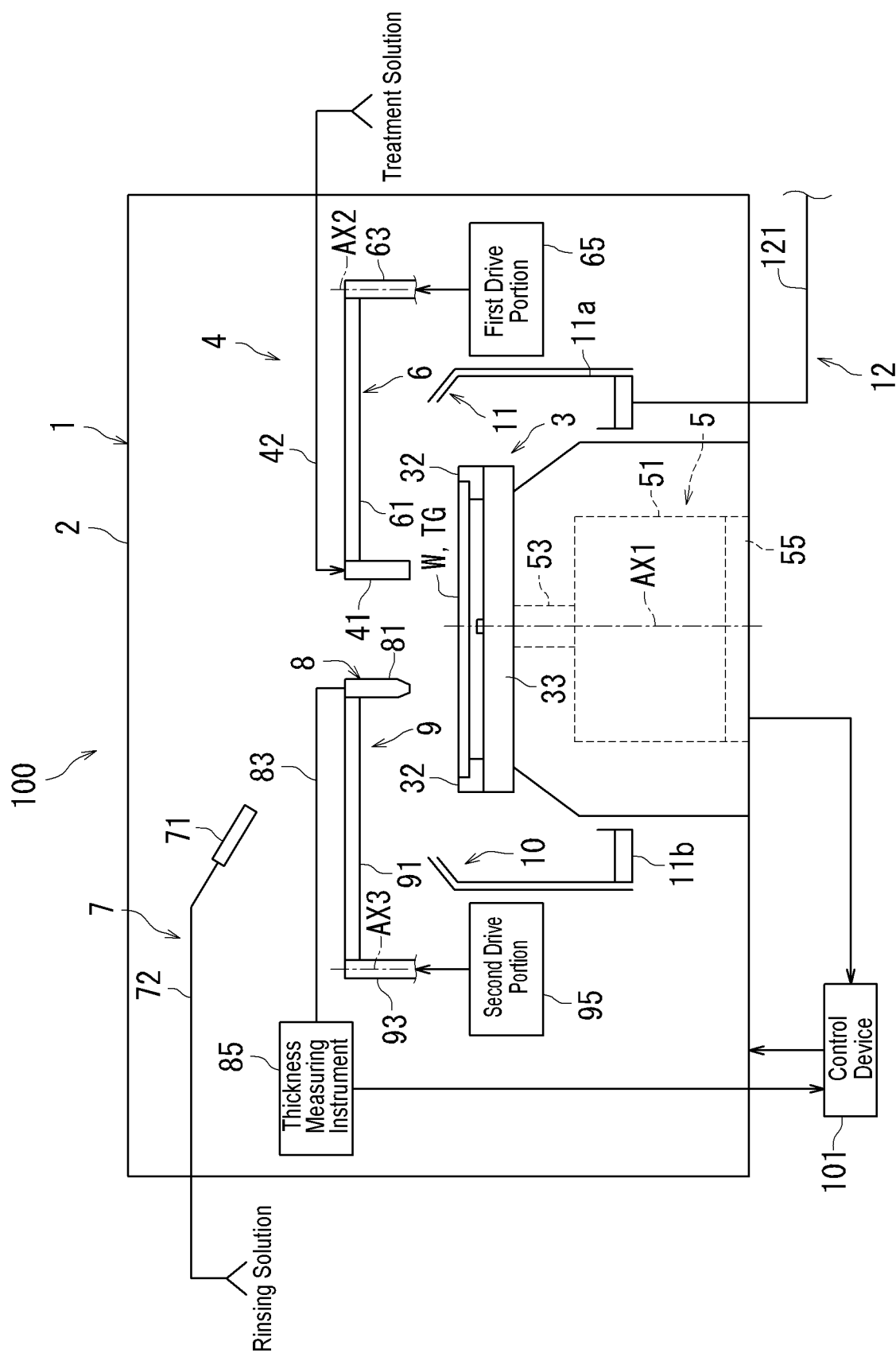
FIG. 24 is a schematic view of a treatment unit according to a fourth embodiment.

FIG. 24 is a schematic diagram of a treatment unit 1 according to the present embodiment. Specifically, FIG. 24 is a schematic sectional view of the treatment unit 1. As illustrated in FIG. 24, a substrate treatment apparatus 100 according to the present embodiment further includes an etching solution collecting section 12. The etching solution collecting section 12 has a collecting pipe 121. A chamber 2 further accommodates a part of the collecting pipe 121. Note that another part of the collecting pipe 121 is accommodated in corresponding one of fluid boxes 100B described above with reference to FIG. 1.

As illustrated in FIG. 24, a guard 10 includes a cup 11. The cup 11 has a guard 11a and a liquid receiving section 11b. The guard 11a has a substantially tubular shape and receives an etching solution (treatment solution) flying from a rotating substrate W. The liquid receiving section 11b is connected to a lower end of the guard 11a. The liquid receiving section 11b has an annular shape and forms an annular groove. The etching solution (treatment solution) received by the guard 11a flows downward to the liquid receiving section 11b due to its self-weight. As a result, the etching solution (treatment solution) is collected at the liquid receiving section 11b. One end of the collecting pipe 121 is connected to the liquid receiving section 11b. The etching solution (treatment solution) collected at the liquid receiving section 11b flows into the collecting pipe 121 due to its self-weight.

Figure 25:
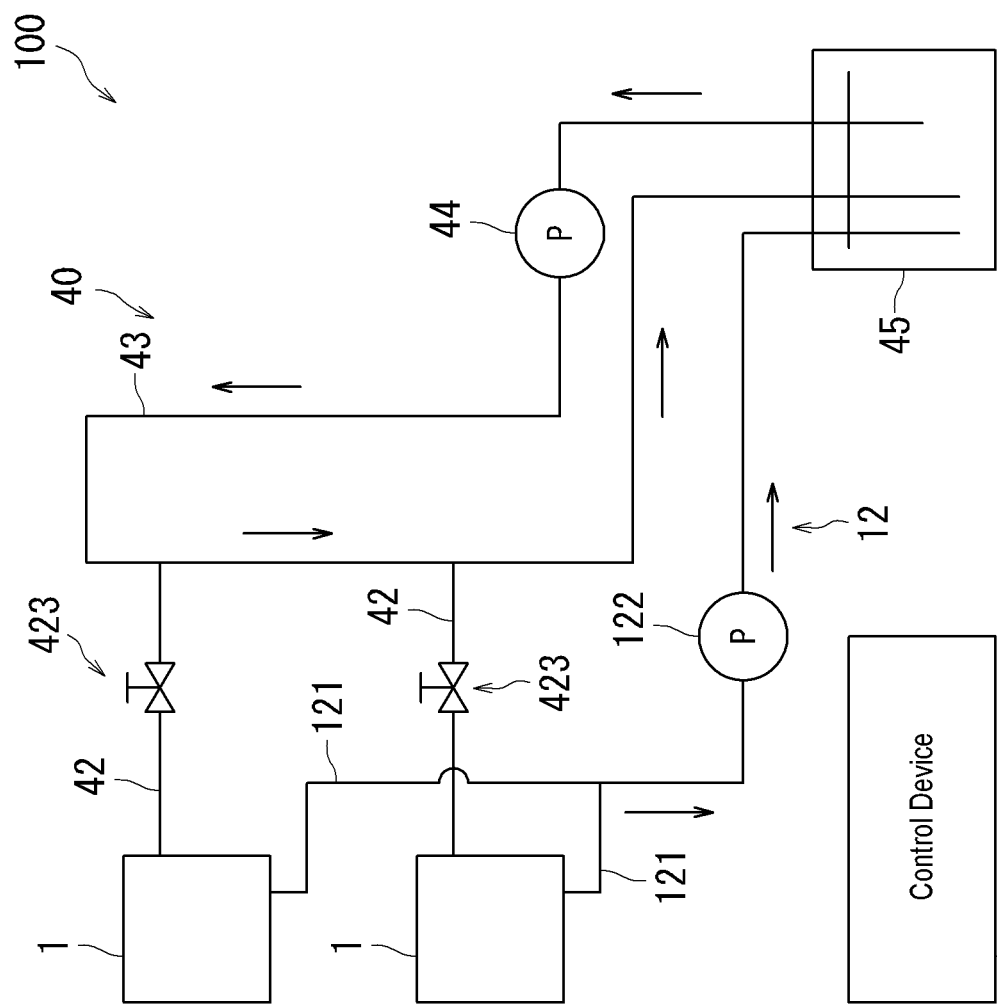
FIG. 25 is a schematic view illustrating a configuration of a substrate treatment apparatus according to the fourth embodiment.

The etching solution (treatment solution) that has flowed into the collecting pipe 121 is returned to a container (treatment solution container 45) that stores the etching solution (treatment solution) and is used again to treat (etch) the substrate W as will be described with reference to FIG. 25.

Next, the substrate treatment apparatus 100 will further be described with reference to FIG. 25. FIG. 25 is a schematic view illustrating a configuration of the substrate treatment apparatus 100 according to the present embodiment. Specifically, FIG. 25 illustrates an internal configuration of the fluid box 100B described above with reference to FIG. 1. Note that in FIG. 25, the temperature sensor 421, the concentration sensor 422, the mixing valve 424, the flowmeter 425, and the heating heater 426 described above with reference to FIG. 7 are omitted for simplification of the drawing.

First, the etching solution supply portion 4 will further be described with reference to FIG. 25. As illustrated in FIG. 25, the etching solution supply portion 4 further has a circulating pipe 43, a circulating pump 44, and a treatment solution container 45. The treatment solution container 45 stores the etching solution (treatment solution). The treatment solution container 45 is disposed in a replaceable manner in the fluid box 100B (FIG. 1). A new treatment solution container 45 that stores the etching solution therein is disposed in the fluid box 100B by the treatment solution container 45 being replaced. As described above with reference to FIG. 24, the etching solution (treatment solution) that has flowed into the collecting pipe 121 is returned to the treatment solution container 45 and is used again to treat (etch) the substrate W. If the etching solution is continuously reused, the amount of etching decreases, and it is thus necessary to appropriately replace the treatment solution container 45 in the fluid box 100B. The treatment solution container 45 is, for example, a tank.

The circulating pipe 43 and the circulating pump 44 are accommodated in the fluid box 100B (FIG. 1). Both ends of the circulating pipe 43 are connected to the treatment solution container 45. The circulating pump 44 is attached to the circulating pipe 43. The circulating pump 44 is controlled by the control device 101 (control portion 102).

If the circulating pump 44 is driven, the etching solution stored in the treatment solution container 45 then flows from one end of the circulating pipe 43 into the circulating pipe 43 and is distributed through the circulating pipe 43. The etching solution guided to the other end of the circulating pipe 43 is returned from the other end of the circulating pipe 43 to the treatment solution container 45.

The other end of the first supply pipe 42 is connected to the circulating pipe 43. The etching solution distributed through the circulating pipe 43 flows into the first supply pipe 42. In a case in which a valve 423 is in an opened state, the etching solution that has flowed from the circulating pipe 43 into the first supply pipe 42 is guided to the first nozzle 41 (FIG. 24). In a case in which the valve 423 is in a closed state, a flow of the etching solution that has flowed from the circulating pipe 43 into the first supply pipe 42 is stopped by the valve 423.

Next, the etching solution collecting section 12 will further be described with reference to FIG. 25. As illustrated in FIG. 25, the etching solution collecting section 12 further has a collecting pump 122. The collecting pump 122 is accommodated in the fluid box 100B (FIG. 1).

The collecting pump 122 is attached to the collecting pipe 121. The collecting pump 122 is controlled by the control device 101 (control portion 102). The collecting pump 122 drives the etching solution such that the etching solution that has flown from the treatment unit 1 (liquid receiving section 11b) into the collecting pipe 121 is distributed through the collecting pipe 121. The other end of the collecting pipe 121 is connected to the treatment solution container 45, and the etching solution is guided to the other end of the collecting pipe 121 and is then collected from the other end of the collecting pipe 121 to the treatment solution container 45 by the collecting pump 122 being driven. Therefore, it is possible to reuse the etching solution after the etching solution is used for the treatment (etching) of the substrate W.

Figure 26:
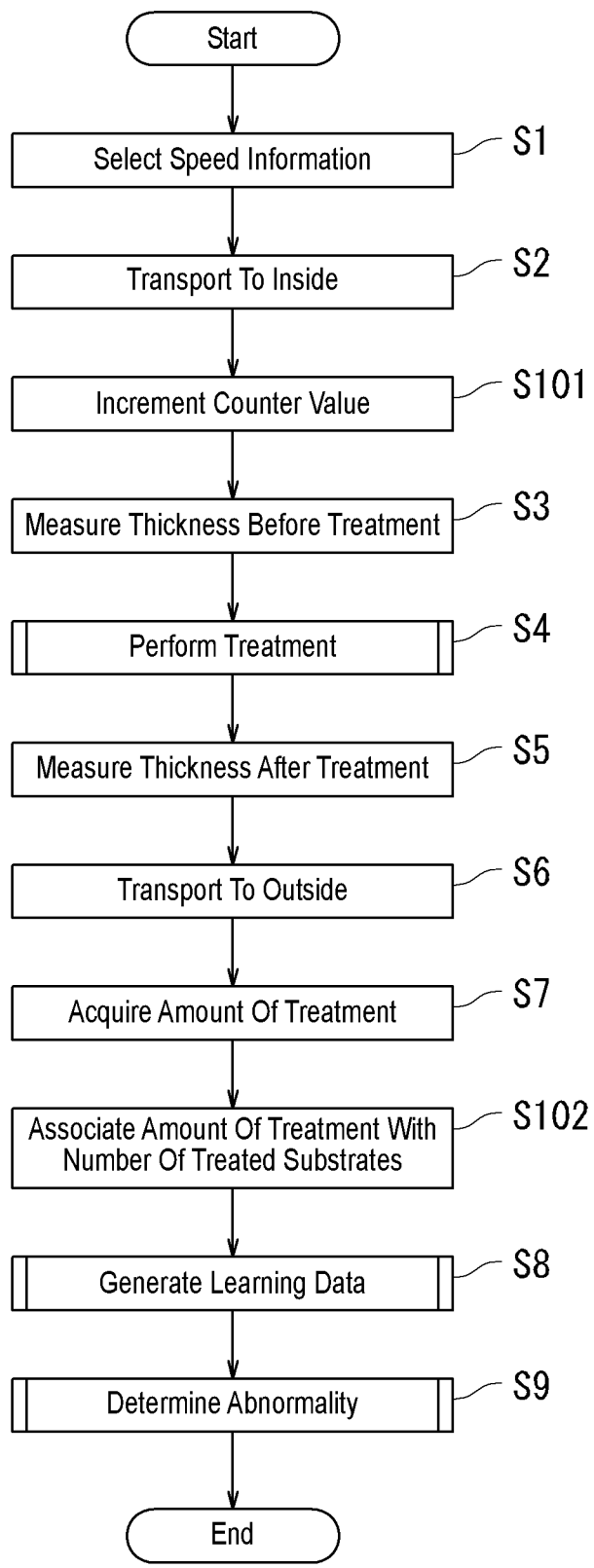
FIG. 26 is a flowchart illustrating a learning data generation method according to the fourth embodiment.

Next, a learning data generation method executed by the substrate treatment apparatus 100 according to the present embodiment will be described with reference to FIGS. 8 and 26. FIG. 26 is a flowchart illustrating the learning data generation method according to the present embodiment. Specifically, FIG. 26 illustrates a process executed by the control portion 102 when the learning data is generated. The learning data generation method in the present embodiment further includes processes in Steps S101 and S102 in addition to Steps S1 to S9 described above with reference to FIG. 9.

In the present embodiment, the control portion 102 transports the substrate W that is a learning target (Step S2) and then increments a treated number counter value (Step S101). In other words, the control portion 102 causes the treated number counter value to increase by "1". The treated number counter value when the learning data is generated indicates the number of treated substrates W that are learning targets. The control portion 102 causes the storage portion 103 to store the treated number counter value after the incrementing.

Specifically, the control portion 102 counts the number of treated substrates W that are learning targets from the time of starting utilization of the treatment solution (etching solution) used for the treatment (etching) of the substrates W that are learning targets. More specifically, the control portion 102 starts counting from the time of starting the treatment (etching) of the substrates W that are learning targets using the etching solution in the treatment solution container 45 (FIG. 25). If the treatment solution container 45 (FIG. 25) is replaced with a new treatment solution container 45, then the control portion 102 resets the treated number counter value. Here, the treated number counter value is reset to "0".

The control portion 102 acquires the amount of treatment (the amount of etching) (Step S7), then the control portion 102 causes the storage portion 103 to store the acquired amount of treatment in association with the treated number counter value stored in the storage portion 103 (Step S102).

Note that the timings at which the processes in Steps S101 and S102 are executed are not limited to the timings illustrated in FIG. 26. The timings at which the processes in Steps S101 and S102 are executed are not particularly limited as long as the timings are placed before the transporting of the next substrate W.

Figures 27, 28:
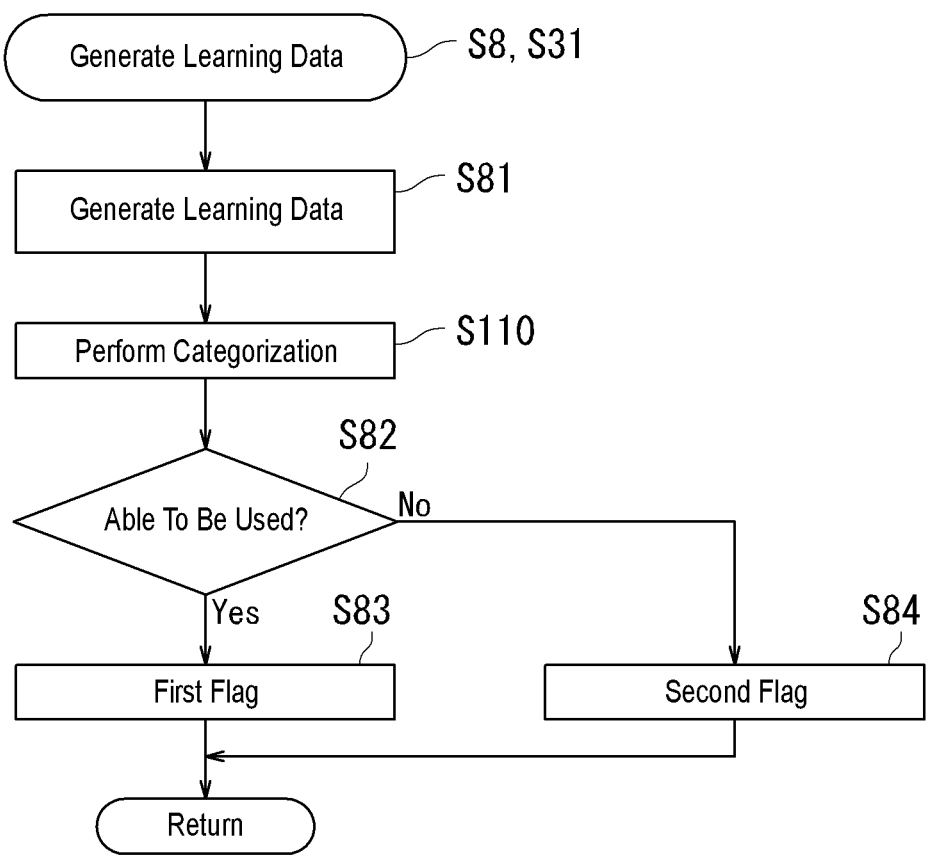
FIG. 27 is a flowchart illustrating a learning data generation process according to the fourth embodiment.
FIG. 28 is a diagram illustrating an example of a learning data set table according to the fourth embodiment.

Next, a process of generating learning data (Step S8) will be described with reference to FIGS. 8 and 27. FIG. 27 is a flowchart illustrating a learning data generation process according to the present embodiment.

In the present embodiment, the learning data generation process further includes a process in Step S110 in addition to Steps S81 to S84 described above with reference to FIG. 11. The control portion 102 categorizes learning data into each class on the basis of a categorization rule set in advance after the generation of the learning data (Step S81). The categorization rule is stored in the storage portion 103.

In the present embodiment, the categorization rule defines that the learning data is to be categorized into each class in accordance with the number of treated substrates W that are learning targets (treated number counter value). More specifically, the categorization rule defines that the treated number counter value is divided into a plurality of ranges (a plurality of classes), and the control portion 102 categorizes the learning data into each class with reference to the treated number counter value associated with the learning data.

Note that the timing at which the process in Step S110 is executed is not limited to the timing illustrated in FIG. 27. The timing at which the process in Step S110 is executed is not particularly limited as long as the timing is placed after the generation of the learning data.

Next, a learning data set table TB30 for managing the learning data set 135 will be described with reference to FIG. 28. FIG. 28 is a diagram illustrating an example of the learning data set table TB30 according to the present embodiment.

As illustrated in FIG. 28, the learning data set table TB30 has a class information field TB31 and a learning data set information field TB32. A range of the treated number counter value is defined in advance in each class information field TB31. In the present embodiment, the control portion 102 creates the learning data set table TB10 described above with reference to FIG. 13 for each class. The control portion 102 associates the learning data set table TB10 corresponding to each class information field TB31 (each range of the treated number counter value) with each learning data set information field TB32.

Note that each value defined in each class information field TB31 may be a value (default value) defined in advance in the recipe 131 or may be a value inputted by the operator through an operation on the input portion 104.

Figure 29:
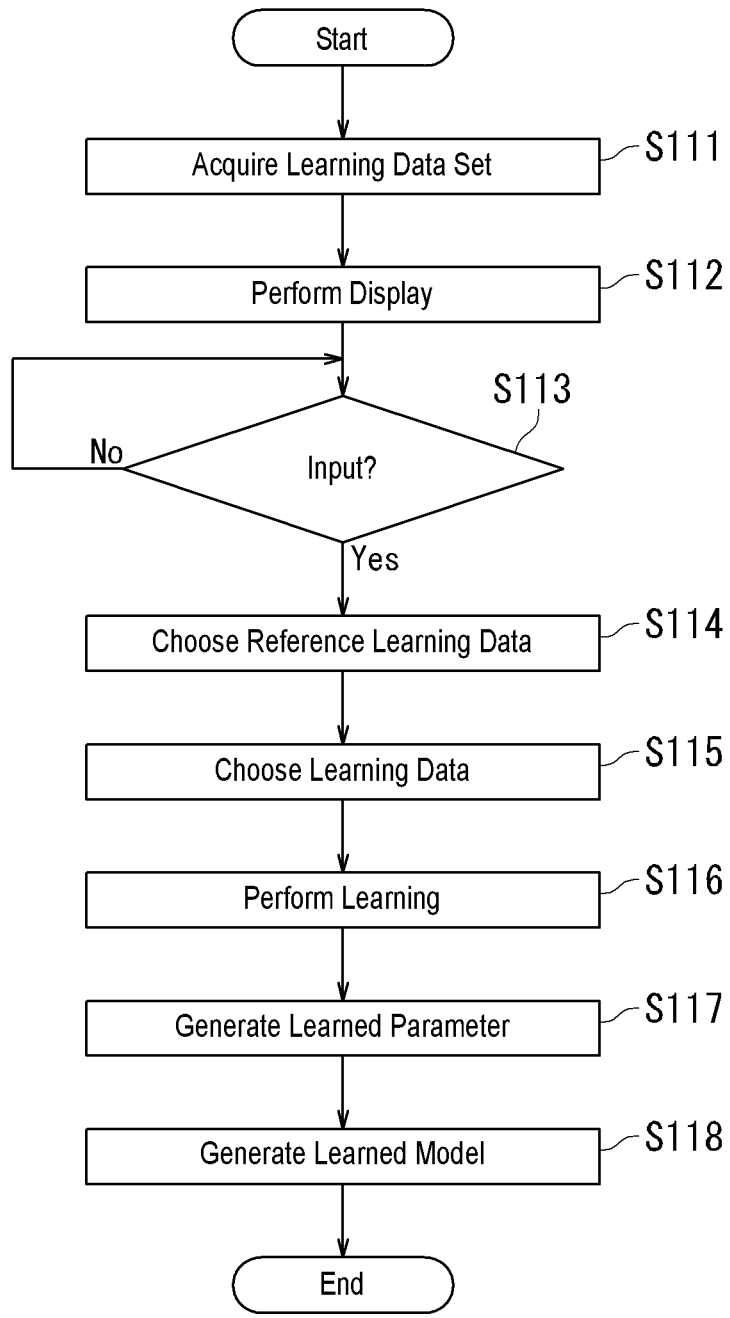
FIG. 29 is a flowchart illustrating a learned model generation method according to the fourth embodiment.

Next, a method for generating the learned model 136 executed by the substrate treatment apparatus 100 according to the present embodiment will be described with reference to FIGS. 14 and 29. FIG. 29 is a flowchart illustrating the method for generating the learned model 136 according to the present embodiment. Specifically, FIG. 29 illustrates a process executed by the control portion 102 when the learned model 136 is generated. The method for generating the learned model 136 in the present embodiment includes processes in Steps S111 to S118. The process illustrated in FIG. 29 is executed for each learning data set 135 created for each class.

First, the control portion 102 acquires one of a plurality of learning data sets 135 from the storage portion 103 (Step S111). At this time, the control portion 102 acquires learning data with a first flag applied thereto from the plurality of pieces of learning data similarly to Step S11 in FIG. 15.

The control portion 102 causes the display portion 105 to display an input screen indicating information of the acquired learning data set 135 (Step S112). Hereinafter, the input screen may be described as a "chosen instruction input screen". Specifically, information indicating each piece of learning data included in the acquired learning data set 135 is displayed on the chosen instruction input screen. Specifically, the information indicating the learning data indicates learning target speed information #A and the amount of treatment (the amount of etching). Hereinafter, the acquired learning data set 135 may be described as a "current learning data set 135".

The chosen instruction input screen is a screen that allows the operator to choose one of pieces of the learning data included in the current learning data set 135. The operator operates the input portion 104 to input an instruction for choosing one of pieces of the learning data displayed on the chosen instruction input screen. For example, the operator may choose one of pieces of learning data on the basis of information indicating the amount of treatment (the amount of etching). Hereinafter, the learning data chosen by the operator may be described as "reference learning data".

As illustrated in FIG. 29, the control portion 102 determines whether or not the instruction for choosing the reference learning data has been inputted (Step S113) after the display of the chosen instruction input screen (Step S112). The control portion 102 waits for the input of the instruction for choosing the reference learning data (No in Step S113).

If the control portion 102 determines that the instruction for choosing the reference learning data has been inputted (Yes in Step S113), then the control portion 102 chooses one of pieces of the learning data included in the current learning data set 135 as the reference learning data in response to the instruction from the operator (Step S114).

After the reference learning data is chosen, the control portion 102 chooses learning data with a correlation with the reference learning data that satisfies a condition set in advance, in the learning data included in the current learning data set 135 (Step S115).

In the present embodiment, the control portion 102 chooses the learning data on the basis of a root mean square error (RMSE) of the amount of treatment (the amount of etching) of the reference learning data and the amount of treatment (the amount of etching) of each piece of learning data included in the current learning data set 135. Specifically, the control portion 102 obtains the value of the root mean square error using the following equation and chooses the learning data with a value of root mean square error that is equal to or greater than a threshold value.

$$RMSE = \sqrt{\frac{1}{n}\sum_{i=1}^{n}(y_i - \hat{y}_i)^2} \qquad \text{[Math. 1]}$$

In the aforementioned equation, "n" indicates the number of locations at which measurement is performed by the thickness measurement portion 8 (thickness measuring instrument 85), "$y_i$" indicates distribution of the amount of treatment in the reference learning data (the amount of treatment at each measurement location), and "$\hat{y}_i$ (hat)" indicates distribution of the amount of treatment in the learning data (the amount of treatment at each measurement location), and i indicates the number of pieces of learning data included in the current learning data set 135.

Note that although the error (distance) between the amount of treatment (the amount of etching) of the reference learning data and the amount of treatment (the amount of etching) of each piece of learning data included in the current learning data set 135 is obtained using a root mean square error (RMSE) in the present embodiment, the error may be obtained on the basis of another index. For example, the error may be obtained using a mean absolute error (MAE) or a mean square error (MSE).

As illustrated in FIG. 29, the control portion 102 generates a learned parameter (Step S117) by learning the chosen learning data (Step S116) after the choosing of the learning data (Step S115). More specifically, the learned parameter is outputted from the learning program 134. The control portion 102 generates the learned model 136 on the basis of the acquired learned parameter (Step S118) and ends the process illustrated in FIG. 29.

In the present embodiment, the process illustrated in FIG. 29 is executed for each class. As a result, the learned model 136 is generated for each class.

Figure 30:
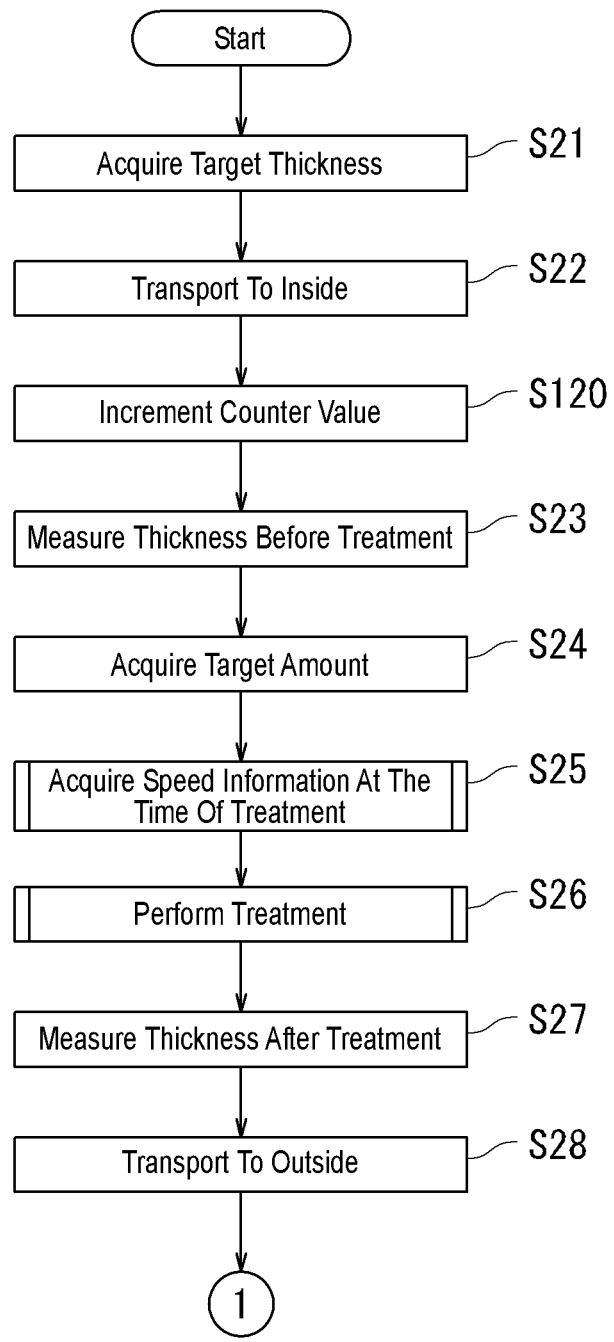
FIG. 30 is a flowchart illustrating a part of a substrate treatment method according to the fourth embodiment.

Next, a substrate treatment method executed by the substrate treatment apparatus 100 according to the present embodiment will be described with reference to FIGS. 16 and 30. FIG. 30 is a flowchart illustrating a part of the substrate treatment method according to the present embodiment. Specifically, FIG. 30 illustrates a part of the process executed by the control portion 102 when the substrate W that is a treatment target is etched. The substrate treatment method in the present embodiment further includes a process in Step S120 in addition to the processes in Steps S21 to S32 described above with reference to FIGS. 17 and 18.

In the present embodiment, the control portion 102 transports the substrate W that is the treatment target (Step S22) and then causes the treated number counter value to be incremented (Step S120). The treated number counter value when the substrate W that is the treatment target is treated indicates the number of treated substrates W that are the treatment targets. The control portion 102 causes the storage portion 103 to store the treated number counter value after the incrementing.

Specifically, the control portion 102 counts the number of treated substrates W that are the treatment targets from the time of starting utilization of the treatment solution (etching solution) used for the treatment (etching) of the substrates W that are the treatment targets. More specifically, the control portion 102 starts the counting from the start of the treatment (etching) of the substrates W that are the treatment targets using the etching solution in the treatment solution container 45 (FIG. 25). If the treatment solution container 45 (FIG. 25)

is replaced with a new treatment solution container 45, then the control portion 102 resets the treated number counter value. Here, the treated number counter value is reset to "0".

Figure 31:
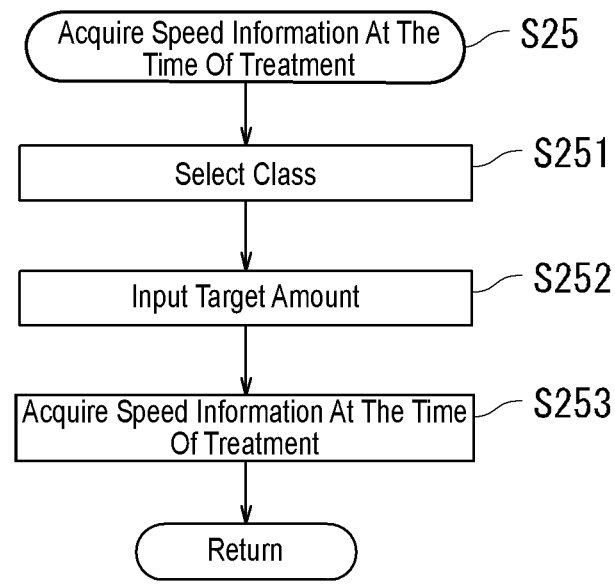
FIG. 31 is a flowchart illustrating a process of acquiring a speed information at the time of treatment according to the fourth embodiment.

Next, a process for acquiring the speed information at the time of treatment (Step S25) will be described with reference to FIGS. 16 and 31. FIG. 31 is a flowchart illustrating the process for acquiring the speed information at the time of treatment.

As illustrated in FIG. 31, after the target treated amount (target etching amount) is acquired (Step S24 in FIG. 30), the control portion 102 selects one of classes on the basis of the selection rule set in advance (Step S251). The selection rule is stored in the storage portion 103.

In the present embodiment, the selection rule defines that one of the plurality of classes is to be selected in accordance with the number of treated substrates W that are the treatment targets. The control portion 102 selects one of the plurality of classes by specifying a range (section) corresponding to the treated number counter value (Step S120 in FIG. 30) that the storage portion 103 is caused to store, from among the plurality of ranges (the plurality of sections) of the treated number counter value described above with reference to FIGS. 26 to 28.

The control portion 102 causes the speed information at the time of treatment to be outputted from the learned model 136 by inputting the target treatment amount (target etching amount) to the learned model 136 corresponding to the selected class (Step S252). As a result, the control portion 102 acquires the speed information at the time of treatment (Step S253).

The fourth embodiment has been described hitherto with reference to FIGS. 1, 8, 14, 16, and 24 to 31. According to the present embodiment, it is possible to reduce a burden on the operator who is involved in development of the scanning speed information similarly to the first to third embodiments. Also, according to the present embodiment, it is possible to acquire the speed information at the time of treatment in accordance with the number of treated substrates W from the start of the utilization of the etching solution. It is thus possible to cause the first nozzle 41 to move at a more appropriate scanning speed. Therefore, it is possible to more appropriately treat (etch) the substrate W.

Further, according to the present embodiment, the learned model 136 is generated using the learning data with the correlation with the reference learning data that satisfies the condition set in advance, as described above with reference to FIG. 29. As a result, it is possible to acquire more appropriate speed information at the time of treatment. Therefore, it is possible to more appropriately treat (etch) the substrate W.

Note that although the learned model 136 is generated using the learning data with the correlation with the reference learning data that satisfies the condition set in advance in the present embodiment, the learned model 136 may be generated for each class by executing the process illustrated in FIG. 15 for each class.

Also, although the machine learning has been described in the present embodiment, additional learning can also similarly be executed.

Fifth Embodiment

Next, a fifth embodiment will be described with reference to FIGS. 1, 8, 16, 24, 25, 27, and 31 to 35. However, matters different from those in the first to fourth embodiments will be described, and description of the same matters as those in the first to fourth embodiments will be omitted. The fifth embodiment is different from the first to fourth embodiments in that a learned model 136 is categorized in accordance with the number of lots. Note that the number of substrates W included in one lot is, for example, twenty five.

Figure 32:
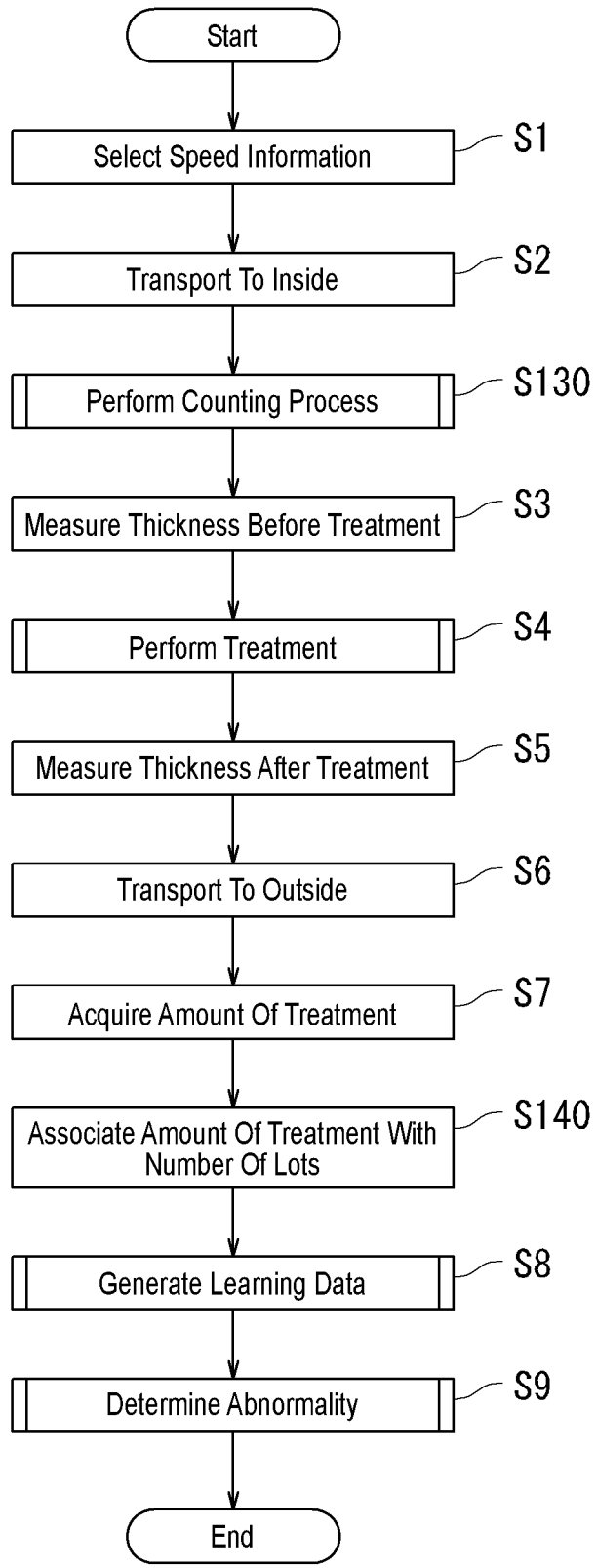
FIG. 32 is a flowchart illustrating a learning data generation method according to a fifth embodiment.

First, a learning data generation method executed by a substrate treatment apparatus 100 according to the present embodiment will be described with reference to FIGS. 8 and 32. FIG. 32 is a flowchart illustrating the learning data generation method according to the present embodiment. Specifically, FIG. 32 illustrates a process executed by a control portion 102 when learning data is generated. The learning data generation method according to the present embodiment further includes processes in Steps S130 and S140 in addition to Steps S1 to S9 described above with reference to FIG. 9.

In the present embodiment, the control portion 102 transports a substrate W that is a learning target (Step S2) and then executes a counting process (Step S130). The control portion 102 acquires the number of lots at the time of learning that is the number of lots from the time of starting utilization of a treatment solution (etching solution) used for the treatment on the substrate W that is the learning target, by executing the counting process. More specifically, the control portion 102 acquires the number of lots at the time of learning from the start of the treatment (etching) on the substrate W that is the learning target using the etching solution in the treatment solution container 45 (FIG. 25). The control portion 102 causes the storage portion 103 to store the number of lots at the time of learning acquired in the counting process.

Also, the control portion 102 acquires the amount of treatment (the amount of etching) (Step S7) and then causes the storage portion 103 to store the acquired amount of treatment in association with the number of lots at the time of learning stored in the storage portion 103 (Step S140).

Note that timings at which the processes in Steps S130 and S140 are executed are not limited to the timings illustrated in FIG. 32. The timings at which the processes in Steps S130 and S140 are executed are not particularly limited as long as the timings are placed before the transporting of the next substrate W.

Figure 33:
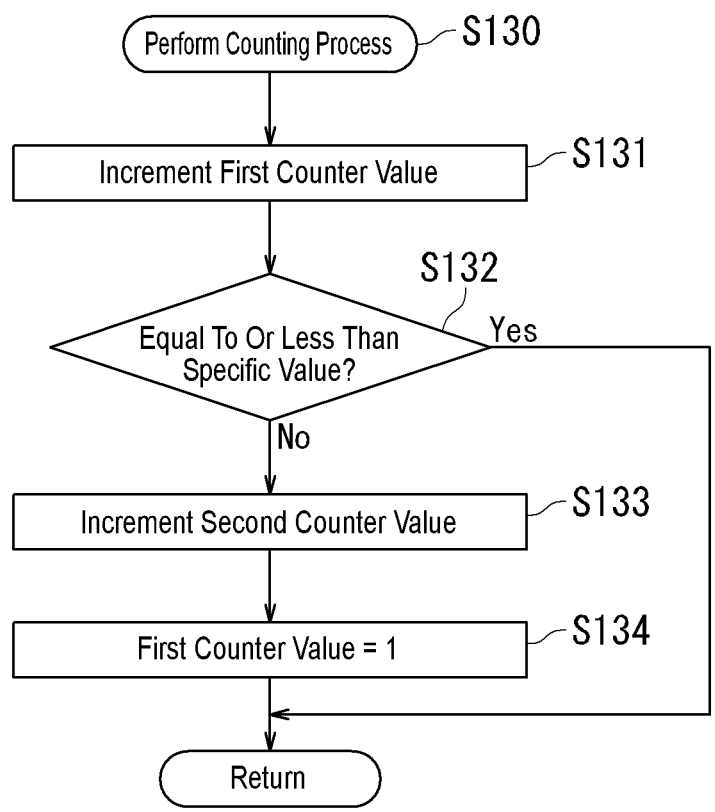
FIG. 33 is a flowchart illustrating an example of a counting process according to the fifth embodiment.

Next, an example of the counting process will be described with reference to FIGS. 8 and 33. FIG. 33 is a flowchart illustrating an example of the counting process. The counting process illustrated in FIG. 33 includes Steps S131 to S134.

If the counting process is started, then the control portion 102 causes the treated number counter value to be incremented first (Step S131). Note that in the following description, the treated number counter value may be described as a "first counter value".

The control portion 102 determines whether or not the first counter value after the incrementing is equal to or less than a specific value (Step S132). The specific value indicates the number of substrates W included in one lot.

In a case in which the first counter value after the incrementing exceeds the specific value, the control portion 102 determines that the first counter value after the incrementing is not equal to or less than the specific value (No in Step S132) and causes the lot number counter value to be incremented (Step S133). Hereinafter, the lot number counter value may be described as a "second counter value". The second counter value when the learning data is generated indicates the number of lots at the time of learning.

After the incrementing of the second counter value, the control portion 102 changes the first counter value to "1" (Step S134) and ends the counting process illustrated in FIG.

33. Alternatively, in a case in which the control portion 102 determines that the first counter value after the incrementing is equal to or less than the specific value (Yes in Step S132), the control portion 102 ends the counting process illustrated in FIG. 33.

Note that if the treatment solution container 45 (FIG. 25) is replaced with a new treatment solution container 45, then the control portion 102 changes the second counter value to "1".

Next, a process of generating learning data (Step S8) will be described with reference to FIGS. 8 and 27. In the present embodiment, the categorization rule defines that the learning data is to be categorized into each class in accordance with the number of lots at the time of learning (second counter value). The control portion 102 categorizes the learning data into each class with reference to the second counter value associated with the learning data (Step S110).

Next, a learning data set table TB40 for managing the learning data set 135 will be described with reference to FIG. 34. FIG. 34 is a diagram illustrating an example of the learning data set table TB40 according to the present embodiment.

As illustrated in FIG. 34, the learning data set table TB40 has a class information field TB41 and a learning data set information field TB42. The number of lots at the time of learning is defined in advance in each class information field TB41. In the present embodiment, the control portion 102 creates, for each class, the learning data set table TB10 described above with reference to FIG. 13. The control portion 102 associates the learning data set table TB10 corresponding to each class information field TB41 (the number of lots at the time of learning) with each learning data set information field TB42.

Figure 35:
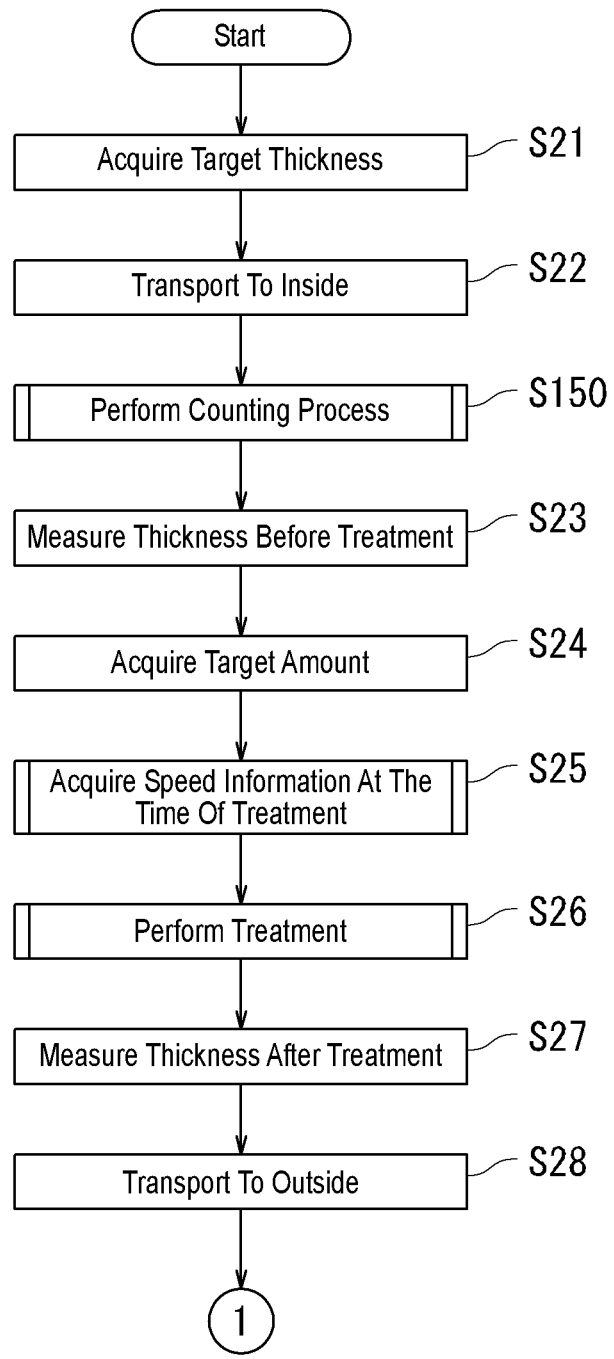
FIG. 35 is a flowchart illustrating a part of a substrate treatment method according to the fifth embodiment.

Next, a substrate treatment method executed by the substrate treatment apparatus 100 according to the present embodiment will be described with reference to FIGS. 16 and 35. FIG. 35 is a flowchart illustrating a part of the substrate treatment method according to the present embodiment. Specifically, FIG. 35 illustrates a part of the process executed by the control portion 102 when the substrate W that is the treatment target is etched. The substrate treatment method according to the present embodiment further includes a process in Step S150 in addition to the processes in Steps S21 to S32 described above with reference to FIGS. 17 and 18.

In the present embodiment, the control portion 102 transports the substrate W that is the treatment target (Step S22) and then executes the counting process (Step S150). The control portion 102 acquires the number of lots at the time of treatment that is the number of lots from the time of starting utilization of the treatment solution (etching solution) used for the treatment of the substrate W that is the treatment target, by executing the counting process. More specifically, the control portion 102 acquires the number of lots at the time of treatment from the time of starting the treatment (etching) of the substrate W that is the treatment target using the etching solution in the treatment solution container 45 (FIG. 25). More specifically, the control portion 102 can acquire the number of lots at the time of treatment (second counter value) by executing the process similar to the process escribed above with reference to FIG. 33. The control portion 102 causes the storage portion 103 to store the number of lots at the time of treatment (second counter value) acquired in the counting process.

Next, a process for acquiring speed information at the time of treatment (Step S25) will be described with reference to FIGS. 16 and 31. In the present embodiment, the selection rule defines that one of a plurality of classes is to be selected in accordance with the number of lots at the time of treatment. The control portion 102 selects one of the plurality of classes by specifying the number of lots at the time of treatment stored in the storage portion 103 in the number of lots at the time of learning described above with reference to FIGS. 32 to 34 (Step S150 in FIG. 35).

The control portion 102 causes the speed information at the time of treatment to be outputted from the learned model 136 by inputting the target treatment amount (target etching amount) to the learned model 136 corresponding to the selected class (Step S252). As a result, the control portion 102 acquires the speed information at the time of treatment (Step S253).

Note that the learned model 136 may be generated by executing the process illustrated in FIG. 29 for each class or may be generated by executing the process illustrated in FIG. 15 for each class.

The fifth embodiment has been described hitherto with reference to FIGS. 1, 8, 16, 24, 25, 27, and 31 to 35. According to the present embodiment, it is possible to reduce a burden on the operator who is involved in development of the scanning speed information similarly to the first to fourth embodiments. Also, according to the present embodiment, it is possible to acquire the speed information at the time of treatment in accordance with the number of treated substrates W from the start of utilization of the etching solution. Therefore, it is possible to more appropriately treat (etch) the substrate W.

Note that although the machine learning has been described in the present embodiment, additional learning can similarly be executed.

The embodiments of the present disclosure have been escribed hitherto with reference to the drawings. However, the present disclosure is not limited to the aforementioned embodiments and can be implemented in various aspects without departing from the gist thereof. Also, the plurality of components disclosed in the aforementioned embodiments can appropriately be modified. For example, some of all the components described in a certain embodiment may be added to components in another embodiment, or some of all the components described in a certain embodiment may be deleted from the embodiment.

The drawings mainly illustrate each component in a schematic manner for easy understanding of the present disclosure, and the thicknesses, the lengths, the numbers, the intervals, and the like of the illustrated components may differ from those in practice for convenience in creation of the drawings. Also, the configurations of the components described in the aforementioned embodiments are just examples and are not particularly limited, and it is a matter of course that various modifications can be made without substantially departing from the advantages of the present disclosure.

For example, although the thickness measurement portion 8 measures the thickness of the target object TG in the embodiments described above with reference to FIGS. 1 to 35, the thickness measurement portion 8 may measure the thickness of the substrate W. More specifically, the thickness measurement portion 8 may measure the thickness of the substrate W that is the learning target and the thickness of the substrate W that is the treatment target. Here, in a case in which a substance is formed on the surface of the substrate main body, the thickness of the substrate W indicates the total thickness of the substrate main body and the substance. Note that in the case in which the thickness measurement portion 8 measures the thickness of the substrate W, the amount of etching indicates a difference between the thickness of the substrate W before the etching treatment and the thickness of the substrate W after the etching treatment. Also, the target thickness (target thickness distribution) indicates the target thickness (target thickness distribution) of the substrate W that is the treatment target.

Also, although the substrate W is a semiconductor wafer in the embodiments described above with reference to FIGS. 1 to 35, the substrate W is not limited to the semiconductor wafer. For example, the substrate W may be a substrate for a liquid crystal display device, a substrate for a field emission display (FED), a substrate for an optical disc, a substrate for a magnetic disk, a substrate for a magneto-optical disc, a substrate for a photomask, a ceramic substrate, or a substrate for a solar battery.

In addition, although the treatment solution is the etching solution in the embodiments described above with reference to FIGS. 1 to 35, the treatment solution is not limited to the etching solution. The treatment solution may be any liquid with which the substrate W is treated. For example, the treatment solution may be a removal solution for removing the target object TG. It is possible to execute a process of removing a specific film or a process of removing a specific film in which foreign matters are mixed, using the removal solution. In a case in which a resist removing process is executed on the substrate W, the removal solution is, for example, a sulfuric acid/hydrogen peroxide mixture (SPM). The resist removing process means a process of removing a resist from the surface of a semiconductor substrate.

Also, although the treatment executed by the substrate treatment apparatus 100 is the etching treatment in the embodiments describe above with reference to FIGS. 1 to 35, the treatment executed by the substrate treatment apparatus 100 is not limited to the etching treatment. For example, the treatment may be a film forming treatment. In the case in which the substrate treatment apparatus 100 executes the film forming treatment, the treatment solution is, for example, SPM or ozone water. In this case, an oxide film is formed on the substrate W. Also, the amount of treatment indicates the amount of formed film.

Also, although the pinching-type chuck that pinches the substrate W has been described as a configuration for holding the substrate W in the embodiments described above with reference to FIGS. 1 to 35, a vacuum-type chuck may be employed as a configuration for holding the substrate W.

Also, although the operator is notified of an error by the display portion 105 displaying an error screen in the embodiments described above with reference to FIGS. 1 to 35, the operator may be notified of the error through sound. In this case, the substrate treatment apparatus 100 may include a speaker.

Also, although the scanning speed information indicates the setting value for the scanning speed at each of the positions included in the moving section of the first nozzle 41 in the embodiments described above with reference to FIGS. 1 to 35, the scanning speed information may indicate only one setting value for the scanning speed. In this case, the first nozzle 41 moves at a constant speed from the start position to the end position of the moving section of the first nozzle 41.

Also, although the control portion 102 causes the storage portion 103 to store the learning data and the flag (the first flag or the second flag) in an associated manner in the embodiments described above with reference to FIGS. 1 to 35, the control portion 102 may delete learning data from the storage portion 103 in a case in which the control portion 102 determines that the learning data (the amount of treatment) is not able to be used for machine learning or additional learning. For example, the control portion 102 may delete the speed information field TB11 and the treatment amount field TB12 corresponding to learning data with the second flag applied thereto from the learning data set table TB10 when the learning data set 135 is generated or when the machine learning is executed. Similarly, the control portion 102 may delete the speed information field TB21 and the treatment amount field TB22 corresponding to additional learning data with the second flag applied thereto from the additional learning data set table TB20 when the additional learning data set is generated or when the additional learning is executed.

In addition, although the control portion 102 determines whether or not learning data is able to be used for machine learning or additional learning after the learning data is generated in the embodiments described above with reference to FIGS. 1 to 35, the control portion 102 may determine whether or not the amount of treatment is able to be used for machine learning or additional learning before the learning data is generated. In this case, if the control portion 102 determines that the amount of treatment is not able to be used for machine learning or additional learning, then the control portion 102 moves on to the next process (next step) without executing the generation of the learning data using the amount of treatment.

Also, although the control portion 102 determines whether or not the learning data (the amount of treatment) is able to be used in the embodiments described above with reference to FIGS. 1 to 35, the process of determining whether or not the learning data (the amount of treatment) is able to be used may be omitted.

Also, the learning data set 135 and the additional learning data set are stored in the form of tables in the storage portion 103 and the storage portion 202 in the embodiments described above with reference to FIGS. 1 to 35, the form in which the learning data set 135 and the additional learning data set are stored in the storage portion 103 and the storage portion 202 may not be a table form.

In addition, although the learning target speed information and the speed information at the time of treatment define the moving speed of the first nozzle 41 in the embodiments described above with reference to FIGS. 1 to 35, the learning target speed information and the speed information at the time of treatment may define a relative moving speed of the first nozzle 41 and the substrate W. Note that in a case in which the substrate W is rotated, the learning target speed information and the speed information at the time of treatment define a relative moving speed of the surface of the rotating substrate W and the first nozzle 41. For example, the relative moving speed indicates a sum of a speed component (vector) of the first nozzle 41 and a speed component (vector) of a portion of the rotating substrate W that faces the first nozzle 41. Here, the speed component of the substrate W indicates the speed in the circumferential direction.

Also, although the first nozzle 41 is turned in the embodiments described above with reference to FIGS. 1 to 35, the first nozzle 41 may linearly move.

Also, although the first nozzle 41 is a scanning nozzle in the embodiments described above with reference to FIGS. 1 to 35, the first nozzle 41 may be a fixed nozzle. In this case, the treatment unit 1 includes a substrate moving mechanism that causes the substrate W to move, instead of the nozzle moving mechanism 6. The learning target speed information and the speed information at the time of treatment define the moving speed of the substrate W instead of the moving speed of the first nozzle 41. The learned model 136 outputs substrate speed information indicating the moving speed of the substrate W. The control portion 102 controls the substrate moving mechanism on the basis of the substrate speed information. The substrate speed information may indicate the moving speed of the substrate W set for each of positions (each of substrate positions) that divide the moving section in which the substrate W moves into a plurality of sections, similarly to the scanning speed information. Note that the substrate W may be turned or may linearly move.

Also, although only the first nozzle 41 moves during the treatment of the substrate W in the embodiments described above with reference to FIGS. 1 to 35, the first nozzle 41 and the substrate W may move. In this case, the treatment unit 1 may further include a substrate moving mechanism that causes the substrate W to move, in addition to the nozzle moving mechanism 6. The learning target speed information and the speed information at the time of treatment define the moving speed of the substrate W along with the moving speed of the first nozzle 41. The learned model 136 outputs substrate speed information that defines the moving speed of the substrate W in addition to the scanning speed information. The control portion 102 executes control of the nozzle moving mechanism 6 based on the scanning speed information and control of the substrate moving mechanism based on the substrate speed information.

Also, although the substrate treatment apparatus 100 includes the thickness measurement portion 8 in the embodiments described above with reference to FIGS. 1 to 35, the thickness measurement portion 8 may be omitted. In a case in which the substrate treatment apparatus 100 does not include the thickness measurement portion 8, the measurement of the thickness is executed by a thickness measurement device outside the substrate treatment apparatus 100.

Also, although the target treatment amount (target etching amount) is selected as an explanatory variable in the embodiments described above with reference to FIGS. 1 to 35, another factor that affects the amount of treatment may be added to the explanatory variable. Therefore, the learning data set 135 may indicate a relationship between the amount of treatment and another factor that affects the amount of treatment, in addition to the relationship between the amount of treatment (the amount of etching) and the scanning speed information. In this case, the target treatment amount and another factor that affects the amount of treatment are inputted as explanatory variables to the learned model 136, and the scanning speed information is outputted from the learned model 136. Another factor that affects the amount of treatment may include, for example, at least one of the rotation speed of the substrate W, the temperature of the treatment solution, the concentration of the treatment solution, and the flow amount of ejected treatment solution.

Also, although the scanning speed information (speed information at the time of treatment) is selected as an objective variable in the embodiments described above with reference to FIGS. 1 to 35, another factor that affects the amount of treatment may be added to the objective variable. Therefore, the learned model 136 may output another factor that affects the amount of treatment as an objective variable, in addition to the scanning speed information. For example, the learned model 136 may output at least one of the rotation speed of the substrate W, the temperature of the treatment solution, the concentration of the treatment solution, and the flow amount of ejected treatment solution, in addition to the scanning speed information.

Also, the learning program 134 is a program for executing an algorithm of learning the learning data set 135 (a plurality of pieces of learning data) to generate the learned parameter and incorporating the learned parameter into the inference program 133 to generate the learned model 136 in the embodiments described above with reference to FIGS. 1 to 35, the learning program 134 may be a program for executing an algorithm of learning the learning data set 135 (a plurality of sets of learning data) and generating a learned model including the learned parameter. In other words, the process of generating the learned parameter and incorporating the learned parameter into the inference program 133 may be omitted. Alternatively, the learning program 134 may be a program for executing an algorithm of learning the learning data set 135 (a plurality of pieces of learning data) and generating a learned model that does not include any learned parameter.

What is claimed is:

1. A substrate treatment apparatus that supplies a treatment solution to a substrate and executes a treatment on the substrate, the substrate treatment apparatus comprising:
a nozzle that supplies the treatment solution to the substrate;
a moving mechanism that causes at least either the nozzle or the substrate to move;
a storage portion that stores a first learned model; and
a control portion that controls the moving mechanism using the first learned model,
wherein the first learned model is generated by learning, as learning data, learning target speed information indicating at least either a moving speed of the nozzle or a moving speed of a substrate that is a learning target or indicating a relative moving speed of the nozzle and the substrate that is the learning target and an amount of the treatment acquired by executing the treatment on the substrate that is the learning target while causing at least either the nozzle or the substrate that is the learning target to move at a speed based on the learning target speed information,
the amount of the treatment indicates an amount by which the substrate is treated in the treatment,
the control portion causes output of speed information at the time of treatment from the first learned model by inputting a target amount of the amount of the treatment to the first learned model,
the control portion controls the moving mechanism such that at least either the nozzle or a substrate that is a treatment target moves at a speed based on the speed information at the time of treatment when the treatment is executed on the substrate that is the treatment target, and
the speed information at the time of treatment indicates at least either the moving speed of the nozzle or a moving speed of the substrate that is the treatment target or indicates a relative moving speed of the nozzle and the substrate that is the treatment target.

2. The substrate treatment apparatus according to claim 1, wherein the learning target speed information
indicates at least either a moving speed of the nozzle set for each of nozzle positions that divide a moving section, in which the nozzle moves, into a plurality of sections or a moving speed of the substrate that is the learning target set for each of substrate positions that divide a moving section, in which the substrate that is the learning target moves, into a plurality of sections or
indicates a relative moving speed of the nozzle and the substrate that is the learning target for each of the nozzle positions or for each of the substrate positions, and the speed information at the time of treatment
indicates at least either the moving speed of the nozzle set for each of the nozzle positions or a moving speed of the substrate that is the treatment target set for each of the substrate positions or
indicates a relative moving speed of the nozzle and the substrate that is the treatment target for each of the nozzle positions or for each of the substrate positions.

3. The substrate treatment apparatus according to claim 1, further comprising:
a substrate holding portion that horizontally holds the substrate; and
a substrate rotating portion that causes the substrate and the substrate holding portion to integrally rotate about a center axis extending in an up-down direction,
wherein the relative moving speed of the nozzle and the substrate that is the learning target indicates a relative moving speed of a surface of the rotating substrate that is the learning target and the nozzle, and
the relative moving speed of the nozzle and the substrate that is the treatment target indicates a relative moving speed of a surface of the rotating substrate that is the treatment target and the nozzle.

4. The substrate treatment apparatus according to claim 1, wherein the control portion learns, as additional learning data for additional learning, the speed information at the time of treatment and the amount of the treatment acquired by executing the treatment on the substrate that is the treatment target while causing at least either the nozzle or the substrate that is the treatment target to move at the speed based on the speed information at the time of treatment and generates a second learned model after the additional learning.

5. The substrate treatment apparatus according to claim 4, wherein the control portion determines whether or not the amount of the treatment can be used for the additional learning.

6. The substrate treatment apparatus according to claim 5, further comprising:
a measuring instrument that measures a value of a measurement target,
wherein the storage portion stores a recipe for controlling execution of the treatment,
the recipe indicates a setting value for the measurement target, and
the control portion executes a different error report in accordance with whether or not the amount of the treatment can be used for the additional learning in a case in which a difference between the value of the measurement target and the setting value is equal to or greater than a defined value.

7. The substrate treatment apparatus according to claim 1, further comprising:
a treatment amount detection portion that detects the amount of the treatment.

8. The substrate treatment apparatus according to claim 1, wherein the storage portion stores the learning target speed information,
the control portion causes the nozzle to supply the treatment solution to the substrate that is the learning target while controlling the moving mechanism such that at least either the nozzle or the substrate that is the learning target moves at the speed based on the learning target speed information, thereby executing the treatment on the substrate that is the learning target, the control portion generates the learning data including the amount of the treatment acquired by executing the treatment on the substrate that is the learning target and the learning target speed information,
the control portion categorizes the learning data into each of classes on a basis of a predefined categorization rule, learns the learning data for each of the classes, and generates the first learned model, and
the control portion selects one of the classes on a basis of a predefined selection rule when the treatment is executed on the substrate that is the treatment target and causes output of the speed information at the time of treatment from the first learned model by inputting the target amount to the first learned model corresponding to the selected class.

9. The substrate treatment apparatus according to claim 8, wherein the categorization rule defines that the learning data is categorized into each of the classes in accordance with the number of treated substrates that are learning targets,
the number of treated substrates that are the learning targets indicates the number of treated substrates from the time of starting utilization of the treatment solution used for the treatment on the substrates that are the learning targets,
the selection rule defines that one of the classes is selected in accordance with the number of treated substrates that are treatment targets, and
the number of treated substrates that are the treatment targets indicates the number of treated substrates from the time of starting utilization of the treatment solution used for the treatment on the substrates that are the treatment targets.

10. The substrate treatment apparatus according to claim 8,
wherein the control portion acquires a number of lots at the time of learning, which is a number of lots from the time of starting utilization of the treatment solution used for the treatment, when the treatment is executed on the substrate that is the learning target,
the categorization rule defines that the learning data is categorized into each of the classes in accordance with the number of lots at the time of learning,
the control portion acquires a number of lots at the time of treatment, which is a number of lots from the time of starting utilization of the treatment solution used for the treatment, when the treatment is executed on the substrate that is the treatment target, and
the selection rule defines that one of the classes is selected in accordance with the number of lots at the time of treatment.

11. The substrate treatment apparatus according to claim 8, further comprising:
an input portion that inputs, for each of the classes, an instruction for choosing each piece of reference learning data from the learning data included in each of the classes,
wherein the control portion
chooses, for each of the classes, the learning data with a correlation with the reference learning data that satisfies a predefined condition from the learning data included in each of the classes, and
learns the chosen learning data and generates the first learned model for each of the classes.

12. A substrate treatment method of supplying a treatment solution from a nozzle to a substrate that is a treatment target and executing a treatment on the substrate that is the treatment target, the substrate treatment method comprising:
a step of acquiring a target amount of an amount of the treatment indicating an amount by which the substrate that is the treatment target is treated in the treatment;
a step of causing output of speed information at the time of treatment from a first learned model by inputting the target amount of the amount of the treatment to the first learned model; and
a step of treatment for executing the treatment on the substrate that is the treatment target by supplying the treatment solution to the substrate that is the treatment target while causing at least either the nozzle or the substrate that is the treatment target to move at a speed based on the speed information at the time of treatment, wherein the first learned model is generated by learning, as learning data, learning target speed information indicating at least either a moving speed of the nozzle or a moving speed of a substrate that is a learning target or indicating a relative moving speed of the nozzle and the substrate that is the learning target and the amount of the treatment acquired by executing the treatment on the substrate that is the learning target while causing at least either the nozzle or the substrate that is the learning target to move at a speed based on the learning target speed information, and
the speed information at the time of treatment indicates at least either the moving speed of the nozzle or a moving speed of the substrate that is the treatment target or indicates a relative moving speed of the nozzle and the substrate that is the treatment target.

13. The substrate treatment method according to claim 12, wherein the learning target speed information
indicates at least either a moving speed of the nozzle set for each of nozzle positions that divide a moving section, in which the nozzle moves, into a plurality of sections or a moving speed of the substrate that is the learning target set for each of substrate positions that divide a moving section, in which the substrate that is the learning target moves, into a plurality of sections or
indicates a relative moving speed of the nozzle and the substrate that is the learning target for each of the nozzle positions or for each of the substrate positions, and
the speed information at the time of treatment
indicates at least either the moving speed of the nozzle set for each of the nozzle positions or a moving speed of the substrate that is the treatment target set for each of the substrate positions or
indicates a relative moving speed of the nozzle and the substrate that is the treatment target for each of the nozzle positions or for each of the substrate positions.

14. The substrate treatment method according to claim 12, wherein in the step of treatment, the substrate that is the treatment target is caused to rotate about a center axis extending in an up-down direction in a state in which the substrate is horizontally held,
the relative moving speed of the nozzle and the substrate that is the learning target indicates a relative moving speed of a surface of the rotating substrate that is the learning target and the nozzle, and
the relative moving speed of the nozzle and the substrate that is the treatment target indicates a relative moving speed of a surface of the rotating substrate that is the treatment target and the nozzle.

15. The substrate treatment method according to claim 12, further comprising:
a step of learning data generation for generating additional learning data for additional learning on a basis of the speed information at the time of treatment outputted in the step of causing output of the speed information at the time of treatment and the amount of the treatment of the substrate that is the treatment target treated in the step of treatment; and
a step of generating a second learned model after the additional learning through learning the learning data for the additional learning.

16. The substrate treatment method according to claim 15, wherein the step of learning data generation includes a step of determining whether or not the amount of the treatment can be used for the additional learning.

17. The substrate treatment method according to claim 16, further comprising:
a step of determining whether or not a difference between a value of a measurement target and a setting value set in advance for the measurement target is equal to or greater than a defined value; and
a step of executing a different error report in accordance with whether or not the amount of the treatment can be used for the additional learning in a case in which a difference between the value of the measurement target and the setting value is equal to or greater than a defined value.

18. The substrate treatment method according to claim 12, further comprising:
a step of executing the treatment on the substrate that is the learning target by supplying the treatment solution to the substrate that is the learning target while causing at least either the nozzle or the substrate that is the learning target to move at the speed based on the learning target speed information;
a step of acquiring the amount of the treatment of the substrate that is the learning target;
a step of generating the learning data including the amount of the treatment of the substrate that is the learning target and the learning target speed information; and
a step of learning for categorizing the learning data into each of classes on a basis of a predefined categorization rule and learning the learning data for each of the classes to generate the first learned model,
wherein in the step of causing output of the speed information at the time of treatment, one of the classes is selected on a basis of a predefined selection rule, and the speed information at the time of treatment is outputted from the first learned model by inputting the target amount to the first learned model corresponding to the selected class.

19. The substrate treatment method according to claim 18, wherein the categorization rule defines that the learning data is categorized into each of the classes in accordance with the number of treated substrates that are learning targets,
the number of treated substrates that are the learning targets indicates the number of treated substrates from the time of starting utilization of the treatment solution used for the treatment on the substrates that are the learning targets,
the selection rule defines that one of the classes is selected in accordance with the number of treated substrates that are treatment targets, and the number of treated substrates that are the treatment targets indicates the number of treated substrates from the time of starting utilization of the treatment solution used for the treatment on the substrates that are the treatment targets.

20. The substrate treatment method according to claim 18, wherein in the step of executing the treatment on the substrate that is the learning target, a number of lots at the time of learning that is a number of lots from the time of starting utilization of the treatment solution used for the treatment is acquired, the categorization rule defines that the learning data is categorized into each of the classes in accordance with the number of lots at the time of learning, in the step of treatment for executing the treatment on the substrate that is the treatment target, a number of lots at the time of treatment that is a number of lots from the time of starting utilization of the treatment solution used for the treatment is acquired, and the selection rule defines that one of the classes is selected in accordance with the number of lots at the time of treatment.

21. The substrate treatment method according to claim 18, further comprising:

a step of choosing reference learning data for each of the classes in the learning data included in each of the classes; and a step of choosing, for each of the classes, the learning data with a correlation with the reference learning data that satisfies a predefined condition in the learning data included in each of the classes, wherein in the step of learning, the chosen learning data is learned to generate the first learned model for each of the classes.

22. A substrate treatment system comprising:

a substrate treatment apparatus that supplies a treatment solution to a substrate and executes a treatment on the substrate; and an information processing apparatus that transmits speed information at the time of treatment to the substrate treatment apparatus, wherein the information processing apparatus includes a communication portion that receives, from the substrate treatment apparatus, a target amount of an amount of the treatment by which a substrate that is a treatment target is treated in the treatment and transmits the speed information at the time of treatment to the substrate treatment apparatus, a storage portion that stores a learned model, and a processing portion that causes output of the speed information at the time of treatment from the learned model by inputting the target amount of the amount of the treatment acquired from the substrate treatment apparatus via the communication portion to the learned model, the substrate treatment apparatus includes a communication portion that transmits the target amount of the amount of the treatment to the information processing apparatus and receives the speed information at the time of treatment from the information processing apparatus, a nozzle that supplies the treatment solution to the substrate, a moving mechanism that causes at least either the nozzle or the substrate to move, and a control portion that controls the moving mechanism on a basis of the speed information at the time of treatment, the learned model is generated by learning, as learning data, learning target speed information indicating at least either a moving speed of the nozzle or a moving speed of a substrate that is a learning target or indicating a relative moving speed of the nozzle and the substrate that is the learning target and an amount of the treatment acquired by executing the treatment on the substrate that is the learning target while causing at least either the nozzle or the substrate that is the learning target to move at a speed based on the learning target speed information, the amount of the treatment indicates an amount by which the substrate that is the learning target is treated in the treatment, the control portion controls the moving mechanism such that at least either the nozzle or the substrate that is the treatment target moves at a speed based on the speed information at the time of treatment when the treatment is executed on the substrate that is the treatment target, and the speed information at the time of treatment indicates at least either the moving speed of the nozzle or a moving speed of the substrate that is the treatment target or indicates a relative moving speed of the nozzle and the substrate that is the treatment target.

\* \* \* \* \*